US012640187B1

(12) United States Patent
Dokania et al.

(10) Patent No.: US 12,640,187 B1
(45) Date of Patent: May 26, 2026

(54) APPARATUS TO REDUCE POLARIZATION TARGETS OR IMPROVE MEMORY DENSITY FOR NON-LINEAR POLAR MATERIAL BASED MEMORY

(71) Applicant: Kepler Computing Inc., San Francisco, CA (US)

(72) Inventors: Rajeev Kumar Dokania, Beaverton, OR (US); Erik Unterborn, Cary, NC (US); Biswajeet Guha, Hillsboro, OR (US); Pramod Kolar, Cary, NC (US); Mustansir Yunus Mukadam, Seattle, WA (US); Darshak Doshi, Sunnyside, CA (US); Tanay Gosavi, Portland, OR (US); Amrita Mathuriya, Portland, OR (US); Debo Olaosebikan, San Francisco, CA (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 19 days.

(21) Appl. No.: 18/506,116

(22) Filed: Nov. 9, 2023

(51) Int. Cl.
| | |
|---|---|
| *G11C 7/06* | (2006.01) |
| *G11C 11/408* | (2006.01) |
| *G11C 11/4091* | (2006.01) |
| *G11C 11/4094* | (2006.01) |

(52) U.S. Cl.
CPC ...... *G11C 11/4091* (2013.01); *G11C 11/4085* (2013.01); *G11C 11/4094* (2013.01)

(58) Field of Classification Search
CPC ............ G11C 11/4091; G11C 11/4085; G11C 11/4094
See application file for complete search history.

(56) References Cited

U.S. PATENT DOCUMENTS

| | | | | |
|---|---|---|---|---|
| 11,836,102 B1 * | 12/2023 | Mathuriya | .............. | H01L 25/18 |
| 2013/0039136 A1 * | 2/2013 | Yoshida | .............. | G11C 11/4091 |
| | | | | 365/194 |
| 2019/0279712 A1 * | 9/2019 | Siau | ........................ | G11C 16/24 |
| 2024/0257854 A1 * | 8/2024 | Dokania | ............. | G11C 11/2255 |

* cited by examiner

*Primary Examiner* — Min Huang
(74) *Attorney, Agent, or Firm* — MUGHAL GAUDRY & FRANKLIN PC

(57) ABSTRACT

Described herein is a method and apparatus to reduce electric displacement and polarization target for a memory bit-cell. In at least one embodiment, electric displacement and polarization target for non-linear polar material based memory bit-cells is reduced by re-architecting the memory. In at least one embodiment, memory is architected to reduce electric displacement and polarization target by reducing capacitance on sense line or bit-line for bit-cell being accessed or written to. In at least one embodiment, memory arrays are actively split into two or more sub-arrays and routing capacitance is reduced, which in turn reduces capacitance on sense line or bit-line.

17 Claims, 56 Drawing Sheets

Planar FE/PE Capacitor

Figure 5A:
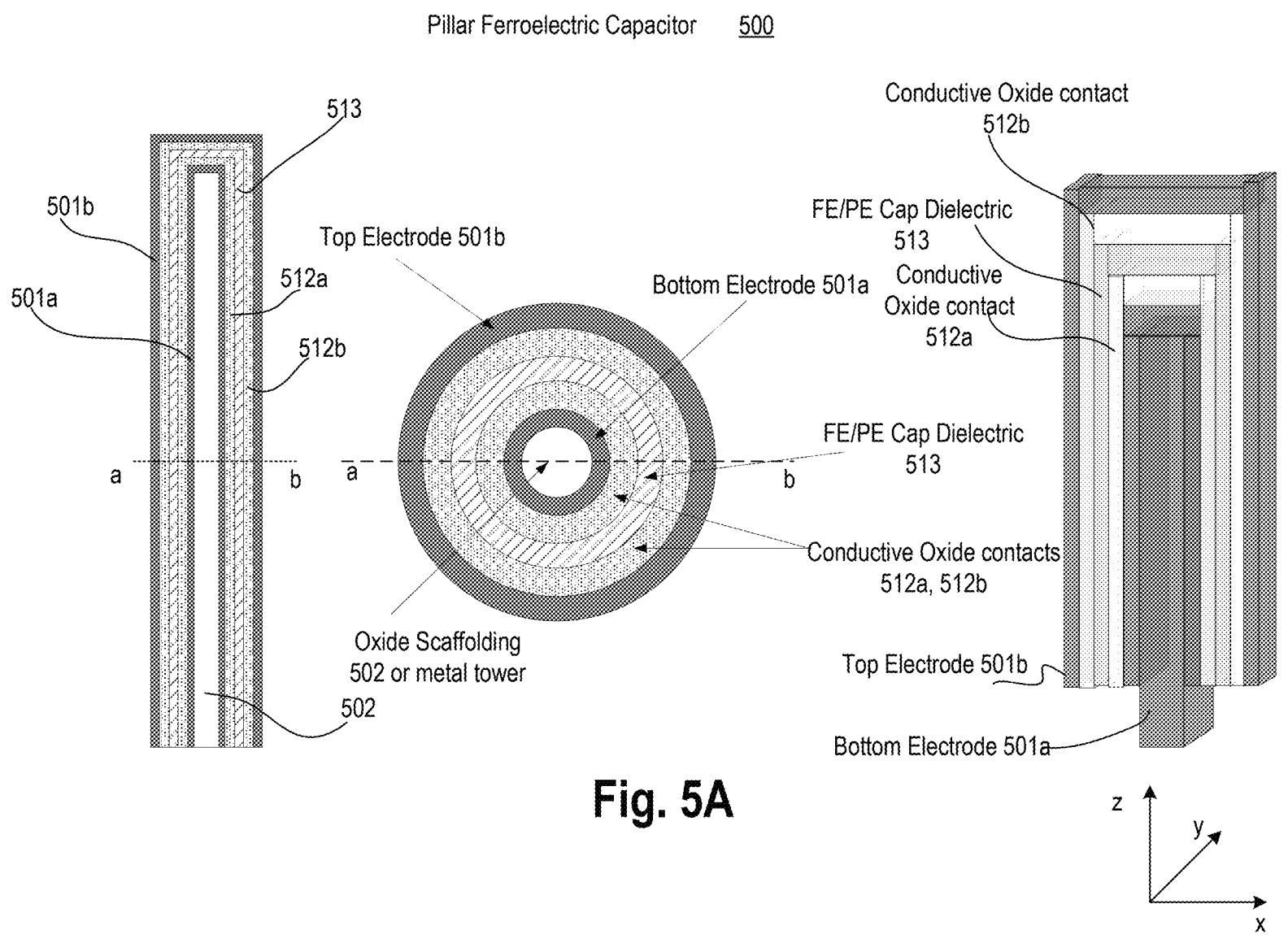

Pillar Ferroelectric Capacitor    500

Conductive Oxide contact
512b

FE/PE Cap Dielectric
513

Conductive
Oxide contact
512a

FE/PE Cap Dielectric
513

Conductive Oxide contacts
512a, 512b

Top Electrode 501b

Bottom Electrode 501a

Bottom Electrode 501a

Top Electrode 501b

Oxide Scaffolding
502 or metal tower
502

703 — Sense-Amp, BL Driver, PL drvier

PL0 BL0 PL1 BL1 PLN BLN

701_{0,N} 701_{M,N} WLM

701

WL1

701_{0,0} 701_{M,0} WL0

WL driver, WL repeaters

704

Address Decoder (Row Select logic)

702

Wear-leveling logic (Refresh logic) 706

800

820

1600

Unit cell
(PL || BL)
1900

Unit cell
(PL ∥ BL)
2000

Array break with full cmos switch
& local pull-down for precharge

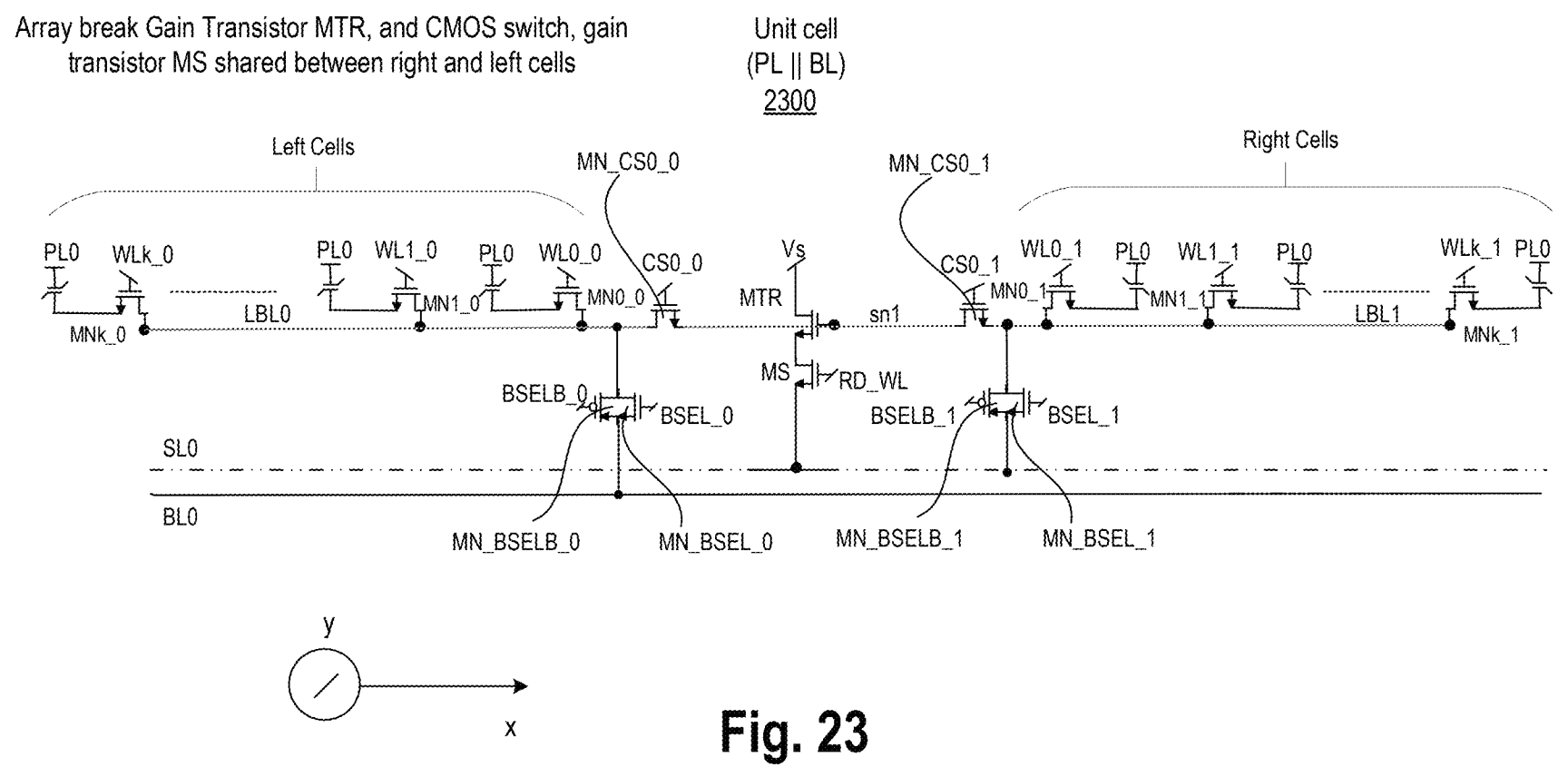

Array break Gain Transistor MTR, and CMOS switch, gain transistor MS shared between right and left cells Unit cell (PL || BL) 2300

Fig. 23

Unit cell
(PL || BL)
2400

Array break Gain Transistor MTR, and
CMOS switch MS, gain transistor MTR
shared between right and left cells Array break Gain Transistor MTR, and CMOS switch MS, gain transistor shared between right and left cells

Fig. 25

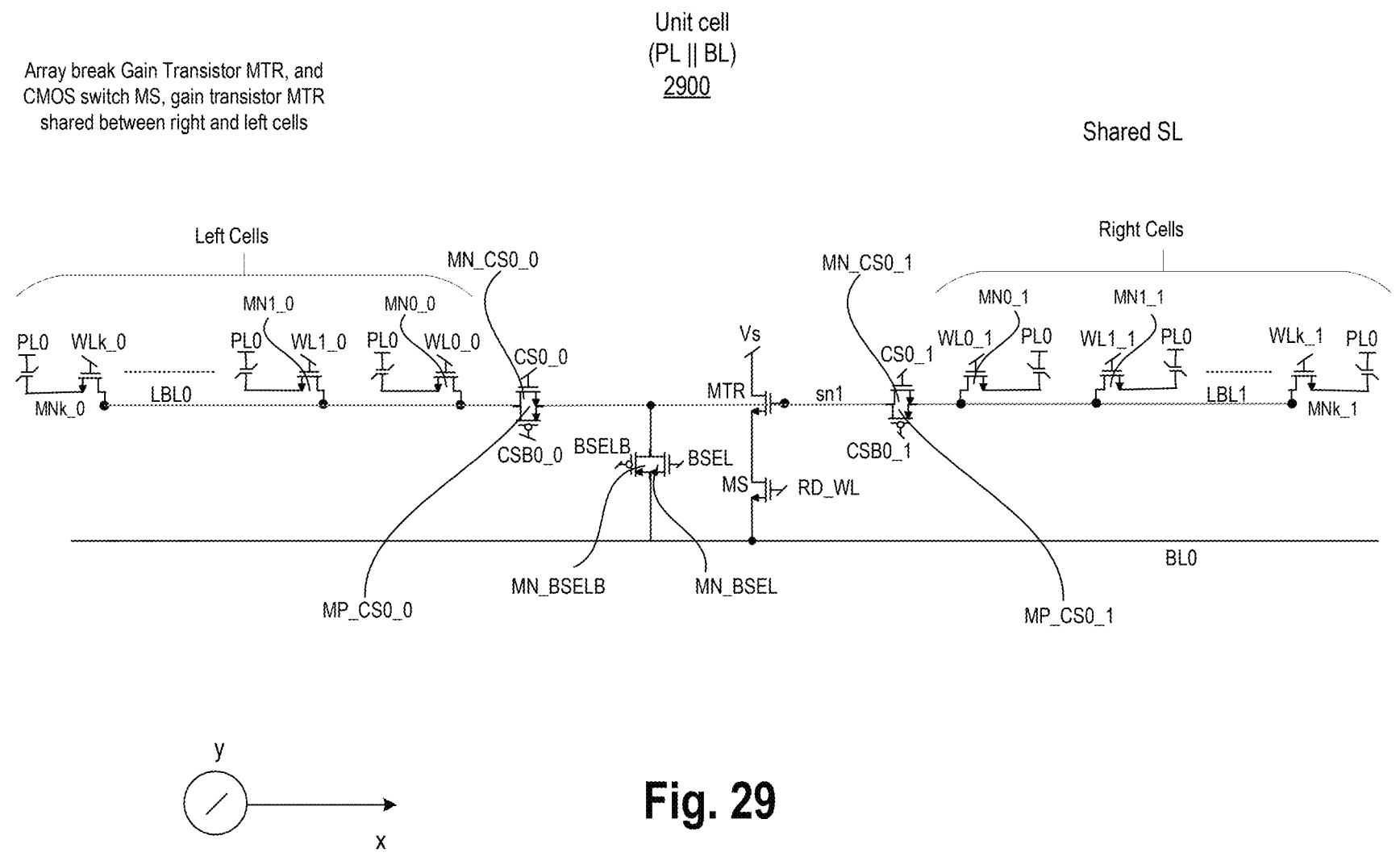

Unit cell
(PL || BL)
2900

Array break Gain Transistor MTR, and
CMOS switch MS, gain transistor MTR
shared between right and left cells Shared SL Right Cells Left Cells

Fig. 29

Figure 30:
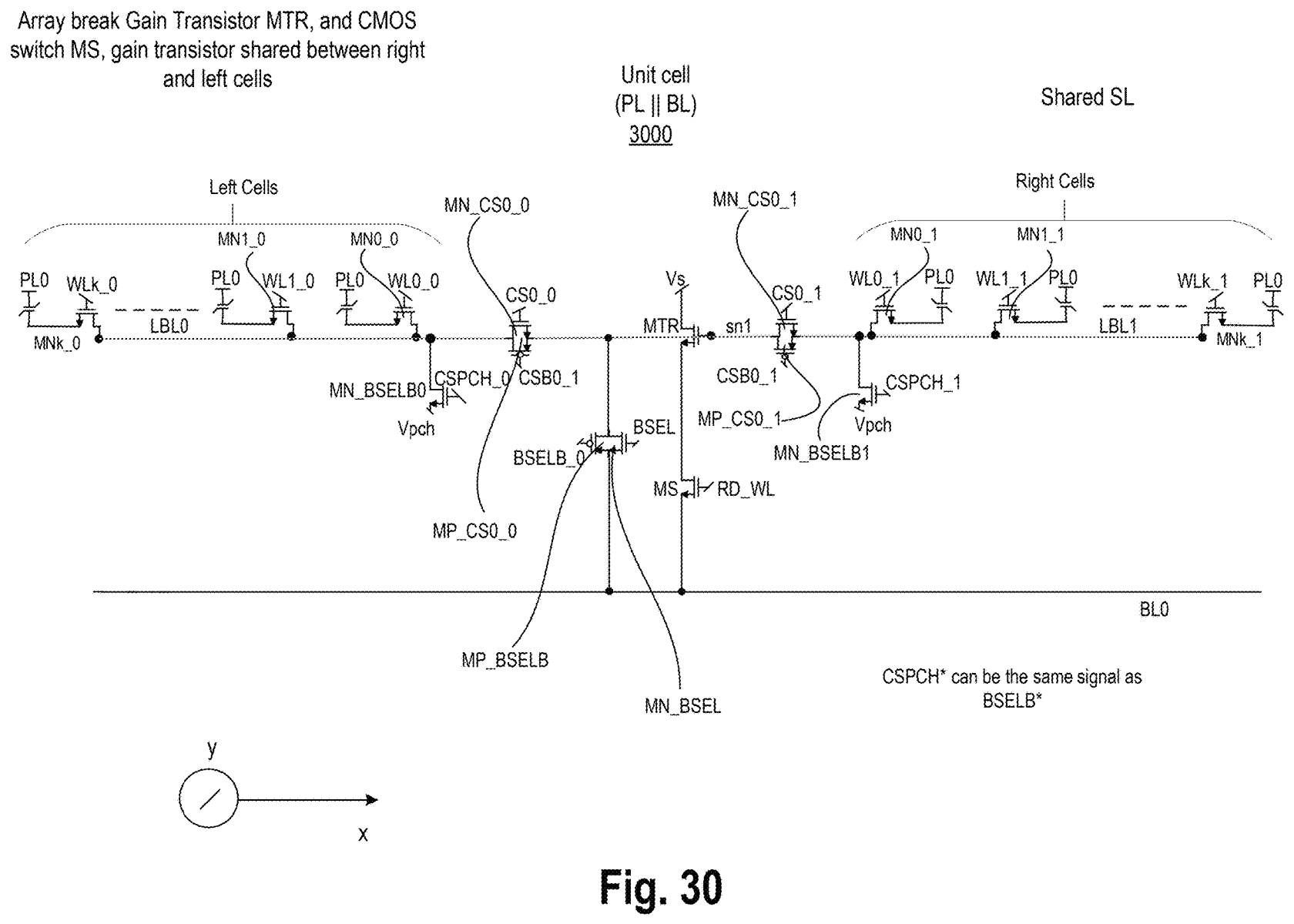

Array break Gain Transistor MTR, and CMOS switch MS, gain transistor shared between right and left cells Shared SL Right Cells Left Cells Unit cell (PL || BL) 3000

CSPCH* can be the same signal as BSELB*

APPARATUS TO REDUCE POLARIZATION TARGETS OR IMPROVE MEMORY DENSITY FOR NON-LINEAR POLAR MATERIAL BASED MEMORY

BACKGROUND

Memory bit-cells are arranged in rows and columns that form segments, arrays, or banks. When a bit-cell includes multiple capacitive devices for storing charge, size of one or more transistors of the bit-cell may increase to lower threshold voltage variation and to accommodate the multiple capacitive devices. Increasing size of the one or more transistors can add capacitive load to sense-line(s) or bit-line(s) coupled to the bit-cell. Higher capacitive load on sense-line(s) or bit-line(s) reduce sensing noise margin to accurately detect data stored in the bit-cell.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5A illustrates a non-planar ferroelectric or paraelectric capacitor structure, in accordance with at least one embodiment.

FIG. 23 illustrates a unit cell with two sets of plurality of memory bit-cells, where one set is a flipped version of another set, wherein an individual set of plurality of memory bit-cells has a local bit-line coupled to a global bit-line via pass-gate transistor, where PL is parallel to BL, and where the two sets of plurality of memory bit-cells are decoupled via column select transistors, and where a gain cell is shared by the two sets of plurality of memory bit-cells, in accordance with at least one embodiment.

FIG. 25 illustrates a unit cell which is similar to unit cell of FIG. 24 but with pre-charge transistors for pre-charging respective local bit-lines, in accordance with at least one embodiment.

FIG. 29 illustrates a unit cell with two sets of plurality of memory bit-cells like FIG. 28 but with transmission gate based column multiplexers, in accordance with at least one embodiment.

FIG. 30 illustrates a unit cell with two sets of plurality of memory bit-cells like FIG. 25 but with shared SL, in accordance with at least one embodiment.

FIG. 34 illustrates a unit cell with two sets of plurality of memory bit-cells, where one set is a flipped version of another set, wherein an individual set of plurality of memory bit-cells has a local bit-line coupled to a global bit-line via pass-gate transistor, where PL is parallel to WL, and where the local-line line is pre-charged by a pre-charge transistor, in accordance with at least one embodiment.

FIG. 37 illustrates a unit cell with two sets of plurality of memory bit-cells, where one set is a flipped version of another set, wherein an individual set of plurality of memory bit-cells has a local bit-line coupled to a global bit-line via a pass-gate, where PL is parallel to WL, and where the two sets of plurality of memory bit-cells are decoupled via column select transistors, and where a gain cell is shared by the two sets of plurality of memory bit-cells, in accordance with at least one embodiment.

FIG. 41 illustrates a unit cell with two sets of plurality of memory bit-cells like FIG. 40, but with shared SL, and where PL is parallel to WL, in accordance with at least one embodiment.

FIG. 42 illustrates a unit cell with two sets of plurality of memory bit-cells like FIG. 41, but with shared SL and one conductivity pass-gate for column selection per set of plurality of bit-cells, and where PL is parallel to WL, in accordance with at least one embodiment.

DETAILED DESCRIPTION

Figure 1:
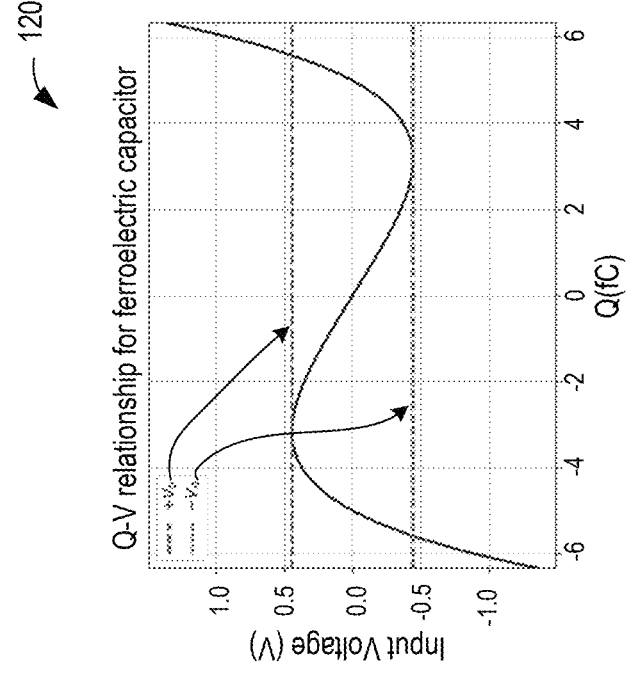
FIG. 1 illustrates a set of plots that show behavior of a ferroelectric capacitor, a paraelectric capacitor, and a linear capacitor.
Figure 1:
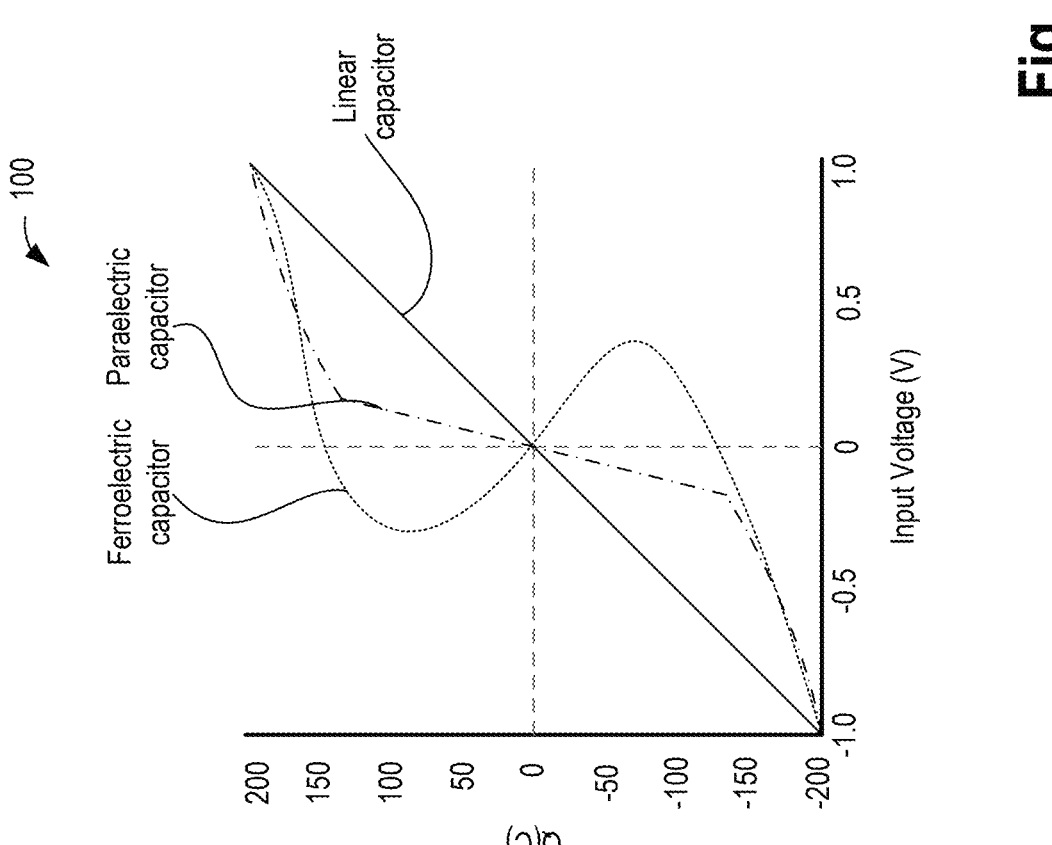

Threshold in ferroelectric material has a highly nonlinear transfer function in polarization versus voltage response. Threshold is related to: a) nonlinearity of switching transfer function; and b) squareness of ferroelectric switching. Endurance in a capacitor comprising non-linear polar material such as ferroelectric material, paraelectric material, or non-linear dielectric depends on several factors including electric displacement and polarization (dp). More reliable switching of states in a capacitor can be achieved when variation in dp is reduced, in accordance with at least one embodiment. One way to improve (e.g., increase) electric displacement and polarization to reliably store data in the non-linear polar material is to increase voltage across the non-linear polar material, in accordance with at least one embodiment. In at least one embodiment, memory can be operated at higher voltage to achieve higher electric displacement and polarization. As supply voltage requirements are lowered to lower power consumption, achieving higher electric displacement and polarization may become challenging.

In at least one embodiment, electric displacement and polarization target for non-linear polar material based memory bit-cells is reduced by re-architecting the memory. Here, an electric displacement and polarization target refers to quantity level that defines stable storage of data in a capacitor comprising non-linear polar material. A lower electric displacement and polarization target means ease in reliably writing and storing data in a capacitor with non-linear polar material. A higher electric displacement and polarization target means difficulty in reliably writing and storing data in a capacitor with non-linear polar material.

In at least one embodiment, memory is architected to reduce electric displacement and polarization target by reducing capacitance on sense line or bit-line for bit-cell being accessed or written to. In at least one embodiment, memory arrays are actively split into two or more sub-arrays and routing capacitance is reduced, which in turn reduces capacitance on sense line or bit-line. Here, active splitting of arrays refers to splitting one or more memory arrays using active device(s) (e.g., transistors). In at least one embodiment, by lowering the electric displacement and polarization target using one or more memory re-architecting techniques improves memory array efficiency (e.g., reliable storage of data, faster sensing of data due to lower capacitance on bit-line and/or sense line, which in turn allows to increase size of memory array for larger storage).

In at least one embodiment, a capacitor in a bit-cell is replaced with a memory element. In at least one embodiment, a memory element is one of a magnetic tunneling junction (MTJ), resistive device, phase-change device, etc. In at least one embodiment, a capacitor of a bit-cell comprises a non-linear polar material. In at least one embodiment, non-linear polar material is one of a ferroelectric, a paraelectric, or a non-linear dielectric material. In at least one embodiment, non-linear polar material is doped with one or more elements of a 3d, 4d, 5d, 6d, 4f, and 5f series of a periodic table.

Here, numerous details are discussed to provide a more thorough explanation of at least one embodiment. It will be apparent, however, to one skilled in art, that at least one embodiment may be practiced without these specific details. In other instances, well-known structures and devices are shown in block diagram form, rather than in detail, to avoid obscuring at least one embodiment.

Note that in corresponding drawings of at least one embodiment, signals are represented with lines. Some lines may be thicker, to indicate more constituent signal paths, and/or have arrows at one or more ends, to indicate primary information flow direction. Such indications are not intended to be limiting. Rather, lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of figures having same reference numbers (or names) as elements of any other figure can operate or function in any manner like that described but are not limited to such.

FIG. 1 illustrates a set of plots showing behavior of a ferroelectric capacitor, a ferroelectric capacitor, and a linear capacitor, in accordance with at least one embodiment. Plot 100 compares transfer function for a linear capacitor, a ferroelectric (PE) capacitor (a nonlinear capacitor) and a ferroelectric (FE) capacitor (a nonlinear capacitor). Here, x-axis is input voltage or voltage across a capacitor, while y-axis is charge on a capacitor. In at least one embodiment, ferroelectric (FE) material can be any suitable low voltage FE material that allows FE material to switch its state by a low voltage (e.g., 100 mV). In at least one embodiment, threshold in FE material has a highly nonlinear transfer function in polarization versus voltage response. In at least one embodiment, threshold is related to: a) nonlinearity of switching transfer function; and b) squareness of FE switching. In at least one embodiment, nonlinearity of switching transfer function is width of derivative of polarization versus voltage plot. In at least one embodiment, squareness is defined by a ratio of remnant polarization to saturation polarization, where perfect squareness will show a value of 1. In at least one embodiment, squareness of FE switching can be suitably manipulated with chemical substitution. For example, in $PbTiO_3$ a P-E (polarization-electric field) square loop can be modified by La or Nb substitution to create an S-shaped loop. In at least one embodiment, shape can be systematically tuned to ultimately yield a nonlinear dielectric. In at least one embodiment, squareness of FE switching can also be changed by granularity of an FE layer. In at least one embodiment, a perfectly epitaxial, single crystalline FE layer may show higher squareness (e.g., ratio is closer to 1)

compared to a polycrystalline FE. In at least one embodiment, perfect epitaxial can be accomplished using lattice matched bottom and top electrodes. In at least one embodiment, BiFeO (BFO) can be epitaxially synthesized using a lattice matched SrRuO$_3$ bottom electrode yielding P-E loops that are square. In at least one embodiment, progressive doping with La may reduce squareness.

Plot 120 shows charge and voltage relationship for a ferroelectric capacitor, in accordance with at least one embodiment. In at least one embodiment, a capacitor with ferroelectric material is a nonlinear capacitor with its potential $V_F(Q_F)$ as a cubic function of its charge. Plot 120 illustrates characteristics of an FE material, in accordance with at least one embodiment. Plot 120 is a charge-voltage (Q-V) plot for a block of Pb(Zr$_{0.5}$Ti$_{0.5}$)O$_3$ of area (100 nm)$^2$ and thickness 30 nm (nanometer), in accordance with at least one embodiment. Plot 120 shows local extrema at $+/-V_0$ indicated by dashed lines. Here, $V_c$ is coercive voltage. In applying a potential V across an FE material, its charge can be unambiguously determined for $|V|>V_0$. Otherwise, charge of an FE material is subject to hysteresis effects.

In at least one embodiment, FE material comprises a perovskite of type ABO$_3$, where 'A' and 'B' are two cations of different sizes, and 'O' is oxygen which is an anion that bonds to both cations. Generally, size A atoms is larger than size of B atoms. In at least one embodiment, FE material can be replaced with a non-linear polar material. In at least one embodiment, non-linear polar material is one of a ferroelectric, a paraelectric, or a non-linear dielectric material. In at least one embodiment, non-linear polar material is doped with one or more elements of a 3d, 4d, 5d, 6d, 4f, and 5f series of a periodic table. In at least one embodiment, non-linear polar material includes perovskite that can be doped (e.g., by La or lanthanides). In least one embodiment, non-linear polar material includes lead zirconium titanate (PZT) or PZT with a first doping material, wherein the first doping material is one of La or Nb. In least one embodiment, non-linear polar material includes bismuth ferrite (BFO) with a second doping material, wherein the second doping material is one of lanthanum, one or more elements from lanthanide series of a periodic table, or one or more elements of a 3d, 4d, 5d, 6d, 4f, and 5f series of periodic table.

In at least one embodiment, non-linear polar material includes a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST). In at least one embodiment, non-linear polar material includes a hexagonal ferroelectric which includes one of: YMnO$_3$ or LuFeO$_3$. In at least one embodiment, non-linear polar material includes hexagonal ferroelectrics of a type h-RMnO$_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides.

In at least one embodiment, non-linear polar material includes hafnium oxide of a form Hf$_{1-x}$E$_x$O$_2$, wherein 'x' denotes a fraction, and E includes one of Al, Ca, Ce, Dy, Er, Gd, Ge, La, Sc, Si, Sr, Sn, Zr, or Y. In at least one embodiment, non-linear polar material includes HfO$_2$ doped with Ey, where E includes one of Al, Ca, Ce, Dy, Er, Gd, Ge, La, Sc, Si, Sr, Sn, or Y, and wherein 'y' is a fraction. In at least one embodiment, non-linear polar material includes Al(1-x)Sc(x)N, Ga(1-x)Sc(x)N, Al(1-x)Y(x)N or Al(a)Mg (b)Nb(c)N, wherein a, b, and c are respective compositional fractions. In at least one embodiment, non-linear polar material includes niobate type compounds including LiNbO$_3$, LiTaO$_3$, LiTaO$_2$F$_2$, Sr$_x$Ba1-xNb$_2$O$_6$ where $0.32 \leq x \leq 0.8$, or KSr$_2$Nb$_5$O$_{15}$. In at least one embodiment, non-linear polar material includes an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100. In at least one embodiment, non-linear polar material includes a paraelectric material that comprises SrTiO$_3$, Ba$_{(x)}$Sr$_{(y)}$TiO$_3$, HfZrO$_2$, Hf—Si—O, or a PMN-PT based relaxor ferroelectric.

In at least one embodiment, FE material is perovskite, which includes one or more of: La, Sr, Co, Sr, Ru, Y, Ba, Cu, Bi, Ca, or Ni. In at least one embodiment, metallic perovskites such as (La,Sr)CoO$_3$, SrRuO$_3$, (La,Sr)MnO$_3$, YBa$_2$Cu$_3$O$_7$, Bi$_2$Sr$_2$CaCu$_2$O$_8$, LaNiO$_3$, BaTiO$_3$, KNbO$_3$, or NaTaO$_3$, etc. may be used as FE material. In at least one embodiment, perovskites can be suitably doped to achieve a spontaneous distortion in a range of 0.3% to 2%. In at least one embodiment, for chemically substituted lead titanate such as Zr in Ti site; and La or Nb in Ti site, concentration of these substitutes is such that it achieves spontaneous distortion in range of 0.3% to 2%. In at least one embodiment, for chemically substituted BiFeO$_3$, BrCrO$_3$, or BuCoO$_3$ class of materials, La or rare earth substitution into Bi site can achieve spontaneous distortion. In at least one embodiment, FE material is contacted with a conductive metal oxide that includes one of conducting perovskite metallic oxides exemplified by: La—Sr—CoO$_3$, SrRuO$_3$, La—Sr—MnO$_3$, YBa$_2$Cu$_3$O$_7$, Bi2Sr$_2$CaCu$_2$O$_8$, and LaNiO$_3$.

In at least one embodiment, FE material comprises a stack of layers including low voltage FE material between conductive oxides. In at least one embodiment, when FE material is a perovskite, conductive oxides are of type AA'BB'O$_3$. A' is a dopant for atomic site A, and can be an element from lanthanides series. B' is a dopant for atomic site B, and can be an element from transition metal elements, such as Sc, Ti, V, Cr, Mn, Fe, Co, Ni, Cu, or Zn. In at least one embodiment, A' may have same valency of site A, with a different ferroelectric polarizability. In at least one embodiment, when metallic perovskite is used for FE material, conductive oxides can include one or more of: IrO$_2$, RuO$_2$, PdO$_2$, OsO$_2$, or ReO$_3$. In at least one embodiment, perovskite is doped with La or lanthanides. In at least one embodiment, thin layer (e.g., approximately 10 nm) perovskite template conductors such as SrRuO$_3$ coated on top of IrO$_2$, RuO$_2$, PdO$_2$, and PtO$_2$, which have a non-perovskite structure but higher conductivity to provide a seed or template for growth of pure perovskite ferroelectric at low temperatures, are used as conductive oxides. In at least one embodiment, conductive oxides include one or more of: Ir, In, Fe, Ru, Pd, Os, or Re.

In at least one embodiment, ferroelectric materials are doped with s-orbital material (e.g., materials for first period, second period, and ionic third and fourth periods). In at least one embodiment, f-orbital materials (e.g., lanthanides) are doped to ferroelectric material to make paraelectric material. In at least one embodiment, room temperature paraelectric materials include: SrTiO$_3$, Ba$_{(x)}$Sr$_{(y)}$TiO$_3$ (where x may be, for example, −0.05 or 0.5, and y may be for example, 0.95), $HfZrO_2$, Hf—Si—O, La-substituted $PbTiO_3$, or PMN-PT based relaxor ferroelectrics.

In at least one embodiment, FE material comprises one or more of: Hafnium (Hf), Zirconium (Zr), Aluminum (Al), Silicon (Si), their oxides, or their alloyed oxides. In at least one embodiment, FE material includes one or more of: $Al_{(1-x)}Sc_{(x)}N$, $Ga_{(1-x)}Sc_{(x)}N$, $Al_{(1-x)}Y(x)N$ or $Al_{(1-x-y)}Mg_{(x)}Nb_{(y)}N$, where x and y are fractions. In at least one embodiment, the FE material includes y doped $HfO_2$, where y includes one of: Al, Ca, Ce, Dy, Er, Gd, Ge, La, Sc, Si, Sr, Sn, or Y. In at least one embodiment, FE material includes one or more of: Bismuth ferrite (BFO), lead zirconate titanate (PZT), BFO with a first doping material, or PZT with a second doping material, wherein doping material is one of Nb or La, and relaxor ferroelectrics such as PMN-PT.

In at least one embodiment, FE material includes Bismuth ferrite (BFO) with a first doping material wherein the first doping material is one of lanthanum, any element from lanthanide series of periodic table, or one or more elements of a 3d, 4d, 5d, 6d, 4f, and 5f series of periodic table. In at least one embodiment, FE material includes lead zirconium titanate (PZT) or PZT with a second doping material, wherein the second doping material is one of La or Nb. In at least one embodiment, FE material includes a relaxor ferroelectric including one of: lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST).

In at least one embodiment, FE material includes Hafnium oxides of form, $Hf_{(1-x)} Ex Oy$ where E can be Al, Ca, Ce, Dy, Er, Gd, Ge, La, Sc, Si, Sr, Sn, or Y, and where x and y are fractions. In at least one embodiment, FE material includes Niobate type compounds $LiNbO_3$, $LiTaO_3$, Lithium iron Tantalum Oxy Fluoride, Barium Strontium Niobate, Sodium Barium Niobate, or Potassium strontium niobate.

In at least one embodiment, FE material comprises multiple layers. In at least one embodiment, alternating layers of $[Bi2O_2]2+$, and pseudo-perovskite blocks $(Bi_4Ti_3O_{12}$ and related Aurivillius phases), with perovskite layers that are 'n' octahedral layers in thickness can be used. In at least one embodiment, FE material comprises organic material. In at least one embodiment, FE material comprises polyvinylidene fluoride or polyvinylidene difluoride (PVDF).

In at least one embodiment, FE material comprises hexagonal ferroelectrics of type h-$RMnO_3$, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). In at least one embodiment, ferroelectric phase is characterized by a buckling of layered $MnO_5$ polyhedra, accompanied by displacements of Y ions, which lead to a net electric polarization. In at least one embodiment, hexagonal FE includes one of: $YMnO_3$ or $LuFeO_3$. In at least one embodiment, when FE material comprises hexagonal ferroelectrics, conductive oxides are of $A_2O_3$ (e.g., $In2O_3$, Fe2$O_3$) and $ABO_3$ type, where 'A' is a rare earth element and B is Mn.

In at least one embodiment, FE material comprises improper FE material. An improper ferroelectric is a ferroelectric where primary order parameter is an order mechanism such as strain or buckling of atomic order. In at least one embodiment, improper FE material are $LuFeO_3$ class of materials or super lattice of ferroelectric and paraelectric materials $PbTiO_3$ (PTO) and $SnTiO_3$ (STO), respectively, and $LaAlO_3$ (LAO) and STO, respectively. In at least one embodiment, a super lattice of [PTO/STO]n or [LAO/STO] n, where 'n' is between 1 and 100. In at least one embodiment, paraelectric material includes one of: $SrTiO_3$, $Ba_{(x)}$ $Sr_{(y)}TiO_3$ (where x may be, for example, −0.5, and y may be, for example, 0.95), $BaTiO_3$, $HfZrO_2$, Hf—Si—O, La-substituted $PbTiO_3$, or PMN-PT based relaxor ferroelectrics.

Figure 2:
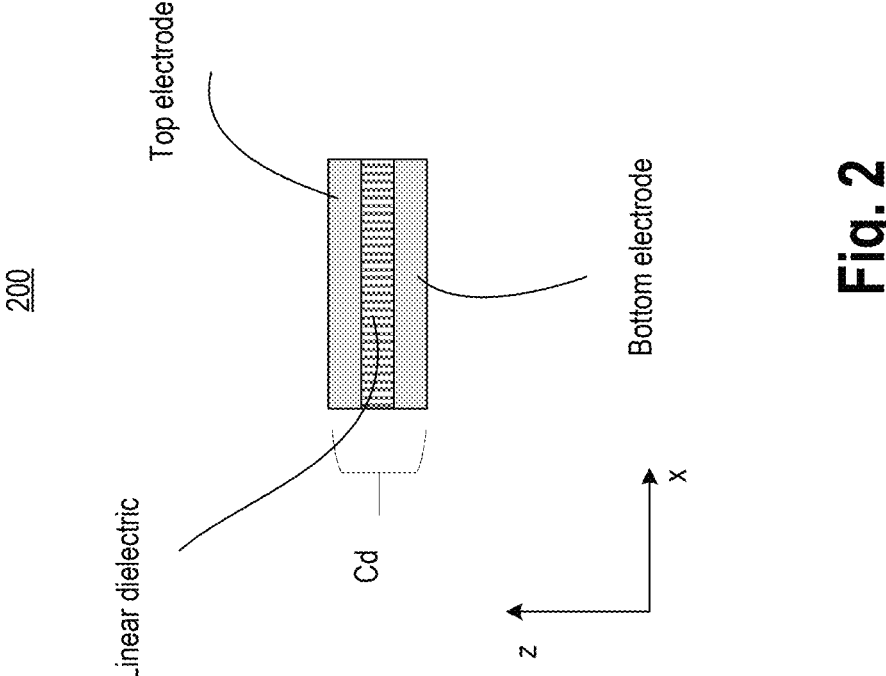
FIG. 2 illustrates a planar linear capacitor structure, in accordance with at least one embodiment.

FIG. 2 illustrates planar capacitor structure 200, in accordance with at least one embodiment. In at least one embodiment, capacitors for multi-input capacitive structures are linear capacitors. In at least one embodiment, capacitors can take any planar form. One such form is illustrated in FIG. 2, in accordance with at least one embodiment. In at least one embodiment, planar capacitor structure 200 is a metal-insulator-metal (MIM) capacitor comprising a bottom electrode, a top electrode, and a linear dielectric between top electrode and bottom electrode as shown. In at least one embodiment, conductive oxide layer(s) are formed between bottom electrode and linear dielectric. In at least one embodiment, conductive oxide layer(s) are formed between top electrode and linear dielectric. In at least one embodiment, conductive oxides include: $IrO_2$, $RuO_2$, $PdO_2$, $OsO_2$, or $ReO_3$. In at least one embodiment, conductive oxides are of form $A2O_3$ (e.g., $In2O_3$, $Fe2O_3$) and $ABO_3$ type, where 'A' is a rare earth element and 'B' is Mn.

In at least one embodiment, dielectric layer includes one or more of: $SiO_2$, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

Figure 3A:
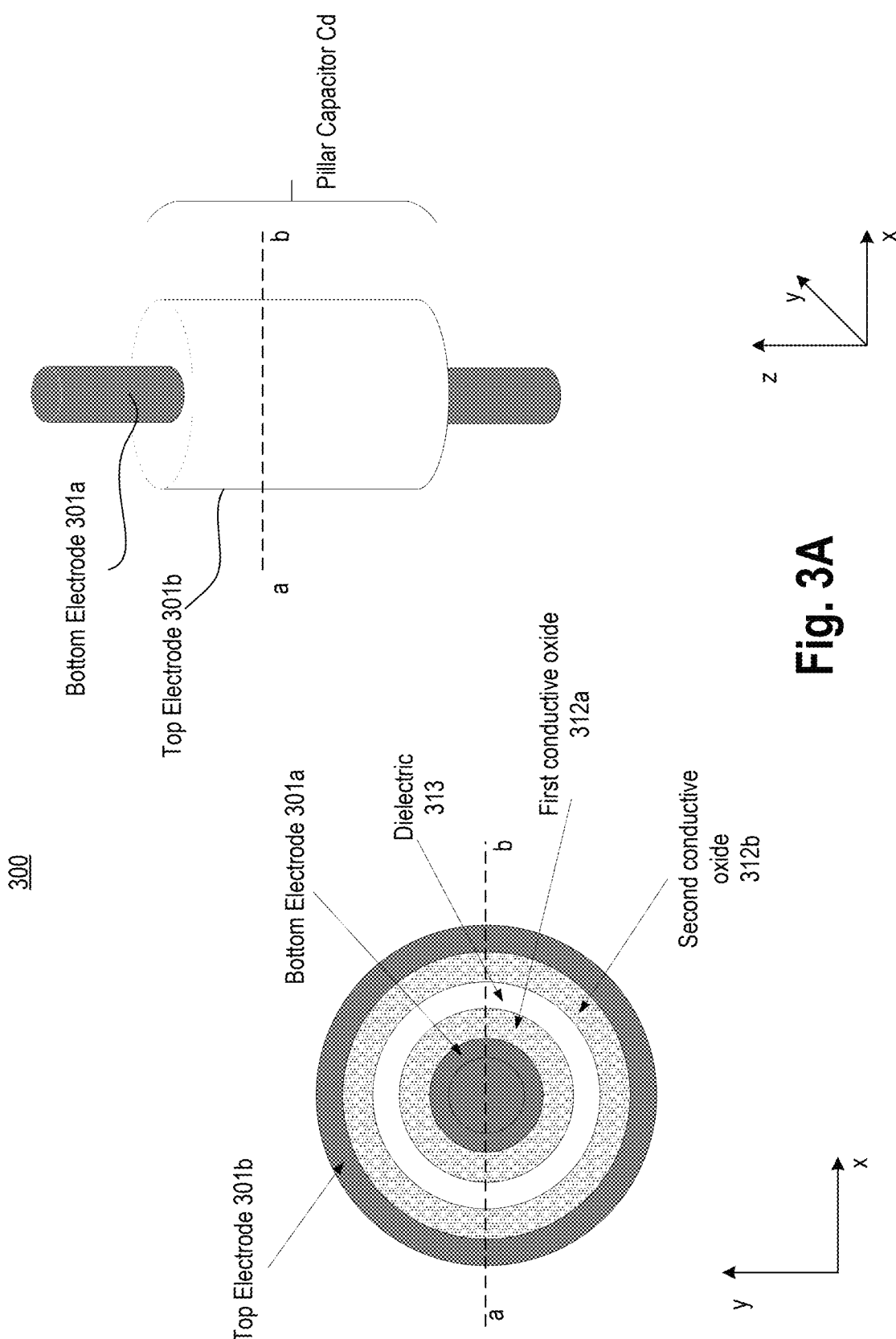
FIG. 3A illustrates a non-planar linear capacitor structure, in accordance with at least one embodiment.

FIG. 3A illustrates non-planar capacitor structure 300, in accordance with at least one embodiment. In at least one embodiment, non-planar capacitor structure 300 is rectangular in shape. In a cylindrical shaped case, in at least one embodiment, layers of non-planar capacitor structure 300 from center going outwards include bottom electrode 301a, first conductive oxide 312a, dielectric material 313, second conductive oxide 312b, and top electrode 301b. A cross-sectional view along "ab" dashed line is illustrated in middle of FIG. 3A. In at least one embodiment, conducting oxides are removed and linear dielectric is directly connected to top electrode 301b and bottom electrodes 301a. In at least one embodiment, dielectric material 313 can include any suitable linear dielectric, where thickness of dielectric film is a range of 1 nm to 20 nm. In at least one embodiment, linear dielectric material 313 comprises a higher-K dielectric material. In at least one embodiment, linear dielectrics include one of: $SIO_2$, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. In at least one embodiment, high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, or zirconium silicon oxide.

In at least one embodiment, first conductive oxide 312a is conformally deposited over bottom electrode 301a. In at least one embodiment, dielectric material 313 is conformally deposited over first conductive oxide 312a. In at least one embodiment, second conductive oxide 312b is conformally deposited over dielectric material 313. In at least one embodiment, top electrode 301b is conformally deposited over second conductive oxide 312b. In at least one embodiment, bottom electrode 301a is in center while top electrode 301b is on an outer circumference of non-planar capacitor structure 300.

In at least one embodiment, material for bottom electrode 301a may include one or more of: Cu, Al, Ag, Au, W, or Co, or their alloys. In at least one embodiment, material for first conductive oxide 312a include: $IrO_2$, $RuO_2$, $PdO_2$, $OsO_2$, or $ReO_3$. In at least one embodiment, conductive oxides are of form $A_2O_3$ (e.g., $In_2O_3$, $Fe_2O_3$) and $ABO_3$ type, where 'A' is a rare earth element and 'B' is Mn. In at least one embodiment, material for second conductive oxide 312b may be same as material for first conductive oxide 312a. In at least one embodiment, material for top electrode 301b may include one or more of: Cu, Al, Ag, Au, W, or Co, or their alloys.

In at least one embodiment, a first refractive intermetallic layer (not shown) is formed between dielectric material 313 and first conductive oxide 312a. In at least one embodiment, second refractive intermetallic layer (not shown) is formed between dielectric capacitor material 313 and second conductive oxide 312b. In at least one embodiment, first and second refractive intermetallic layers are directly adjacent to their respective conductive oxide layers and to dielectric capacitor material 313. In at least one embodiment, refractive intermetallic maintains capacitive properties of dielectric capacitor material 313. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as $Ti_3Al$, TiAl, $TiAl_3$; Ni—Al such as $Ni_3Al$, NiAl3, NiAl; Ni—Ti, Ni—Ga, $Ni_2MnGa$; FeGa, $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B and Mg can markedly enhance other properties. In at least one embodiment, thicknesses of layers of non-planar capacitor structure 300 in x-axis are in range of 1 nm to 30 nm. In at least one embodiment, refractive intermetallic layers are not used for non-planar capacitor structure 300.

Figure 3B:
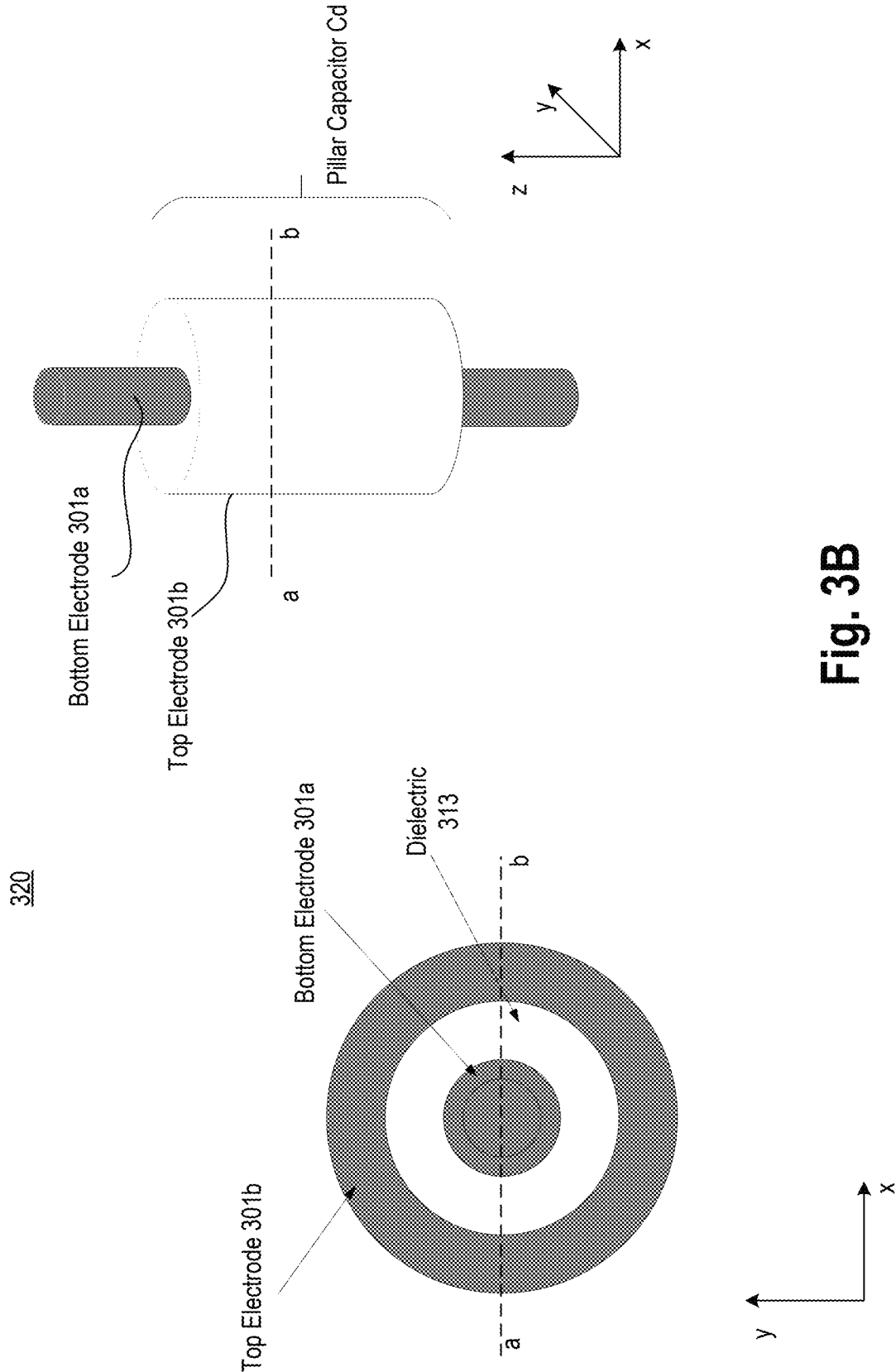
FIG. 3B illustrates a non-planar linear capacitor structure without conductive oxides, in accordance with at least one embodiment.

FIG. 3B illustrates a non-planar linear capacitor structure 320 without conductive oxides, in accordance with at least one embodiment. Compared to FIG. 3A, in at least one embodiment, linear dielectric is adjacent to top electrode and bottom electrode.

Figures 4A, 4B, 4C:
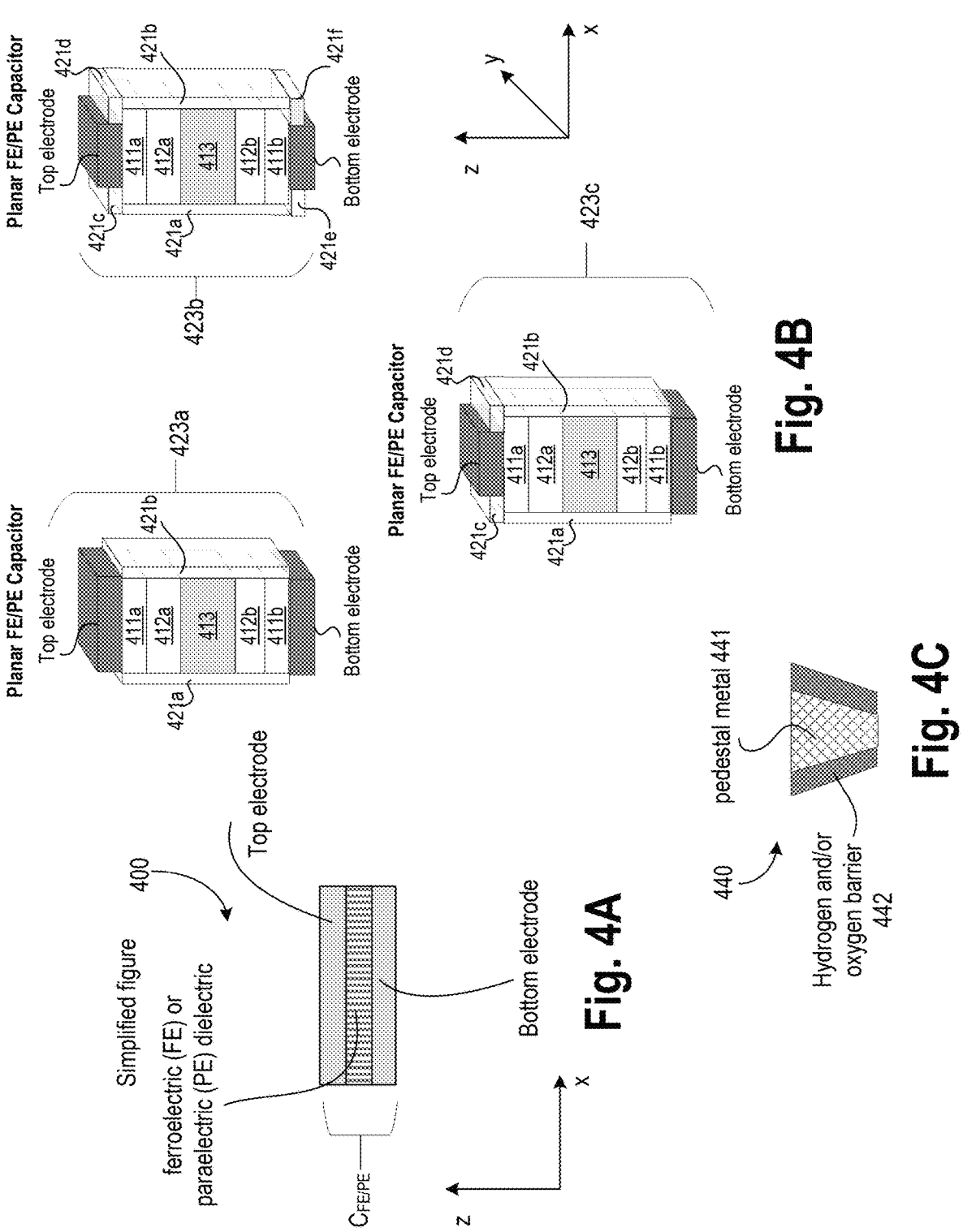
FIG. 4A illustrates a planar ferroelectric or paraelectric capacitor structure, in accordance with at least one embodiment.
FIG. 4B illustrates three planar ferroelectric or paraelectric capacitor structures, respectively, in accordance with at least one embodiment.
FIG. 4C illustrates a pedestal that connects to the top and/or bottom electrodes of the planar ferroelectric or paraelectric capacitor, in accordance with at least one embodiment.

FIG. 4A illustrates a planar ferroelectric or paraelectric capacitor structure, in accordance with at least one embodiment. FIG. 4B illustrates three planar ferroelectric or paraelectric capacitor structures, respectively, in accordance with at least one embodiment.

In at least one embodiment, capacitors are ferroelectric or paraelectric capacitors. In at least one embodiment, capacitors can take any planar form. One such simplified form is illustrated in FIG. 4A, in accordance with at least one embodiment. In at least one embodiment, planar capacitor structure 400 is a metal-insulator-metal (MIM) capacitor comprising a bottom electrode, a top electrode, and a ferroelectric dielectric between top electrode and bottom electrode as shown. In at least one embodiment, conductive oxide layer(s) are formed between bottom electrode and ferroelectric dielectric.

In at least one embodiment, planar capacitor 423a includes encapsulation portions 421a and 421b (also referred to as sidewall barrier seal) that are adjacent to side walls of plurality of layers of planar capacitor. In at least one embodiment, planar capacitor 423c includes encapsulation portions 421c and 421d that are partially adjacent to encapsulation portions 421a and 421b, and refractive intermetallic 411a. In at least one embodiment, encapsulation portions 421a and 421b extend in z-plane. In at least one embodiment, encapsulation portions 421c and 421d terminate into a via (not shown). In at least one embodiment, material for encapsulation portions 421c and 421d is same as those for encapsulation portions 421a and 421b. In at least one embodiment, barrier material for encapsulation portions 421a and 421b includes one or more of an oxide of: Ti, Al, or Mg.

In at least one embodiment, planar capacitor 423b includes encapsulation portions 421e and 421f that are partially adjacent to encapsulation portions 421a and 421b, and refractive intermetallic 411b. In at least one embodiment, encapsulation portions 421e and 421f terminate into a via (not shown). In at least one embodiment, encapsulation portions 421e and 421f extend in an x-plane. In at least one embodiment, material for encapsulation portions 421e and 421f is same as those for encapsulation portions 421a and 421b. In at least one embodiment, material for encapsulation portions 421a and 421b includes one or more of: Ti—Al—O, $Al_2O_3$, MgO, or nitride. In at least one embodiment, material for encapsulation portions 421a and 421b is a sidewall barrier (e.g., insulative material) that protects stack of layers from hydrogen and/or oxygen diffusion. In at least one embodiment, sidewall barrier material is not an interlayer dielectric (ILD) material. In at least one embodiment, lateral thickness (along x-axis) of encapsulation portions 421a and 421b (insulating material) is in a range of 0.1 nm to 20 nm. In at least one embodiment, sidewall barriers are in direct contact with ILD.

In at least one embodiment, planar capacitors 423a, 423b, and 423c comprise several layers stacked together to form a planar capacitor. In at least one embodiment, these layers may extend in an x-plane when capacitor is a planar capacitor. In at least one embodiment, stack of layers includes refractive intermetallic 411a and refractive intermetallic 411b as a barrier material, conductive oxides 412a, conductive oxide 412b, and ferroelectric material 413. In at least one embodiment, ferroelectric material 413 can be any of ferroelectric materials discussed herein. In at least one embodiment, refractive intermetallic 411a and refractive intermetallic 411b are removed, and electrodes are in direct contact with conductive oxide 412a and conductive oxide 412b.

In at least one embodiment, refractive intermetallic 411a and refractive intermetallic 411b maintains ferroelectric properties of ferroelectric capacitor. In absence of refractive intermetallic 411a and refractive intermetallic 411b, ferroelectric material 413 of a capacitor may lose its potency. In at least one embodiment, refractive intermetallic 411a and refractive intermetallic 411b comprises Ti and Al (e.g., TiAl compound). In at least one embodiment, refractive intermetallic 411a and refractive intermetallic 411b comprises one or more of Ta, W, and/or Co. In at least one embodiment, refractive intermetallic 411a and refractive intermetallic 411b includes a lattice of Ta, W, and Co.

In at least one embodiment, refractive intermetallic 411a and refractive intermetallic 411b is part of a barrier layer which is a super lattice of a first material and a second material, wherein first material includes Ti and Al (e.g., TiAl), and second material includes Ta, W, or Co (e.g., layers of Ta, W, and Co together). In at least one embodiment, lattice parameters of barrier layer are matched with lattice parameters of conductive oxides and/or ferroelectric material 413.

In at least one embodiment, refractive intermetallic 411a and refractive intermetallic 411b includes one of: Ti—Al such as $Ti_3Al$, TiAl, $TiAl_3$; Ni—Al such as $Ni_3Al$, $NiAl_3$, NiAl; Ni—Ti, Ni—Ga, $Ni_2MnGa$; FeGa, $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, or Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta) or combined properties. In at least one embodiment, additions such as Si, B, and Mg can markedly enhance other properties. In at least one embodiment, encapsulation portion 421a is coupled to a top electrode. In at least one embodiment, encapsulation portions 421a and 421b (insulating material) is placed around refractive intermetallic 411a, conductive oxide 412a, ferroelectric material 413, conductive oxide 412b, and refractive intermetallic 411b, while top and bottom surfaces of refractive intermetallic 411a and refractive intermetallic 411b are exposed for coupling to metal layers, vias, or a metallic pedestal.

In at least one embodiment, conductive oxide layer(s) are formed between top electrode and ferroelectric dielectric. In at least one embodiment, conductive oxides include: $IrO_2$, $RuO_2$, $PdO_2$, $OSO_2$, or $ReO_3$. In at least one embodiment, conductive oxides are of form $A_2O_3$ (e.g., $In_2O_3$, Fe2O3) and $ABO_3$ type, where 'A' is a rare earth element and 'B' is Mn. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

FIG. 4C illustrates pedestal 440 that connects to top and/or bottom electrodes of planar ferroelectric or paraelectric capacitor, in accordance with at least one embodiment. In at least one embodiment, pedestal 440 comprises pedestal metal 441 and sidewall barrier 442. In at least one embodiment, barrier 442 includes materials to protect hydrogen and/or oxygen from interacting with pedestal metal 441. In at least one embodiment, barrier 442 comprises Ti—Al—O, $Al_2O_3$, MgO, or nitride. In at least one embodiment, pedestal metal 441 includes one of Cu, Al, Ag, Au, W, or Co.

FIG. 5A illustrates a non-planar ferroelectric (FE) or paraelectric (PE) capacitor structure, in accordance with at least one embodiment. In at least one embodiment, non-planar capacitor structure 500 is rectangular in shape. In a cylindrical shaped case, in at least one embodiment, layers of non-planar capacitor structure 500 from center going outwards include bottom electrode 501a, first conductive oxide 512a, ferroelectric (FE) or paraelectric (PE) dielectric material 513, second conductive oxide 512b, and top electrode 501b. In at least one embodiment, conducting oxides are removed and FE/PE dielectric is directly connected to top electrode 501b and bottom electrode 501a. In at least one embodiment, ferroelectric dielectric material 513 can include any suitable dielectric, where thickness of ferroelectric or paraelectric (FE or PE) dielectric film is a range of 1 nm to 20 nm. In at least one embodiment, ferroelectric or paraelectric dielectric material 513 includes any one of materials discussed herein for ferroelectrics or paraelectrics. In at least one embodiment, central region 502 of non-planar capacitor structure 500 is filled with oxide or an insulative material. In at least one embodiment, central region 502 is filled with metal that abuts with bottom electrode 501a to form a thicker bottom electrode.

In at least one embodiment, first conductive oxide 512a is conformally deposited over bottom electrode 501a. In at least one embodiment, ferroelectric or paraelectric dielectric material 513 is conformally deposited over first conductive oxide 512a. In at least one embodiment, second conductive oxide 512b is conformally deposited over ferroelectric or paraelectric dielectric material 513. In at least one embodiment, top electrode 501b is conformally deposited over second conductive oxide 512b. In at least one embodiment, bottom electrode 501a is in center while top electrode 501b is on an outer circumference of non-planar capacitor structure 500.

In at least one embodiment, material for bottom electrode 501a may include one or more of: Cu, Al, Ag, Au, W, or Co, or their alloys. In at least one embodiment, material for first conductive oxide 512a include: $IrO_2$, $RuO_2$, $PdO_2$, $OSO_2$, or $ReO_3$. In at least one embodiment, conductive oxides are of form $A_2O_3$ (e.g., $In_2O_3$, $Fe_2O_3$) and $ABO_3$ type, where 'A' is a rare earth element and 'B' is Mn. In at least one embodiment, material for second conductive oxide 512b may be same as material for first conductive oxide 512a. In at least one embodiment, material for top electrode 501b may include one or more of: Cu, Al, Ag, Au, W, or Co, or their alloys.

In at least one embodiment, a first refractive intermetallic layer (not shown) is formed between dielectric material 513 and first conductive oxide 512a. In at least one embodiment, a second refractive intermetallic layer (not shown) is formed between ferroelectric or paraelectric dielectric material 513 and second conductive oxide 512b. In at least one embodiment, first and second refractive intermetallic layers are directly adjacent to their respective conductive oxide layers and to ferroelectric or paraelectric dielectric material 513. In at least one embodiment, refractive intermetallic maintains capacitive properties of ferroelectric or paraelectric dielectric material 513. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as $Ti_3Al$, $TiAl$, $TiAl_3$; Ni—Al such as $Ni_3Al$, $NiAl_3$, $NiAl$; Ni—Ti, Ni—Ga, $Ni_2MnGa$; FeGa, $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally

16

Figure 5B:
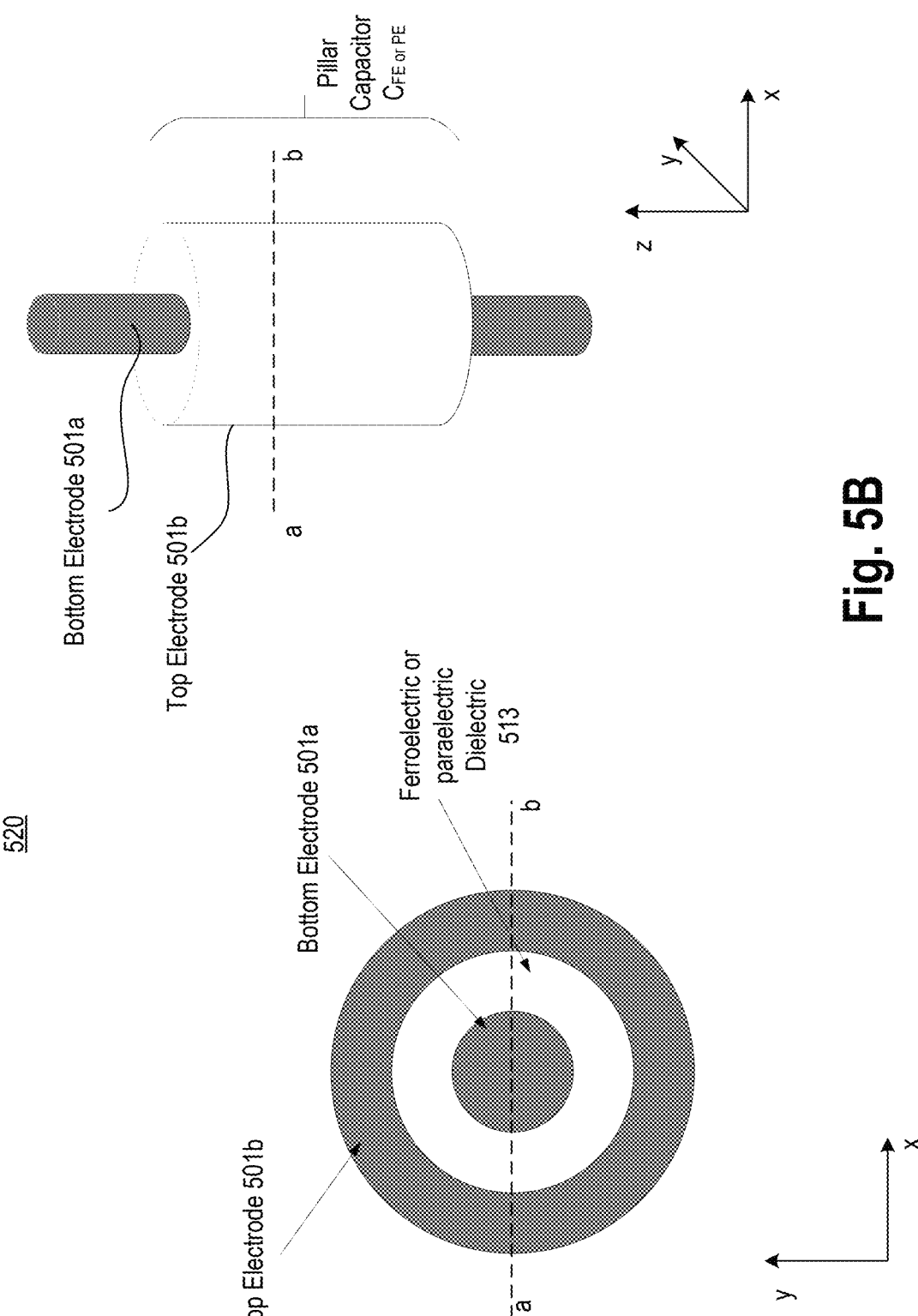
FIG. 5B illustrates a non-planar ferroelectric or paraelectric capacitor structure without conductive oxides, in accordance with at least one embodiment.

FIG. 5B illustrates a non-planar ferroelectric or paraelectric capacitor structure 520 without conductive oxides, in accordance with at least one embodiment. Compared to non-planar capacitor structure 500, here first conductive oxide 512a and second conductive oxide 512b are removed and ferroelectric material 513 is adjacent to top electrode 501b and bottom electrode 501a as shown, in at least one embodiment.

In at least one embodiment, ferroelectric material can be replaced with anti-ferroelectric material. In at least one embodiment, anti-ferroelectric (AFE) material includes lead zirconate titanate (PZT) with high Zr doping, La-doped PZT with high Zr doping, $HfSiO_2$ with high Si doping, $HfZrO_2$ (HZO) with high Zr doping, $ZrO_2$, $PbZrO_3$ (Lead Zirconate), $NH_4H2PO_4$ (Ammonium dihydrogen phosphate (ADP)), $NaNbO_3$ (Sodium Niobate), and K doped $NaNbO_3$, etc. Table 1 describes some bulk anti-ferroelectric materials, with various physical/chemical modifications for enhancing energy storage density, in at least one embodiment.

| Material name | Physical/Chemical Modifications | Energy Density ($J/cm^3$) | Electric Field (kV/cm) |
|---|---|---|---|
| $(Pb_{0.97}La_{0.02})(Zr_{0.97}Ti_{0.03})O_3$ | 3 wt % glass ($PbO$—$B2O_3$—$SiO_2$—$ZnO$) | 3.1 | 581 |
| $(Pb_{0.97}La_{0.02})(Zr_{0.97}Ti_{0.03})O_3$ | without glass | 1.4 | 581 |
| $Pb_{0.99}Nb_{0.02}[(Zr_{0.57}Sn_{0.43})_{1-y}Ti_y]_{0.98}O_3$ | with half electrode | 1.30 | 70 |
| $Pb_{0.99}Nb_{0.02}[(Zr_{0.57}Sn_{0.43})_{1-y}Ti_y]_{0.98}O_3$ | with full electrode | 1.19 | 70 |
| $(Pb_{(0.94-x)}La_{0.04}Ba_x)[(Zr_{0.60}Sn_{0.40})_{0.841}Ti_{0.16}]O_3$ | x = 0 (0 MPa) | 0.35 | 30 |
| $(Pb_{(0.94-x)}La_{0.04}Ba_x)[(Zr_{0.60}Sn_{0.40})_{0.841}Ti_{0.16}]O_3$ | x = 0.02 (20 MPa) | 0.38 | 30 |
| $Pb_{0.99}Nb_{0.02}[(Zr_{0.60}Sn_{0.40})_{0.95}Ti_{0.05}]O_3$ | — | 0.62 | 56 |
| $Pb_{0.97}La_{0.02}(Zr_{0.56}Sn_{0.35}Ti_{0.09})O_3$ | 4 wt % glass ($CdO$—$Bi_2O_3$—$PbO$—$ZnO$—$Al_2O_3$—$B2O_3$—$SiO_2$) | 3.3 | 150 |
| $Pb_{0.97}La_{0.02}(Zr_{0.56}Sn_{0.35}Ti_{0.09})O_3$ | Without glass | 1.9 | 110 |
| $(Pb_{0.97}La_{0.02})(Zr_{0.92}Sn_{0.05}Ti_{0.03})O_3$ | 3% glass ($0.8PbO$—$0.2B2O_3$) | 7.4 | 475 |
| $(Pb_{0.97}La_{0.02})(Zr_{0.92}Sn_{0.05}Ti_{0.03})O_3$ | Without glass | 4.5 | 320 |
| $Pb_{0.97}La_{0.02}(Zr_{0.95}Ti_{0.05})O_3$ | — | 12.4 | 1120 |
| $(Pb_{0.85}Ba_{0.08}Sr_{0.03}La_{0.03})(Zr_{0.74}Sn_{0.22}Ti_{0.04})$ | — | 1.2 | 100 |
| $(Bi_{1/2}Na_{1/2})_{0.94}Ba_{0.06}]La_{0.8}Zr_{0.2}TiO_3$ | — | 1.58 | 85 |
| $(Ba_{0.1}La_{0.02})(Zr_{0.675}Sn_{0.275}Ti_{0.05})O_3$ | — | 2.05 | 70 |
| $0.75(0.80Bi_{1/2}Na_{1/2}TiO_3$—$0.20Bi_{1/2}K_{1/2}TiO_3)$—$0.25SrTiO_3$ | — | 0.84 | 100 |
| $Pb_{0.97}La_{0.02}(Zr_{0.50}Sn_{0.45}Ti_{0.05})O_3$ | — | 5.6 | 400 |
| $(Pb_{0.858}Ba_{0.1}La_{0.02}Y_{0.008})(Zr_{0.65}Sn_{0.3}Ti_{0.05})O_3$—$(Pb_{0.97}La_{0.02})(Zr_{0.9}Sn_{0.05}Ti_{0.05})O_3$ | — | 4.65 | 200 |
| $0.89Bi_{0.5}Na_{0.5}TiO_3$—$0.06BaTiO_3$—$0.05K_{0.5}Na_{0.5}NbO_3$ | double stage sintering | 0.90 | 100 |
| $(Pb_{0.858}Ba_{0.1}La_{0.02}Y_{0.008})(Zr_{0.65}Sn_{0.3}Ti_{0.05})O_3$—$(Pb_{0.97}La_{0.02})(Zr_{0.9}Sn_{0.05}Ti_{0.05})O_3$ | spark plasma sintering | 6.40 | 275 |
| $(Pb_{0.858}Ba_{0.1}La_{0.02}Y_{0.008})(Zr_{0.65}Sn_{0.3}Ti_{0.05})O_3$—$(Pb_{0.97}La_{0.02})(Zr_{0.9}Sn_{0.05}Ti_{0.05})O_3$ | conventional sintering | 4.65 | 200 |
| $(Na_{(1-x)}Ca_x)(Nb_{(1-x)}Zr_x)O_3$, where x = 0.04 | conventional sintering | 0.91 | 130 |
| $(Pb_{0.92}La_{0.04}Ba_{0.02})[(Zr_{0.60}Sn_{0.40})_{0.84}Ti_{0.16}]O_3$ | at 90 MPa | 0.91 | 60 |
| $0.91(Bi_{0.5}Na_{0.5})TiO_3$—$0.07BaTiO_3$—$0.02(K_{0.5}Na_{0.5})NbO_3$ | at 100 MPa | 0.387 | 60 |
| $(Pb_{0.96}La_{0.04})(Zr_{0.90}Ti_{0.10})O_3$ | at 100 MPa | 0.698 | 60 | enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B, or Mg can markedly enhance other properties. In at least one embodiment, thicknesses of layers of non-planar capacitor structure 500 in x-axis are in range of 1 nm to 30 nm. In at least one embodiment, refractive intermetallic layers are not used for non-planar capacitor structure 500.

Figure 6A:
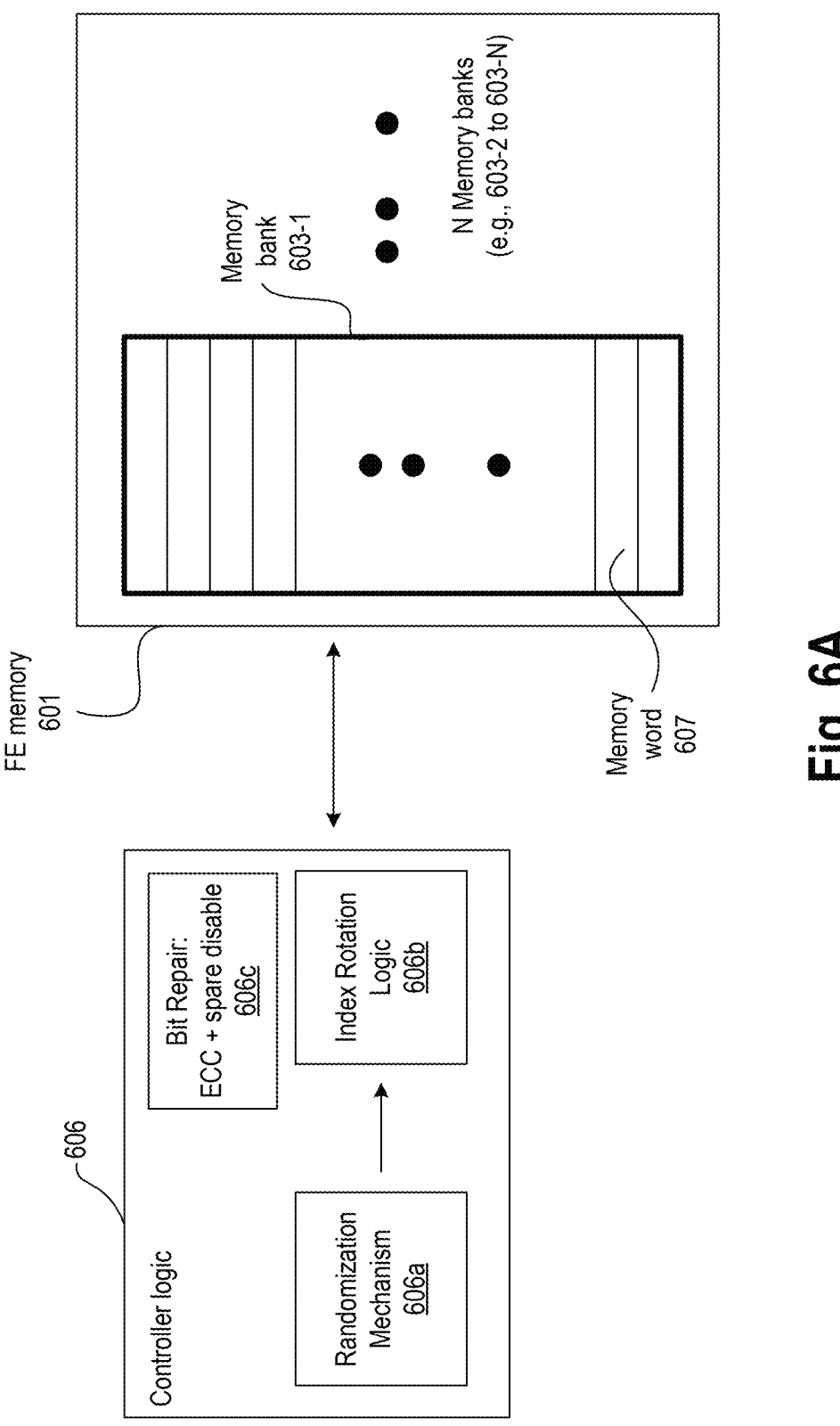
FIG. 6A illustrates a high-level endurance enhancement architecture for a paraelectric (PE) or ferroelectric (FE) memory, in accordance with at least one embodiment.

FIG. 6A illustrates high-level endurance enhancement architecture 600 for paraelectric (PE) or ferroelectric (FE) memory, in accordance with at least one embodiment. In at least one embodiment, architecture 600 comprises memory array 601 and controller logic 606. In at least one embodiment, memory array 601 is memory with non-linear polar material. In at least one embodiment, memory array 601 includes bit-cells that comprise at least one transistor and at least one capacitor coupled to it, where capacitor has non-linear polar material.

In at least one embodiment, memory array 601 includes a plurality of memory banks (e.g., 603-1 through 603-N, where 'N' is a number). In at least one embodiment, each memory bank (e.g., 603-1) includes a plurality of memory words (e.g., memory word 607). In at least one embodiment, each memory word includes a plurality of memory bit-cells. For sake of simplicity, other memory components are not shown, such as write drivers, column multiplexers, sense-amplifiers, etc.

In at least one embodiment, controller logic 606 comprises endurance hardware and/or software to provide memory endurance to memory array 601. In at least one embodiment, memory endurance is used to insure write and/or read operations from memory array 601 are reliable. Write endurance is number of programs and erase cycles that when applied to a memory block, bank, or word before memory block, bank, or word, becomes unreliable. In at least one embodiment, endurance mechanisms include a wear leveling scheme that uses index rotation, outlier compensation to handle weak bits, and random swap injection to mitigate wear out attacks. For sake of simplicity, memory banks are generally referred to as reference 603 instead of a particular memory bank reference (e.g., 603-1, 603-2, etc.). At least one embodiment described to general reference are applicable to an individual particular reference. In at least one embodiment, description of memory bank 603 is applicable for memory banks 603-1, 603-2, through 603-N.

In at least one embodiment, controller logic 606 (also referred to as refresh logic) comprises random invertible bit matrix 606a, index rotation logic 606b, and bit repair logic 606c. In at least one embodiment, index rotation logic 606b enables random swap injection which randomizes index rotation to obfuscate mapping from addresses to rotated indexes. In at least one embodiment, index rotation logic 606b randomizes rotation of gap words in memory bank 603. Malicious users (or attackers) may write programs that deliberately track wear leveling schemes described herein. These attackers may attempt to alter a memory reference pattern to continue to stress a single physical line even as wear leveling scheme assigns that physical line to different addresses. In at least one embodiment, index rotation logic 606b provides a facility to make tracking of physical lines difficult. In at least one embodiment, this facility makes a random decision (e.g., using an externally generated random number) to either swap or not each time a swap opportunity arises. In at least one embodiment, over time randomness injected into swapping process makes tracking cache lines more difficult.

In at least one embodiment, index rotation logic 606b is used for implementing a wear leveling scheme. In at least one embodiment, index rotation logic 606b rotates addresses throughout memory bank 603 to perform a wear leveling function. In various embodiments, index rotation logic 606b ensures that memory requests are spread across memory locations rather than a single memory location.

In at least one embodiment, bit repair logic 606c includes double error correcting, or triple error detecting error correction code (ECC) to discover new bit errors and spare disable which eliminate memory words with particularly high error rates. In at least one embodiment, spare disable involves having a buffer of spare cache lines. In at least one embodiment, when cache lines are particularly unreliable, spare disable can swap out unreliable cache lines for reliable spares. In at least one embodiment, spares may be implemented with memory technology other than FE memory such as static random-access memory (SRAM). In at least one embodiment, bit repair logic 606c addresses problem of weak memory bits. In at least one embodiment, each cache line or word 607 in memory bank 603 includes a valid bit. In at least one embodiment, valid bit indicates whether data associated with that line/word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, various endurance mechanisms discussed herein can be used in any combination or order. In at least one embodiment, some memory products may select one or more endurance mechanisms instead of all three discussed herein. In at least one embodiment, some memory products may apply to all three endurance mechanisms to achieve most endurance for memory array 601. In at least one embodiment, endurance mechanisms are applied to memory array 601 to maximize usage of such memory.

Figure 6B:
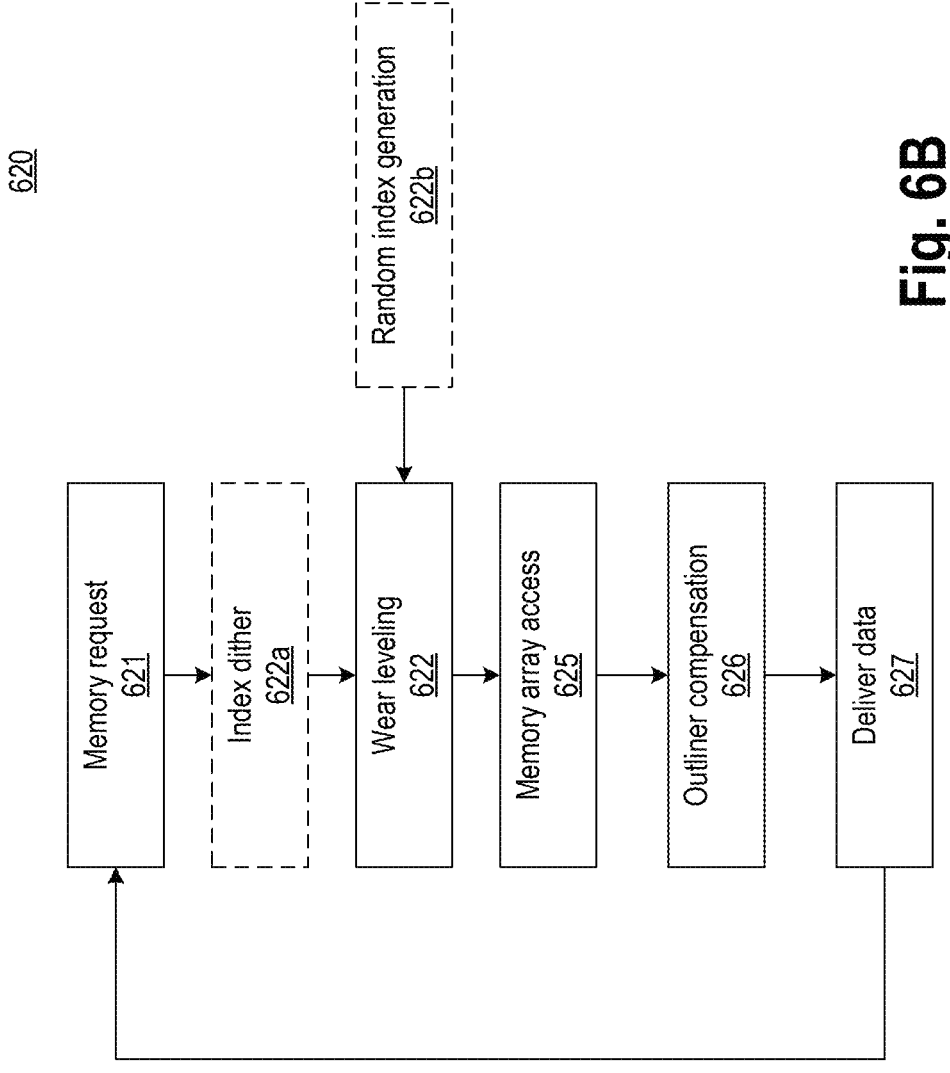
FIG. 6B illustrates a flowchart of memory endurance for PE and FE memory, in accordance with at least one embodiment.

FIG. 6B illustrates flowchart 620 of memory endurance for PE and FE memory, in accordance with at least one embodiment. While blocks in flowchart 620 are illustrated in a particular order, order can be modified, in at least one embodiment. In at least one embodiment, some blocks may be performed before others based on whether read or write operations are being performed. In at least one embodiment, various blocks can be implemented in hardware, software, or a combination of them.

At block 621, in at least one embodiment, controller logic 606 sends a memory request to memory array 601. In at least one embodiment, this request may be a read request or a write request. In at least one embodiment, if it is a write request, controller logic 606 applies wear leveling scheme at block 622. In at least one embodiment, wear leveling scheme is linear in that a gap word or gap cache line is swapped with an adjacent word or cache line. In at least one embodiment, wear leveling is dithered as indicated by block 622a. In at least one embodiment, index or pointer to gap word or gap cache line is used to swap gap word or gap cache line with either an adjacent cell with one higher index or address or with an adjacent cell with one lower index or address. As such, in at least one embodiment, wear leveling is dithered.

In at least one embodiment, wear leveling is randomized. In at least one embodiment, a random index is generated at block 622b. In at least one embodiment, random index is then used to swap gap word or gap cache line with an adjacent or a non-adjacent word or cache line. In at least one embodiment, random index is dithered. In at least one embodiment, dithered random index is then used for wear leveling.

In at least one embodiment, if memory request is a read access (as indicated by block 625), outlier compensation is applied as indicated by block 626. At block 626, in at least one embodiment, controller logic 606 addresses problem of weak memory bits by checking a valid bit for memory word being addressed or accessed. In at least one embodiment, valid bit indicates whether data associated with that line or word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, after ECC is applied, requested data is provided to controller logic 606 as indicated by block 627. In at least one embodiment, memory endurance for non-linear polar material based memory is enhanced by endurance mechanisms. In at least one embodiment, this allows more read and write operations to memory before any memory block, bank, or word becomes unreliable. In at least one embodiment, capacitors for each bit-cell in memory array 601 are arranged in a stack and fold manner.

Figure 7A:
FIG. 7A illustrates an M×N memory array of bit-cells and corresponding periphery circuitry where plate-line (PL) is parallel to bit-line (BL) and orthogonal to word-line (WL), in accordance with at least one embodiment.

FIG. 7A illustrates apparatus 700 comprising an M×N memory array of bit-cells and corresponding periphery circuitry where plate-line (PL) is parallel to bit-line (BL) and orthogonal to word-line (WL), in accordance with at least one embodiment. In at least one embodiment, apparatus 700 comprises M×N memory array 701 of bit-cells, logic circuitry 702 for address decoding, logic circuitry 703 for sense amplifier, plate-line (PL) drivers and bit-line drivers, and logic circuitry 704 for word-line (WL) drivers and/or WL repeaters. In at least one embodiment, apparatus 700 comprises endurance hardware and/or software 706 to provide memory endurance to memory array 701.

In at least one embodiment, plate-lines PL0, PL1, through PLN are parallel to bit-lines BL0, BL1, through BLN, while word-lines WL0, WL1, through WLM are orthogonal to plate-lines and bit-lines, where 'N' is a number greater than 1. In at least one embodiment, individual memory bit-cells in memory array 701 are organized in rows and columns. For example, memory bit-cells 701$_{0,0}$ through 701$_{M,N}$ are organized in an array. In at least one embodiment, an individual memory bit-cell (e.g., 701$_{0,0}$) is a 1T1C bit-cell. An example of a 1T1C bit-cell is described with reference to FIGS. 8A-B. In at least one embodiment, a bit-cell of M×N memory array 701 is a unit cell which can have multiple 1T1C bit-cells associated with a bit-line. Examples of unit cells are described with reference to FIGS. 18-47. In at least one embodiment, unit cells are of same type (e.g., homogenous designs). In at least one embodiment, unit cells are of different types (e.g., heterogeneous designs).

Figure 7B:
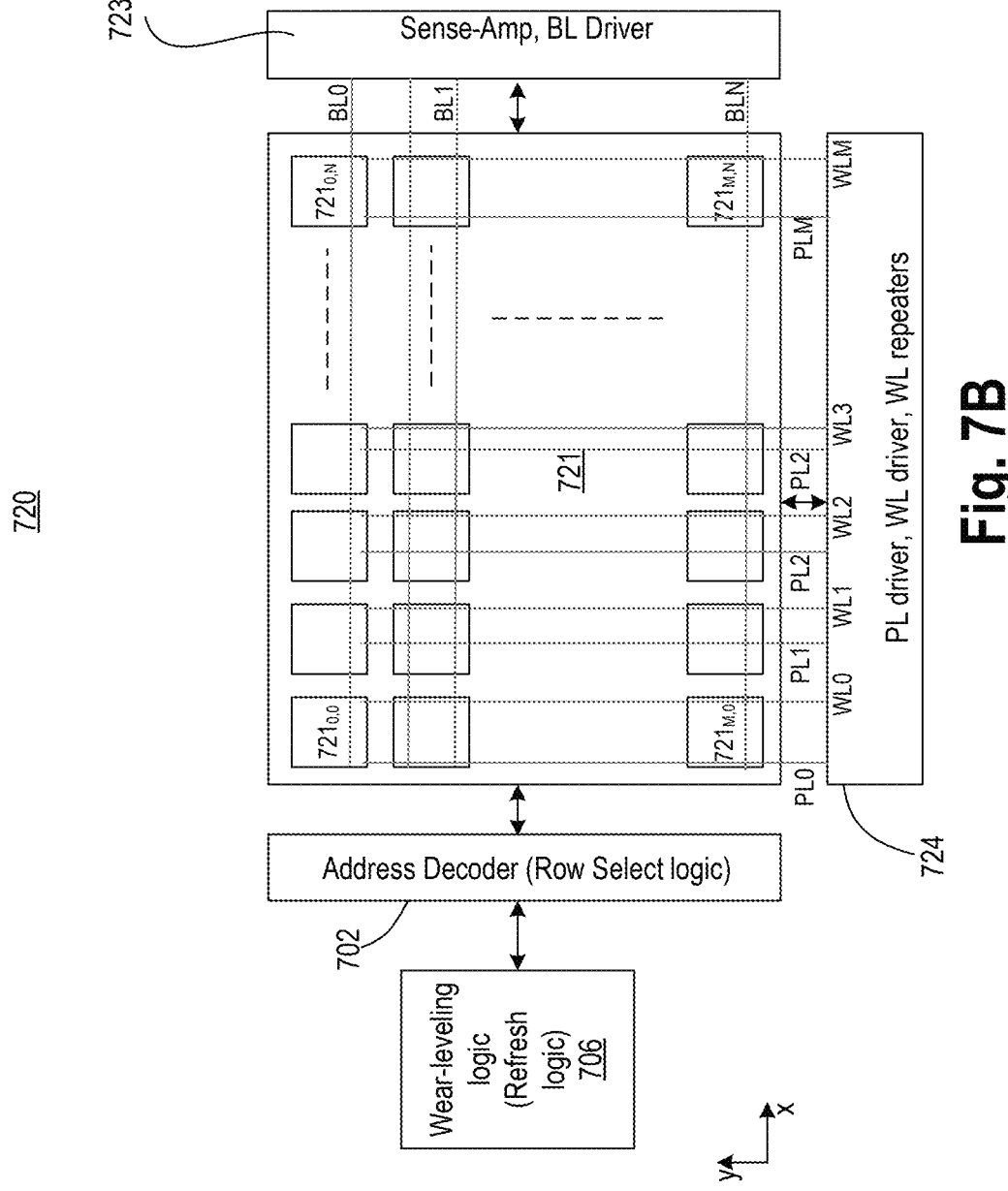
FIG. 7B illustrates an M×N memory array of bit-cells and corresponding periphery circuitry where PL is parallel to WL and orthogonal to bit-line (BL), in accordance with at least one embodiment.

FIG. 7B illustrates apparatus 720 comprising an M×N memory array 721 of bit-cells and corresponding periphery circuitry where PL is parallel to WL and orthogonal to bit-line (BL), in accordance with at least one embodiment. In at least one embodiment, apparatus 720 comprises M×N memory array 721 of bit-cells, logic circuitry 702 for address decoding, logic circuitry 723 for sense amplifier, and bit-line drivers, and logic circuitry 724 for PL drivers, WL drivers and/or WL repeaters. In at least one embodiment, plate-lines PL0, PL1, through PLM are parallel to word-lines WL0, WL1, through WLM while bit-lines BL0, BL1, through BLN are orthogonal to plate-lines and word-lines, where 'N' and 'M' are numbers greater than 1. In at least one embodiment, apparatus 720 comprises endurance hardware and/or software 706 to provide memory endurance to memory array 721.

Figures 8A, 8B:
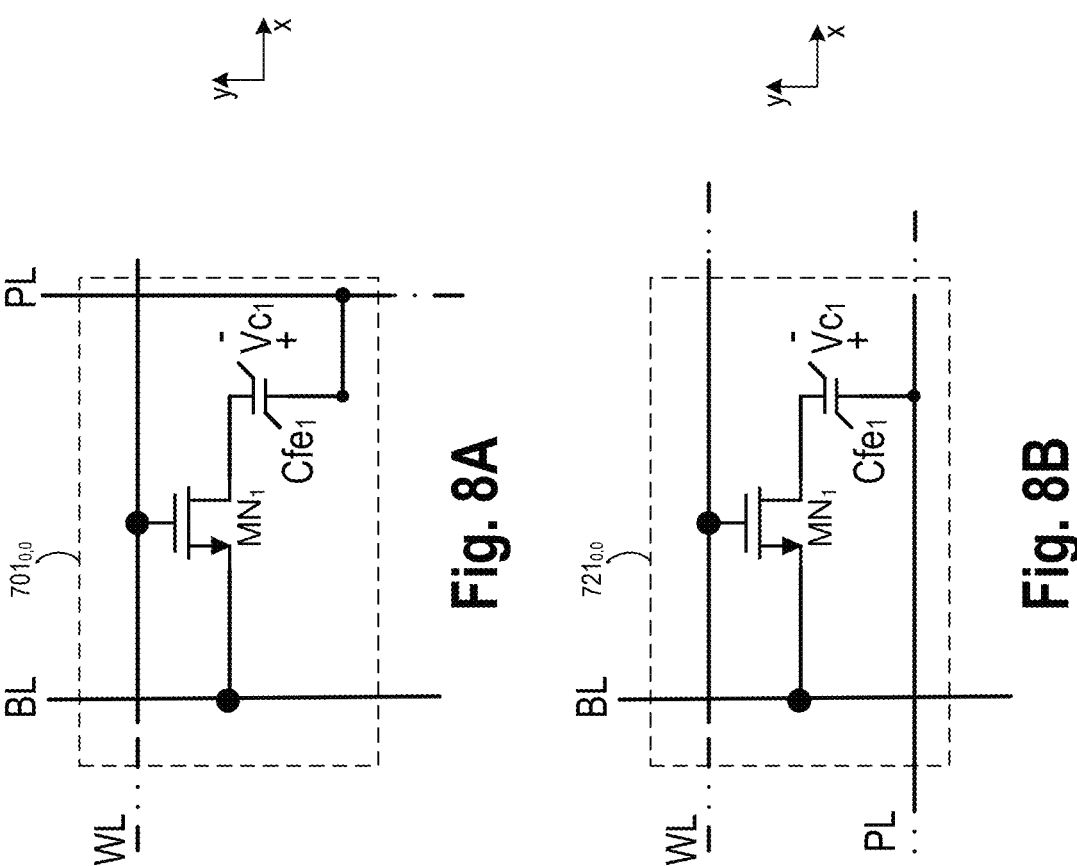
FIG. 8A illustrates 1T1C bit-cell where BL is parallel to PL, in accordance with at least one embodiment.
FIG. 8B illustrates 1T1C bit-cell where PL is parallel to WL, in accordance with at least one embodiment.

FIG. 8A illustrates 1T1C bit-cell 800 (e.g., 701$_{0,0}$) where BL is parallel to PL, in accordance with at least one embodiment. In at least one embodiment, 1T1C bit-cell 800 comprises a transistor and a capacitor. In at least one embodiment, transistor is an n-type transistor MN$_1$ with a gate terminal coupled or controllable by WL, a source terminal coupled to BL, and a drain terminal coupled to a first terminal of capacitor Cfei. In at least one embodiment, a second terminal of capacitor is coupled to PL. In at least one embodiment, transistor is a p-type transistor. In at least one embodiment, capacitor of 1T1C bit-cell 800 is a capacitor according to any one of FIG. 2, FIG. 3A, FIG. 3B, FIGS. 4A-C, FIG. 5A, or FIG. 5B. In at least one embodiment, capacitor of 1T1C bit-cell 800 is replaced with a planar memory element structure. In at least one embodiment, planar memory element structure is a resistive element. In at least one embodiment, planar memory element structure is a magnetic tunnel junction (MTJ). In at least one embodiment, planar memory element structure is phase change memory (PCM) based element.

FIG. 8B illustrates 1T1C bit-cell 820 (e.g., 721$_{0,0}$) where PL is parallel to WL, in accordance with at least one embodiment. In at least one embodiment, 1T1C bit-cell 820 is like 1T1C bit-cell 800 but with different orientation of PL relative to WL. Here, BL is orthogonal to WL and PL, where PL and WL are parallel to one another. Depending on orientation of BL, PL, and WL relative to one another, memory architecture can be redesigned to achieve desired performance.

Figure 9:
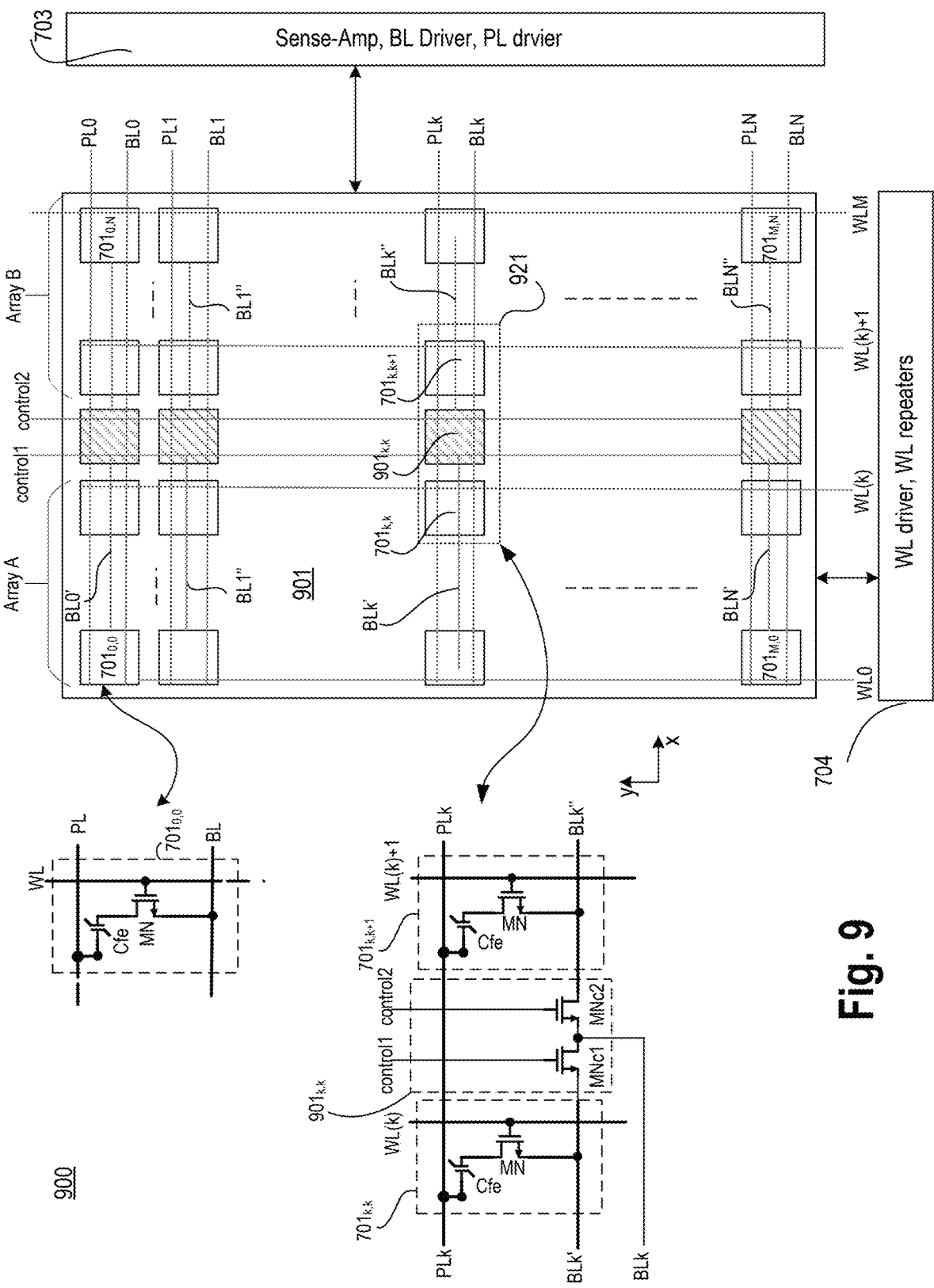
FIG. 9 illustrates a memory with circuitry with dual devices to divide memory into arrays to reduce polarization targets for the memory bit-cells, where PL is parallel to BL, in accordance with at least one embodiment.

FIG. 9 illustrates memory 900 with circuitry with dual devices to divide memory into arrays to reduce polarization targets for the memory bit-cells, where PL is parallel to BL, in accordance with at least one embodiment. In at least one embodiment, dp target for memory bit-cell is reduced by introducing splitting circuitry (e.g., patterned cells such as cell 901$_{k,k}$ on row k and column k of memory array 901) that divides or splits memory array 901 into two sub-arrays, Array A and Array B. In at least one embodiment, WL is orthogonal to PL and BL, where PL and BL are generated by logic circuitry 703 and WL is generated by logic circuitry 704. In at least one embodiment, splitting circuitry includes n-type transistors MNc1 and MNc2 coupled in series and controllable by control1 and control2 signals, respectively. In at least one embodiment, gate terminal of n-type transistor MNc1 is coupled to control1 while gate terminal of n-type transistor MNc2 is coupled to control2. In at least one embodiment, at any one time, one of transistors MNc1 and Mnc2 of splitting circuitry is turned on by respective control signals to couple a bit-line of a selected array to a sense amplifier. In at least one embodiment, bit-line of a bit-cell from an unselected array is decoupled from sense amplifier. In at least one embodiment, bit-line of unselected array is floating node. In at least one embodiment, bit-line of unselected array is parked to a known voltage. In at least one embodiment, bit-line of unselected array is pre-charted to a known voltage.

In at least one embodiment, function and structure of splitting circuitry is illustrated with reference to bit-cells 921 which comprises bit-cell 701$_{k,k}$ of Array A, splitting circuitry cell 901$_{k,k}$, and bit-cell 701$_{k,k+1}$ of Array B. In at least one embodiment, n-type transistor MNc1 is coupled to a first local bit-line BLk' and a global bit-line BLk'', wherein n-type transistor MNc1 is controllable by control1. In at least one embodiment, n-type transistor MNc2 is coupled to a second local bit-line BLk'' and global bit-line BLk, wherein n-type transistor MNc2 is controllable by control2. In at least one embodiment, global bit-line BLk is coupled to both n-type transistors MNc1 and MNc2. In at least one embodiment, first local bit-line BLk' is coupled to bit-cell 701$_{k,k}$, and other bit-cells of Array A. In at least one embodiment, second local bit-line BLk'' is coupled to bit-cell 701$_{k,k+1}$, and other bit-cells of Array B. Similarly, every row has an associated splitting circuitry which couples a global bit-line (e.g., BL0, BL1, BL2, . . . , BLN) to local bit-lines (e.g., BL0'/BL0", BL1'/BL1", BL2'BL2", . . . BLN'/BLN"), in accordance with at least one embodiment.

Figure 10:
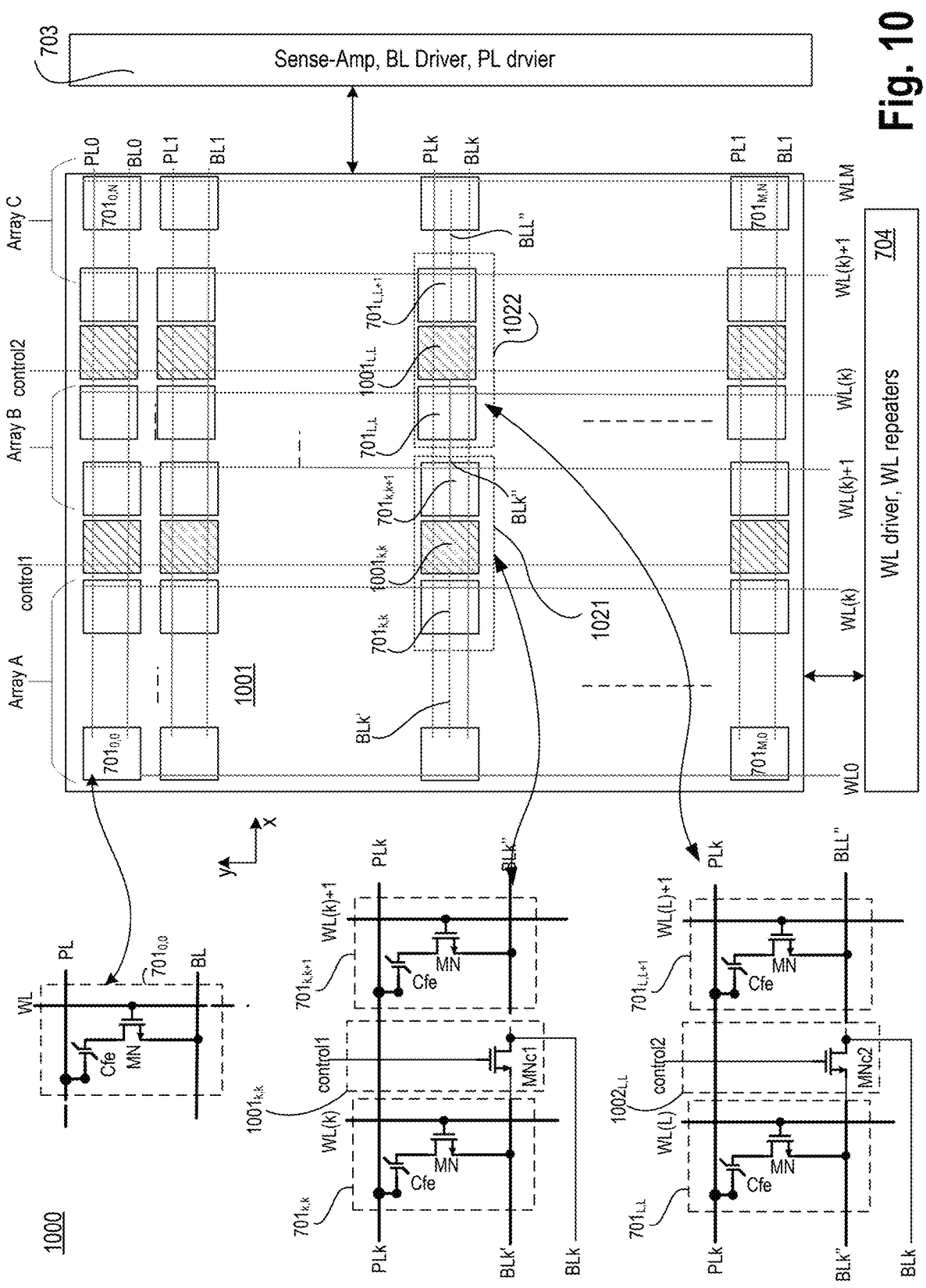
FIG. 10 illustrates a memory with circuitry with a device to divide memory into arrays to reduce polarization targets for the memory bit-cells, where PL is parallel to BL, in accordance with at least one embodiment.

FIG. 10 illustrates memory 1000 with circuitry with a device to divide memory into arrays to reduce polarization targets for the memory bit-cells, where PL is parallel to BL, in accordance with at least one embodiment. In at least one embodiment, dp target for memory bit-cell is reduced by introducing splitting circuitries (e.g., patterned cells such as cell $1001_{k,k}$ and $1001_{L,L}$ on row k and column k of memory array 1001) that divides or splits memory array 1001 into three sub-arrays, Array A, Array B, and Array C. In at least one embodiment, WL is orthogonal to PL and BL, where PL and BL are generated by logic circuitry 703 and WL is generated by logic circuitry 704.

In at least one embodiment, first splitting circuitry includes n-type transistor MNc1 coupled in series and controllable by control1. In at least one embodiment, second splitting circuitry includes n-type transistor MNc2 coupled in series and controllable by control2. In at least one embodiment, first splitting circuitry is similar to splitting circuitry of FIG. 9. In at least one embodiment, second splitting circuitry is similar to splitting circuitry of FIG. 9.

In at least one embodiment, gate terminal of n-type transistor MNc1 is coupled to control1 while gate terminal of n-type transistor MNc2 is coupled to control2. In at least one embodiment, at any one time, one of transistors MNc1 and Mnc2 of splitting circuitry is turned on by respective control signals to couple a bit-line of a selected array to a sense amplifier. In at least one embodiment, bit-line of a bit-cell from an unselected array is decoupled from sense amplifier. In at least one embodiment, bit-line of unselected array is floating node. In at least one embodiment, bit-line of unselected array is parked to a known voltage. In at least one embodiment, bit-line of unselected array is pre-charted to a known voltage.

In at least one embodiment, function and structure of first splitting circuitry is illustrated with reference to bit-cells 1021 which comprises bit-cell $701_{k,k}$ of Array A, splitting circuitry cell $1001_{k,k}$, and bit-cell $701_{k,k+1}$ of Array B. In at least one embodiment, n-type transistor MNc1 is coupled to a first local bit-line BLk' and a global bit-line BLk, wherein n-type transistor MNc1 is controllable by control1.

In at least one embodiment, function and structure of second splitting circuitry is illustrated with reference to bit-cells 1022 which comprises bit-cell $701_{L,L}$ of Array B, splitting circuitry cell $1001_{L,L}$, and bit-cell $701_{L,L+1}$ of Array C. In at least one embodiment, n-type transistor MNc2 is coupled to a second local bit-line BLk" and global bit-line BLk, wherein n-type transistor MNc2 is controllable by control2. In at least one embodiment, global bit-line BLk is coupled to both n-type transistors MNc1 and MNc2. In at least one embodiment, first local bit-line BLk' is coupled to bit-cell $701_{k,k}$, and other bit-cells of Array A. In at least one embodiment, second local bit-line BLk" is coupled to bit-cell $701_{k,k+1}$, and other bit-cells of Array B. In at least one embodiment, third local bit-line BLL" is selectively coupled to global bit-line BLk via another splitting circuitry (not shown). Similarly, every row has an associated splitting circuitry which couples a global bit-line (e.g., BL0, BL1, BL2 . . . , BLN) to local bit-lines (e.g., BL0'/BL0", BL1'/BL1", BL2'/BL2", . . . BLN'/BLN"), in accordance with at least one embodiment.

In at least one embodiment, during read or write operation, local bit-line of one sub-array (e.g., one of Array A, Array B, or Array C) is coupled to a global bit-line for that row (or column), and that global bit-line is then coupled to a sense amplifier or bit-line driver. By segmenting memory array 1001 into many sub-arrays and introducing splitting circuitry to couple to decouple local bit-lines from a global bit-line, overall capacitance on global bit-line is reduced, in accordance with at least one embodiment. By reducing capacitance on global bit-line, sense margin for sense amplifier is improved, in accordance with at least one embodiment. By reducing capacitance on local bit-lines and global bit-lines, polarization requirements or targets for non-linear polar material based capacitors is reduced, in accordance with at least one embodiment. By reducing polarization requirement or targets for non-linear polar material based capacitors, memory 1001 can be operated at lower supply voltages such as voltage supply voltages of processor cores adjacent to memory array 1001.

Figure 11:
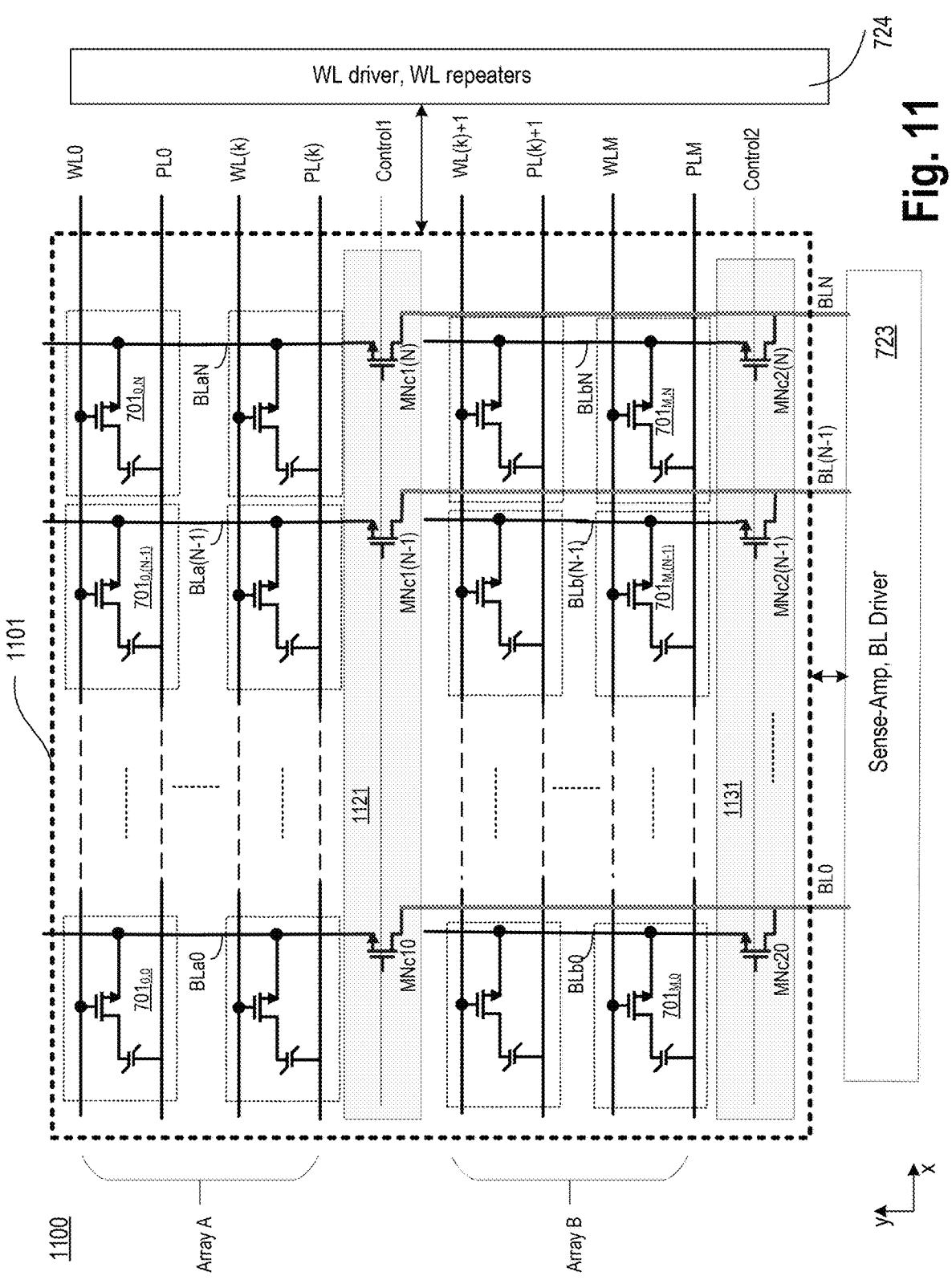
FIG. 11 illustrates a memory with circuitry with a device to divide memory into arrays to reduce polarization targets for the memory bit-cells, where PL is parallel to WL, in accordance with at least one embodiment.

FIG. 11 illustrates memory 1100 with circuitry with a device to divide memory into arrays to reduce polarization targets for the memory bit-cells, where PL is parallel to WL, in accordance with at least one embodiment. Memory 1100 is similar to memory 1000 in features and function. Here, PL is parallel to WL and orthogonal to BL, in accordance with at least one example. In at least one embodiment, memory array 1101 is split into Array A and Array B by first splitting circuitry 1121 and second splitting circuitry 1131. In at least one embodiment, any number of splitting circuitries may be used to split memory array 1101 into any number of sub-arrays to reduce capacitance on global bit-lines. In at least one embodiment, a row of transistors in a splitting circuitry is controlled by a control signal.

In at least one embodiment, splitting circuitry includes one transistor per column of bit-cells to couple a local bit-line to a global bit-line. In at least one embodiment, splitting circuitry 1121 includes n-type transistor MNc10 which is operable by control1 to couple local bit-line BLa0 to global bit-line BL0, where a gate terminal of n-type transistor MNc10 is coupled to control signal control1. In at least one embodiment, splitting circuitry 1121 includes n-type transistor MNc1(N−1) which is operable by control1 to couple local bit-line BLa(N−1) to global bit-line BL(N−1), where a gate terminal of n-type transistor MNc1(N−1) is coupled to control signal control1, and where 'N' is a number. In at least one embodiment, splitting circuitry 1121 includes n-type transistor MNc1(N) which is operable by control1 to couple local bit-line BLa(N) to global bit-line BLN, where a gate terminal of n-type transistor MNc1(N) is coupled to control signal control1, and where 'N' is a number.

In at least one embodiment, splitting circuitry 1131 includes n-type transistor MNc20 which is operable by control1 to couple local bit-line BLb0 to global bit-line BL0, where a gate terminal of n-type transistor MNc20 is coupled to control signal control1. In at least one embodiment, splitting circuitry 1131 includes n-type transistor MNc2(N−1) which is operable by control1 to couple local bit-line BLb(N−1) to global bit-line BL(N−1), where a gate terminal of n-type transistor MNc2(N−1) is coupled to control signal control1, and where 'N' is a number. In at least one embodiment, splitting circuitry 1131 includes n-type transistor MNc2(N) which is operable by control1 to couple local bit-line BLb(N) to global bit-line BLN, where a gate terminal of n-type transistor MNc2(N) is coupled to control signal control1, and where 'N' is a number. In at least one embodiment, each sub-array of memory array 1101 has its own local bit-line for column or row of memory bit-cells.

In at least one embodiment, Array A has local bit-lines BLa0, . . . BLa(N−1), and BLaN. In at least one embodiment, Array B has local bit-lines BLb0, . . . BLb(N–1), and BLbN. In at least one embodiment, global bit-lines BL0, . . . BL(N–1), and BLN are coupled to local bit-lines by splitting circuitry 1121 and 1131. In at least one embodiment, local bit-lines of one of sub-arrays Array A or Array B are coupled to global bit-lines BL0, . . . BL(N–1), and BLN. In at least one embodiment, parasitic capacitance on global bit-lines BL0, . . . BL(N–1), and BLN is reduced by splitting circuitry that decouples unselected local bit-lines from global bit-lines. In at least one embodiment, by reducing parasitic capacitance on global bit-lines, polarization targets for non-linear polar material are reduced, which in turn allows memory 1100 on lower power supply (e.g., less than 1V).

Figure 12:
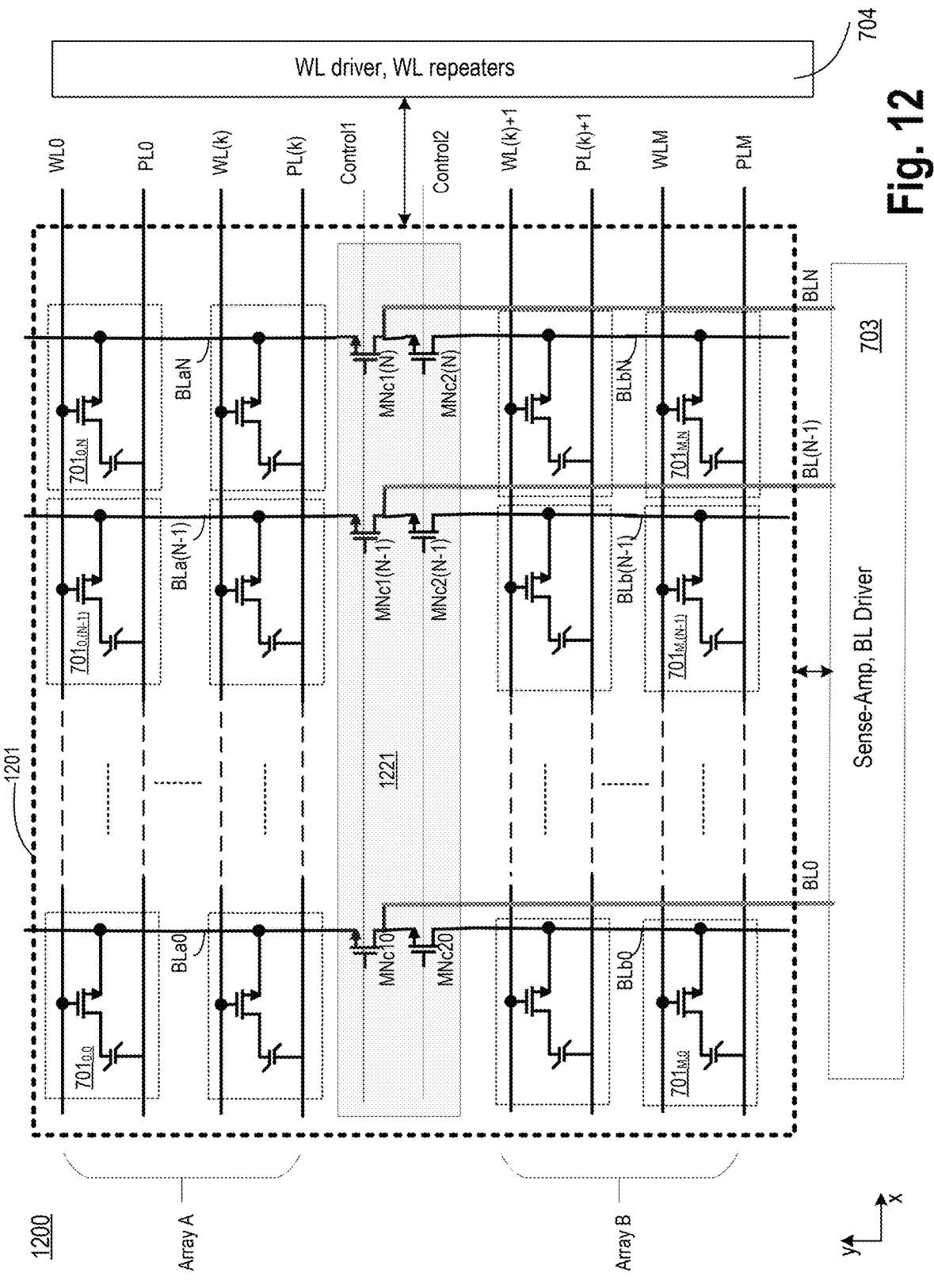
FIG. 12 illustrates a memory with circuitry with dual devices to divide memory into two arrays to reduce polarization targets for the memory bit-cells, where PL is parallel to WL, in accordance with at least one embodiment.

FIG. 12 illustrates memory system 1200 with circuitry with dual devices to divide memory into two arrays to reduce polarization targets for the memory bit-cells, where PL is parallel to WL, in accordance with at least one embodiment. Memory system 1200 includes an array of memory bit-cells 1201. Compared to memory 1100, here two splitting circuitries 1121 and 1131 are functionally merged into splitting circuitry 1221, which comprises two devices coupled in series, in accordance with some embodiments. In at least one embodiment, splitting circuitry 1221 is operable via control signals control1 and control2 to couple one of local bit-lines to a global bit-line which is being selected for writing or reading. In at least one embodiment, if no bit-cell is selected for reading or writing, splitting circuitry 1221 may not couple any local bit-line to a global bit-line.

In at least one embodiment, splitting circuitry 1221 includes n-type transistor MNc10 which is operable by control1 to couple local bit-line BLa0 to global bit-line BL0, where a gate terminal of n-type transistor MNc10 is coupled to control signal control1. In at least one embodiment, splitting circuitry 1221 includes n-type transistor MNc1(N–1) which is operable by control1 to couple local bit-line BLa(N–1) to global bit-line BL(N–1), where a gate terminal of n-type transistor MNc1(N–1) is coupled to control signal control1, and where 'N' is a number. In at least one embodiment, splitting circuitry 1221 includes n-type transistor MNc1(N) which is operable by control1 to couple local bit-line BLa(N) to global bit-line BLN, where a gate terminal of n-type transistor MNc1(N) is coupled to control signal control1, and where 'N' is a number.

In at least one embodiment, splitting circuitry 1221 includes n-type transistor MNc20 which is coupled in series with n-type transistor MNc10. In at least one embodiment, in-type transistor MNc20 is operable by control2 to couple local bit-line BLb0 to global bit-line BL0, where a gate terminal of n-type transistor MNc20 is coupled to control signal control2. In at least one embodiment, splitting circuitry 1221 includes n-type transistor MNc2(N–1) which is coupled in series with n-type transistor MNc1(N–1). In at least one embodiment, n-type transistor MNc2(N–1) is operable by control2 to couple local bit-line BLb(N–1) to global bit-line BL(N–1), where a gate terminal of n-type transistor MNc2(N–1) is coupled to control signal control2, and where 'N' is a number. In at least one embodiment, splitting circuitry 1221 includes n-type transistor MNc2(N) which is coupled to n-type transistor MNc1(N). In at least one embodiment, n-type transistor MNc1(N) is operable by control2 to couple local bit-line BLb(N) to global bit-line BLN, where a gate terminal of n-type transistor MNc2(N) is coupled to control signal control2, and where 'N' is a number.

In at least one embodiment, Array A has local bit-lines BLa0, . . . BLa(N–1), and BLaN. In at least one embodiment, Array B has local bit-lines BLb0, . . . BLb(N–1), and BLbN. In at least one embodiment, global bit-lines BL0, . . . BL(N–1), and BLN are coupled to local bit-lines by splitting circuitry 1221. In at least one embodiment, local bit-lines of one of sub-arrays Array A or Array B are coupled to global bit-lines BL0, . . . BL(N–1), and BLN. In at least one embodiment, parasitic capacitance on global bit-lines BL0, . . . BL(N–1), and BLN is reduced by splitting circuitry 1221 that decouples unselected local bit-lines from global bit-lines. In at least one embodiment, by reducing parasitic capacitance on global bit-lines, polarization targets for non-linear polar material are reduced, which in turn allows memory system 1200 to operate on lower power supply (e.g., less than 1V).

Figure 13:
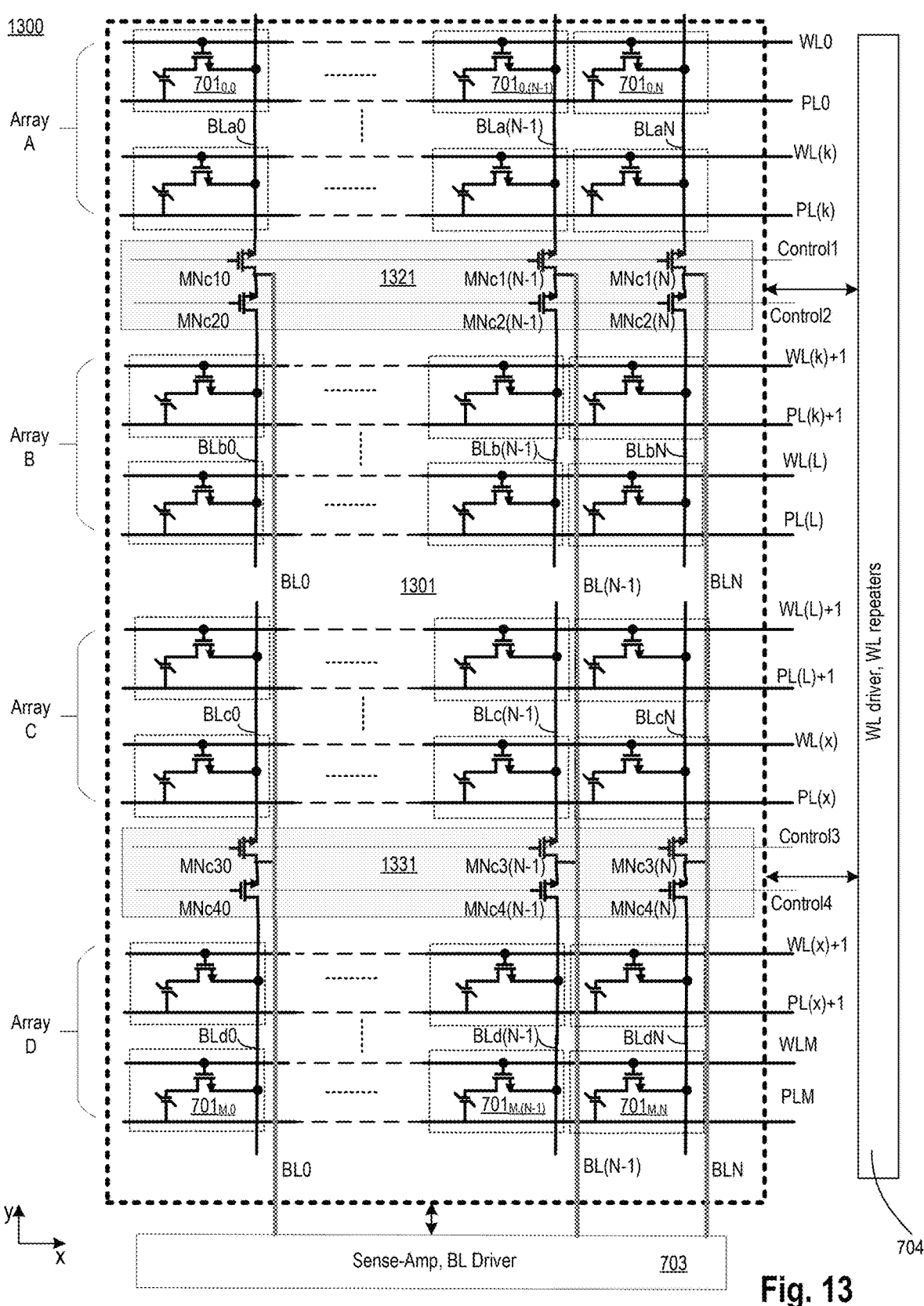
FIG. 13 illustrates a memory with multiple circuitries with dual devices to divide memory into multiple arrays to reduce polarization targets for the memory bit-cells, where PL is parallel to WL, in accordance with at least one embodiment.

FIG. 13 illustrates memory system 1300 with multiple circuitries with dual devices to divide memory into multiple arrays to reduce polarization targets for the memory bit-cells, where PL is parallel to WL, in accordance with at least one embodiment. Memory system 1300 includes memory 1301 which includes an array of bit-cells. Memory system 1300 is similar to memory system 1200 but with more splitting circuitries and more memory sub-arrays.

In at least one embodiment, splitting circuitry 1321 is operable via control signals control1 and control2 to couple one of local bit-lines to a global bit-line which is being selected for writing or reading. In at least one embodiment, splitting circuitry 1331 is operable via control signals control3 and control4 to couple one of local bit-lines to a global bit-line which is being selected for writing or reading. In at least one embodiment, if no bit-cell is selected for reading or writing, splitting circuitry 1331 may not couple any local bit-line to a global bit-line.

In at least one embodiment, splitting circuitry 1321 includes n-type transistor MNc10 which is operable by control1 to couple local bit-line BLa0 of Array A to global bit-line BL0, where a gate terminal of n-type transistor MNc10 is coupled to control signal control1. In at least one embodiment, splitting circuitry 1321 includes n-type transistor MNc1(N–1) which is operable by control1 to couple local bit-line BLa(N–1) of Array A to global bit-line BL(N–1), where a gate terminal of n-type transistor MNc1(N–1) is coupled to control signal control1, and where 'N' is a number. In at least one embodiment, splitting circuitry 1321 includes n-type transistor MNc1(N) which is operable by control1 to couple local bit-line BLa(N) of Array A to global bit-line BLN, where a gate terminal of n-type transistor MNc1(N) is coupled to control signal control1, and where 'N' is a number.

In at least one embodiment, splitting circuitry 1321 includes n-type transistor MNc20 which is coupled in series with n-type transistor MNc10. In at least one embodiment, in-type transistor MNc20 is operable by control2 to couple local bit-line BLb0 of Array B to global bit-line BL0, where a gate terminal of n-type transistor MNc20 is coupled to control signal control2. In at least one embodiment, splitting circuitry 1321 includes n-type transistor MNc2(N–1) which is coupled in series with n-type transistor MNc1(N–1). In at least one embodiment, n-type transistor MNc2(N–1) is operable by control2 to couple local bit-line BLb(N–1) of Array B to global bit-line BL(N–1), where a gate terminal of n-type transistor MNc2(N–1) is coupled to control signal control2, and where 'N' is a number. In at least one embodiment, splitting circuitry 1321 includes n-type transistor MNc2(N) which is coupled to n-type transistor MNc1(N). In at least one embodiment, n-type transistor MNc1(N) is operable by control2 to couple local bit-line BLb(N) of Array B to global bit-line BLN, where a gate terminal of n-type transistor MNc2(N) is coupled to control signal control2, and where 'N' is a number.

In at least one embodiment, splitting circuitry 1331 includes n-type transistor MNc30 which is operable by control3 to couple local bit-line BLc0 of Array C to global bit-line BL0, where a gate terminal of n-type transistor MNc30 is coupled to control signal control3. In at least one embodiment, splitting circuitry 1331 includes n-type transistor MNc3(N−1) which is operable by control3 to couple local bit-line BLc(N−1) of Array C to global bit-line BL(N−1), where a gate terminal of n-type transistor MNc3(N−1) is coupled to control signal control3, and where 'N' is a number. In at least one embodiment, splitting circuitry 1331 includes n-type transistor MNc3(N) which is operable by control3 to couple local bit-line BLc(N) of Array C to global bit-line BLN, where a gate terminal of n-type transistor MNc3(N) is coupled to control signal control3, and where 'N' is a number.

In at least one embodiment, splitting circuitry 1331 includes n-type transistor MNc40 which is coupled in series with n-type transistor MNc30. In at least one embodiment, in-type transistor MNc20 is operable by control4 to couple local bit-line BLd0 of Array D to global bit-line BL0, where a gate terminal of n-type transistor MNd20 is coupled to control signal control4. In at least one embodiment, splitting circuitry 1331 includes n-type transistor MNc4(N−1) which is coupled in series with n-type transistor MNc3(N−1). In at least one embodiment, n-type transistor MNc4(N−1) is operable by control4 to couple local bit-line BLd(N−1) of Array D to global bit-line BL(N−1), where a gate terminal of n-type transistor MNc4(N−1) is coupled to control signal control2, and where 'N' is a number. In at least one embodiment, splitting circuitry 1331 includes n-type transistor MNc4(N) which is coupled to n-type transistor MNc3(N). In at least one embodiment, n-type transistor MNc4(N) is operable by control4 to couple local bit-line BLb(N) of Array D to global bit-line BLN, where a gate terminal of n-type transistor MNc4(N) is coupled to control signal control4, and where 'N' is a number.

In at least one embodiment, Array A has local bit-lines BLa0, . . . BLa(N−1), and BLaN. In at least one embodiment, Array B has local bit-lines BLb0, . . . BLb(N−1), and BLbN. In at least one embodiment, Array C has local bit-lines BLc0, . . . BLc(N−1), and BLcN. In at least one embodiment, Array D has local bit-lines BLd0, . . . BLd(N−1), and BLdN. In at least one embodiment, global bit-lines BL0, . . . BL(N−1), and BLN are coupled to local bit-lines by splitting circuitries 1321 and 1322. In at least one embodiment, local bit-lines of one of sub-arrays Array A, Array B, Array C, or Array D are coupled to global bit-lines BL0, . . . BL(N−1), and BLN. In at least one embodiment, parasitic capacitance on global bit-lines BL0, . . . BL(N−1), and BLN is reduced by splitting circuitries 1321 and 1322 that decouples unselected local bit-lines from global bit-lines. In at least one embodiment, by reducing parasitic capacitance on global bit-lines, polarization targets for non-linear polar material are reduced, which in turn allows memory system 1300 to operate on lower power supply (e.g., less than 1V).

Figure 14A:
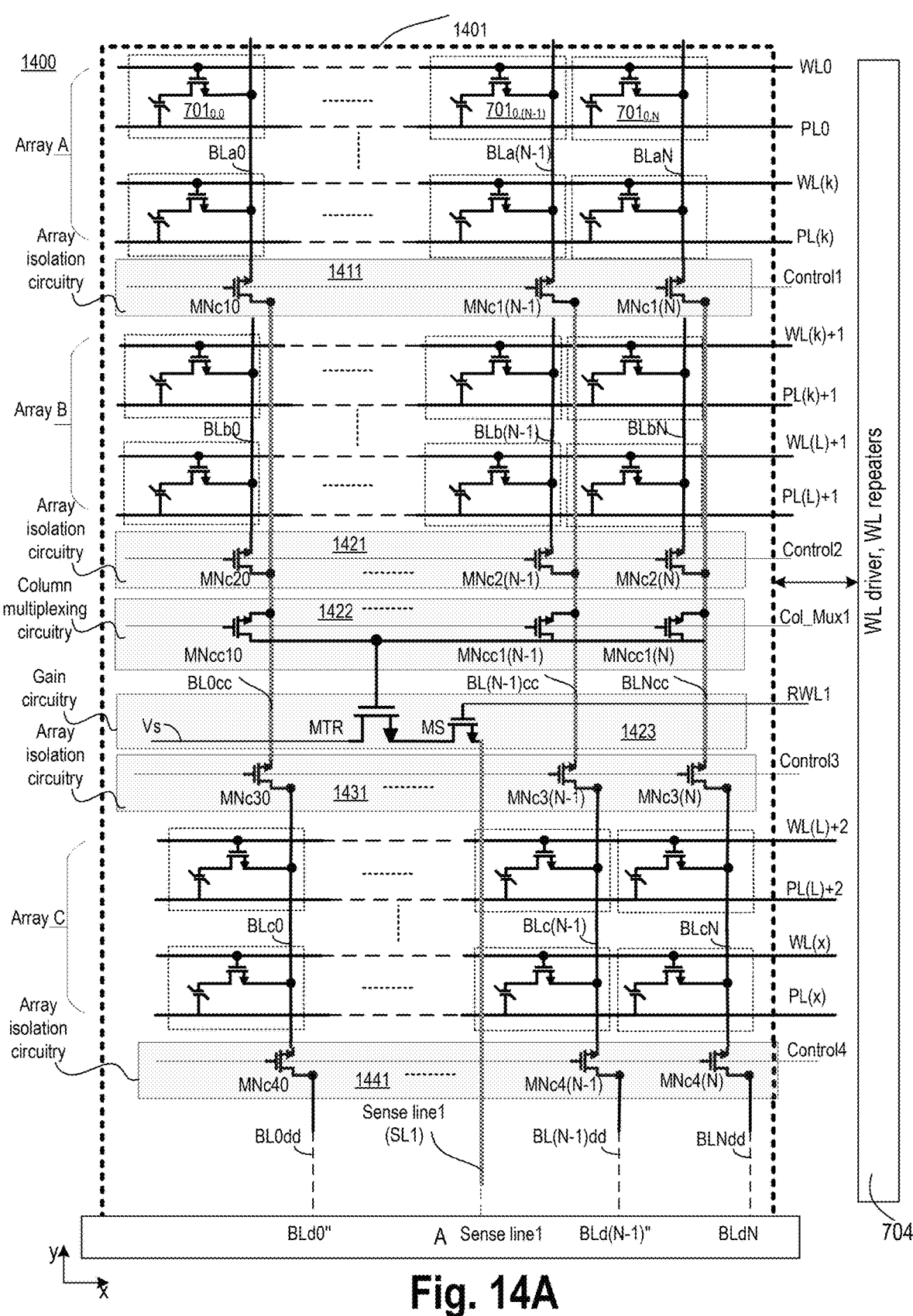
FIGS. 14A-B illustrate a memory with multiple circuitries with devices to divide memory into multiple arrays, where the memory includes column multiplexing and gain transistor, where PL is parallel to WL, in accordance with at least one embodiment.
Figure 14B:
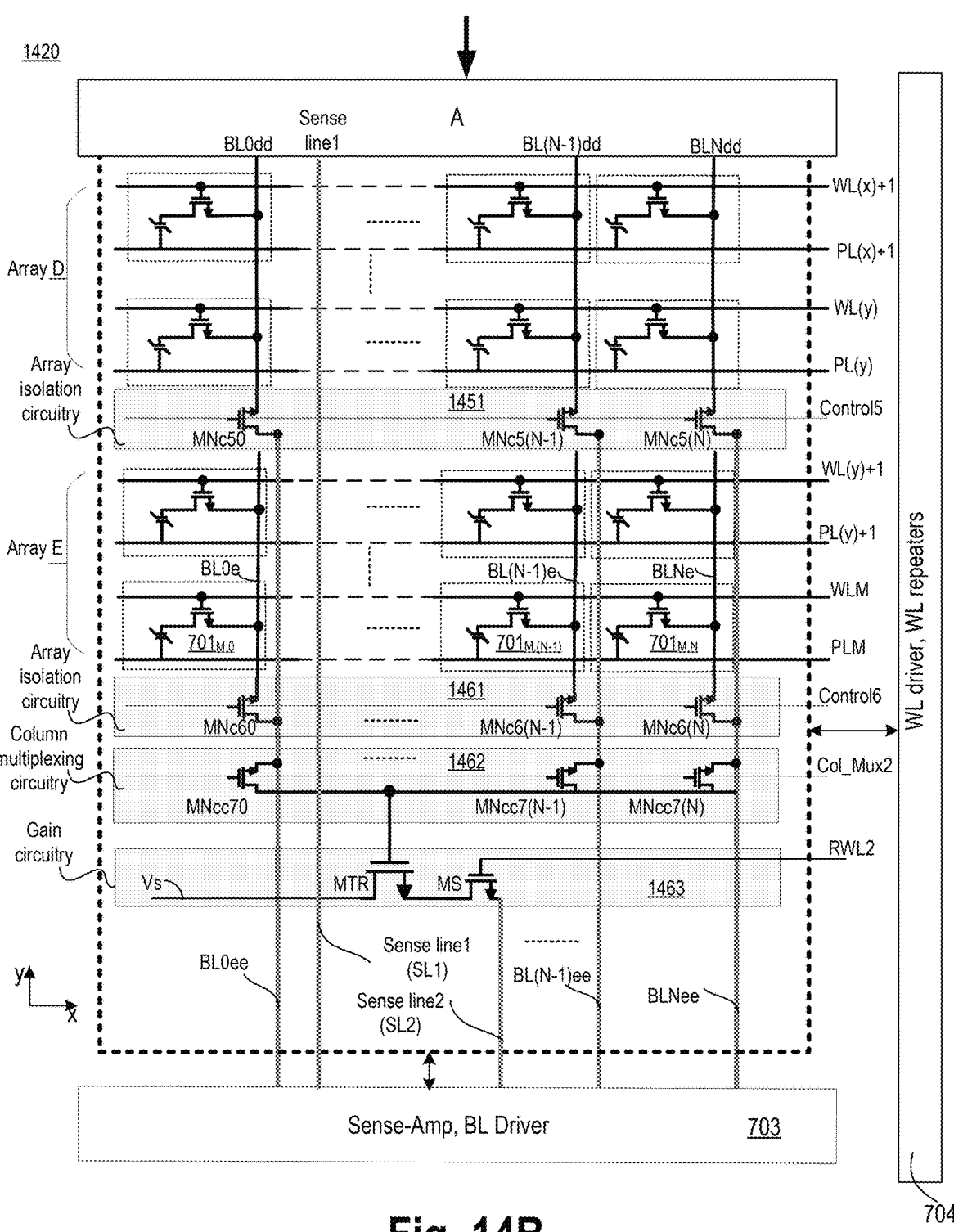

FIGS. 14A-B illustrate memory 1400 and 1420, respectively, with multiple circuitries with devices to divide memory into multiple arrays, where the memory includes column multiplexing and gain transistor, where PL is parallel to WL, in accordance with at least one embodiment.

In at least one embodiment, memory array 1401 is split into Array A, Array B, Array C, Array D, and Array E by first splitting or array isolation circuitries 1411, 1421, 1431, 1451, and 1461. In at least one embodiment, any number of splitting or array isolation circuitries may be used to split memory array 1401 into any number of sub arrays to reduce capacitance on global bit-lines. In at least one embodiment, a row of transistors in a splitting circuitry is controlled by a control signal. In at least one embodiment, column multiplexing circuitries such as column multiplexing circuitries 1422 and 1462 are introduced to select global bit-lines associated with a sub-array or a set of sub-arrays. In at least one embodiment, signal on selected global bit-line is amplified by a gain transistor stage such as gain circuitries 1423 and 1463. In at least one embodiment, an individual gain transistor stage comprises a gain transistor MTR and a select transistor MS. In at least one embodiment, gain transistor MTR has a gate terminal which is coupled to an output of column multiplexing circuitry such as column multiplexing circuitries 1422 and 1462. In at least one embodiment, gain transistor MTR is coupled to a reference Vs, which may be ground, power supply Vdd, a voltage between ground and power supply Vdd. In at least one embodiment, gain transistor MTR is coupled in series with select transistor MS, where gate terminal of select transistor MS is coupled to read word-line RWL such as RWL1 and RWL2. In at least one embodiment, a source or drain terminal of select transistor MS provides a sense line (e.g., sense line1 (SL1) and sense-line2 (SL2) which is coupled to a sense amplifier (sense-amp). In at least one embodiment, size (e.g., width and/or length) of gain transistor MTR is larger than select transistor MS.

In at least one embodiment, array isolation circuitries include one transistor per column of bit-cells in a memory sub-array to couple a local bit-line of memory sub-array to a global bit-line. In at least one embodiment, splitting or array isolation circuitry 1411 includes n-type transistor MNc10 which is operable by control1 to couple local bit-line BLa0 of Array A to first global bit-line BL0cc, where a gate terminal of n-type transistor MNc10 is coupled to control signal control1. In at least one embodiment, splitting circuitry 1411 includes n-type transistor MNc1(N−1) which is operable by control1 to couple local bit-line BLa(N−1) of Array A to first global bit-line BL(N−1)cc, where a gate terminal of n-type transistor MNc1(N−1) is coupled to control signal control1, and where 'N' is a number. In at least one embodiment, splitting circuitry 1411 includes n-type transistor MNc1(N) which is operable by control1 to couple local bit-line BLa(N) of Array A to first global bit-line BLNcc, where a gate terminal of n-type transistor MNc1(N) is coupled to control signal control1, and where 'N' is a number.

In at least one embodiment, splitting or array isolation circuitry 1421 includes n-type transistor MNc20 which is operable by control2 to couple local bit-line BLb0 of Array B to first global bit-line BL0cc, where a gate terminal of n-type transistor MNc20 is coupled to control signal control2. In at least one embodiment, splitting circuitry 1421 includes n-type transistor MNc2(N−1) which is operable by control2 to couple local bit-line BLb(N−1) of Array B to first global bit-line BL(N−1)cc, where a gate terminal of n-type transistor MNc2(N−1) is coupled to control signal control2, and where 'N' is a number. In at least one embodiment, splitting circuitry 1421 includes n-type transistor MNc2(N) which is operable by control2 to couple local bit-line BLb(N) of Array B to first global bit-line BLNcc, where a gate terminal of n-type transistor MNc2(N) is coupled to control signal control2, and where 'N' is a number.

In at least one embodiment, first global bit-lines (e.g., BL0cc, . . . BL(N−1)cc, and BLNcc) are coupled to first column multiplexing circuitry 1422 and array isolation circuitry 1431. In at least one embodiment, first column multiplexing circuitry 1422 comprises at least one transistor per row or column of memory array 1401. In at least one embodiment, first column multiplexing circuitry 1422 comprises n-type transistor MNcc10 which is operable by control signal Col_Mux1 to couple first global bit-line BL0cc to gate terminal of gain transistor MTR of gain circuitry 1423. In at least one embodiment, first column multiplexing circuitry 1422 comprises n-type transistor MNcc1(N−1) which is operable by control signal Col_Mux1 to couple first global bit-line BL(N−1)cc to gate terminal of gain transistor MTR of gain circuitry 1423. In at least one embodiment, first column multiplexing circuitry 1422 comprises n-type transistor MNcc1(N) which is operable by control signal Col_Mux1 to couple first global bit-line BL(N)cc to gate terminal of gain transistor MTR of gain circuitry 1423.

In at least one embodiment, gain circuitry 1423 comprises a gain transistor MTR and a select transistor MS. In at least one embodiment, gain transistor MTR has a gate terminal which is coupled to an output of column multiplexing circuitry 1422. In at least one embodiment, gain transistor MTR is coupled to a reference Vs, which may be ground, power supply Vdd, a voltage between ground and power supply Vdd. In at least one embodiment, gain transistor MTR is coupled in series with select transistor MS, where gate terminal of select transistor MS is coupled to read word-line RWL1. In at least one embodiment, a source or drain terminal of select transistor MS provides sense-line1 (SL1) which is coupled to a sense amplifier (sense-amp). In at least one embodiment, size (e.g., width and/or length) of gain transistor MTR is larger than select transistor MS.

In at least one embodiment, array isolation circuitry 1431 couples first global bit-lines (e.g., BL0cc . . . BL(N−1)cc, and BLNcc) to local bit-lines (e.g., BLc0, . . . BLc(N−1), BLcN) of another memory sub-array, here Array C. In at least one embodiment, array isolation circuitry 1431 comprises n-type transistor MNc30 which couples first global bit-line BL0cc with local bit-line BLc0 of Array C. In at least one embodiment, array isolation circuitry 1431 comprises n-type transistor MNc3(N−1) which couples first global bit-line BL(N−1)cc with local bit-line BLc(N−1) of Array C. In at least one embodiment, array isolation circuitry 1431 comprises n-type transistor MNc3(N) which couples first global bit-line BLNcc with local bit-line BLcN of Array C. In at least one embodiment, transistors MNc30, . . . MNc3(N−1), and MNc3(N) of array isolation circuitry 1431 are controlled by control3.

In at least one embodiment, splitting or array isolation circuitry 1441 includes n-type transistor MNc40 which is operable by control4 to couple local bit-line BLc0 of Array C to local bit-line BLOdd, where a gate terminal of n-type transistor MNc40 is coupled to control signal control4. In at least one embodiment, splitting circuitry 1441 includes n-type transistor MNc4(N−1) which is operable by control4 to couple local bit-line BLc(N−1) of Array C to local bit-line BL(N−1)dd, where a gate terminal of n-type transistor MNc4(N−1) is coupled to control signal control4, and where 'N' is a number. In at least one embodiment, splitting circuitry 1441 includes n-type transistor MNc4(N) which is operable by control4 to couple local bit-line BLc(N) of Array C to local bit-line BLNdd, where a gate terminal of n-type transistor MNc4(N) is coupled to control signal control4, and where 'N' is a number.

In at least one embodiment, splitting or array isolation circuitry 1451 includes n-type transistor MNc50 which is operable by control5 to couple local bit-line BLOdd of Array D to second global bit-line BLOee, where a gate terminal of n-type transistor MNc50 is coupled to control signal control5. In at least one embodiment, splitting circuitry 1451 includes n-type transistor MNc5(N−1) which is operable by control5 to couple local bit-line BL(N−1)dd of Array D to second global bit-line BL(N−1)ee, where a gate terminal of n-type transistor MNc5(N−1) is coupled to control signal control5, and where 'N' is a number. In at least one embodiment, splitting circuitry 1451 includes n-type transistor MNc5(N) which is operable by control5 to couple local bit-line BLd(N) of Array D to second global bit-line BLNee, where a gate terminal of n-type transistor MNc5(N) is coupled to control signal control5, and where 'N' is a number.

In at least one embodiment, splitting or array isolation circuitry 1461 includes n-type transistor MNc60 which is operable by control6 to couple local bit-line BLOe of Array E to second global bit-line BLOee, where a gate terminal of n-type transistor MNc60 is coupled to control signal control6. In at least one embodiment, splitting circuitry 1461 includes n-type transistor MNc6(N−1) which is operable by control6 to couple local bit-line BL(N−1)e of Array E to second global bit-line BL(N−1)ee, where a gate terminal of n-type transistor MNc6(N−1) is coupled to control signal control6, and where 'N' is a number. In at least one embodiment, splitting circuitry 1461 includes n-type transistor MNc6(N) which is operable by control6 to couple local bit-line BLe(N) of Array E to second global bit-line BLNee, where a gate terminal of n-type transistor MNc6(N) is coupled to control signal control6, and where 'N' is a number.

In at least one embodiment, second global bit-lines (e.g., BL0ee, . . . BL(N−1)ee, and BLNee) are coupled to second column multiplexing circuitry 1462 and array isolation circuitry 1461. In at least one embodiment, second column multiplexing circuitry 1462 comprises at least one transistor per row or column of memory array 1401. In at least one embodiment, second column multiplexing circuitry 1462 comprises n-type transistor MNcc70 which is operable by control signal Col_Mux2 to couple second global bit-line BLOee to gate terminal of gain transistor MTR of gain circuitry 1463. In at least one embodiment, second column multiplexing circuitry 1462 comprises n-type transistor MNcc7(N−1) which is operable by control signal Col_Mux2 to couple second global bit-line BL(N−1)ee to gate terminal of gain transistor MTR of gain circuitry 1463. In at least one embodiment, second column multiplexing circuitry 1462 comprises n-type transistor MNcc7(N) which is operable by control signal Col_Mux2 to couple first global bit-line BL(N)ee to gate terminal of gain transistor MTR of gain circuitry 1463.

In at least one embodiment, gain circuitry 1463 comprises a gain transistor MTR and a select transistor MS. In at least one embodiment, gain transistor MTR has a gate terminal which is coupled to an output of column multiplexing circuitry 1462. In at least one embodiment, gain transistor MTR is coupled to a reference Vs, which may be ground, power supply Vdd, a voltage between ground and power supply Vdd. In at least one embodiment, gain transistor MTR is coupled in series with select transistor MS, where gate terminal of select transistor MS is coupled to read word-line RWL2. In at least one embodiment, a source or drain terminal of select transistor MS provides sense-line2 (SL2) which is coupled to a sense amplifier (sense-amp). In at least one embodiment, size (e.g., width and/or length) of gain transistor MTR is larger than select transistor MS.

In at least one embodiment, Array A has local bit-lines BLa0, . . . BLa(N−1), and BLaN. In at least one embodiment, Array B has local bit-lines BLb0, . . . BLb(N−1), and BLbN. In at least one embodiment, Array C has local bit-lines BLc0, . . . BLc(N−1), and BLcN. In at least one embodiment, Array D has local bit-lines BLd0, . . . BLd(N−1), and BLdN. In at least one embodiment, Array E has local bit-lines BLeO, . . . BLe(N−1), and BLeN. In at least one embodiment, first global bit-lines BL0cc, . . . BL(N−1)cc, and BLNcc are coupled to local bit-lines by splitting or isolation circuitries 1411 and 1421. In at least one embodiment, first global bit-lines BLOee, . . . BL(N−1)ee, and BLNee are coupled to local bit-lines by splitting or isolation circuitries 1431 and 1451. In at least one embodiment, column multiplexing circuitries in conjunction with gain circuitries provide sense lines SL1 and SL1 for sense amplifier. In at least one embodiment, splitting or isolation circuitries and column multiplexing circuitries along with gain circuitries provide global bit-lines and sense lines that have much less parasitic capacitance than a memory architecture where such splitting or isolation circuitries and column multiplexing circuitries are not used. In at least one embodiment, by reducing parasitic capacitance on global bit-lines and/or sense lines, polarization targets for non-linear polar material are reduced, which in turn allows memory 1400 to operate on lower power supply (e.g., less than 1V).

Figure 15:
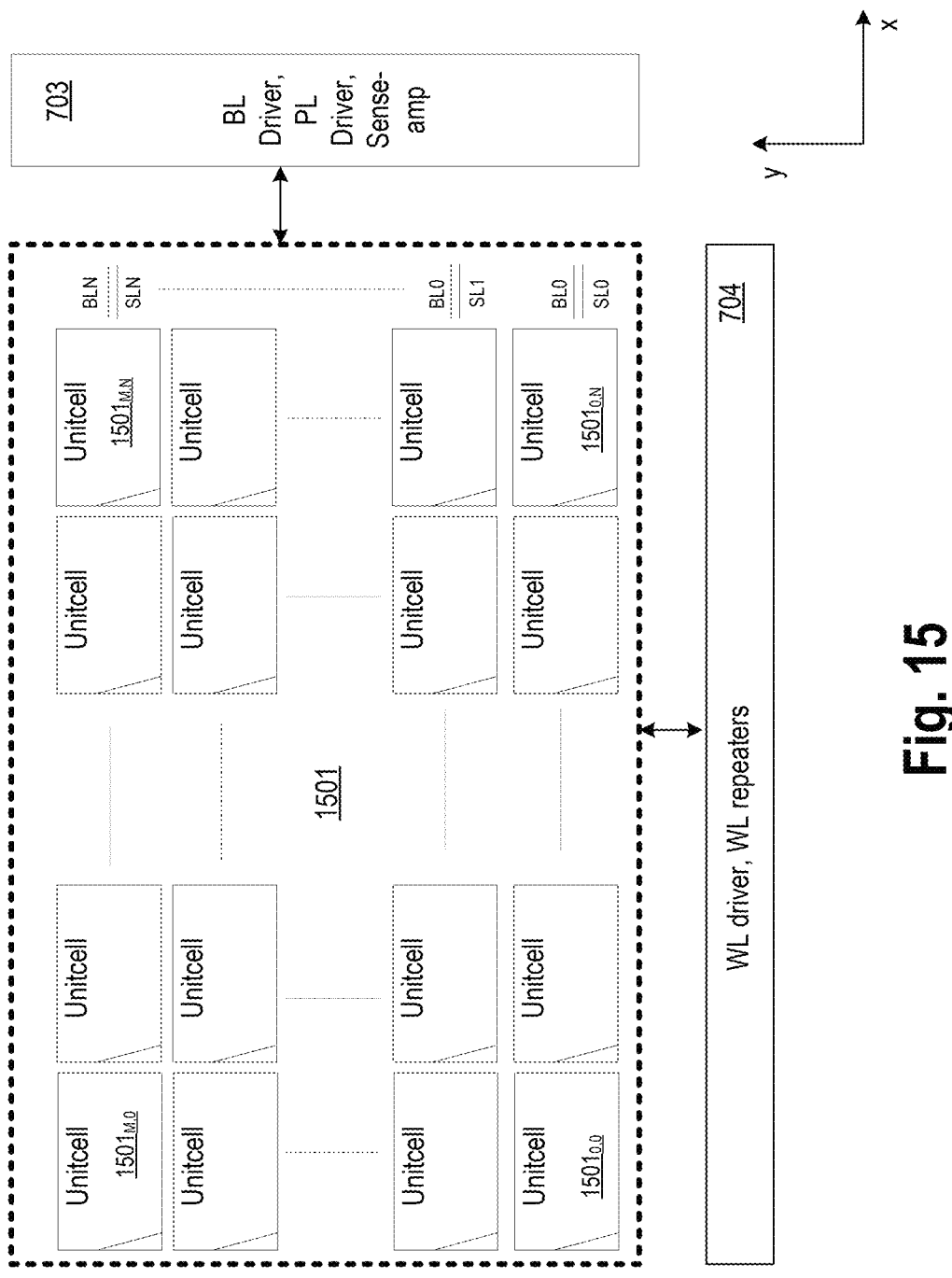
FIG. 15 illustrates a memory architecture with a plurality of homogenous unit cells, where an individual homogenous unit cell may include a plurality of 1T1C memory bit-cells, in accordance with at least one embodiment.

FIG. 15 illustrates a memory architecture 1500 with a plurality of homogenous unit cells, where an individual homogenous unit cell may include a plurality of 1T1C memory bit-cells, in accordance with at least one embodiment. In at least one embodiment, memory architecture 1500 comprises memory array 1501, logic circuitry 703 for BL driver, PL driver, and sense amplifier, and logic circuitry 704 for WL driver and WL repeaters.

In at least one embodiment, plate-lines PL0, PL1, through PLN are parallel to bit-lines BL0, BL1, through BLN, while word-lines WL0, WL1, through WLM are orthogonal to plate-lines and bit-lines, where 'N' is a number greater than 1 and 'M' is greater than 1. In at least one embodiment, sense lines SL0, SL1, through SLN are parallel to bit-lines BL0, BL1, through BLN. In at least one embodiment, individual memory unit-cells in memory array 1501 are organized in rows and columns. For example, memory unit-cells $1501_{0,0}$ through $1501_{M,N}$ are organized in an array. In at least one embodiment, PL is parallel to WL and orthogonal to BL and sense line (when a gain transistor is used). In at least one embodiment, memory array 1501 comprises a plurality of unit cells organized as rows and columns including unit cells $1501_{0,0}$ through $1501_{M,N}$. In at least one embodiment, an individual memory unit-cell (e.g., $1501_{0,0}$) comprises a plurality of 1T1C memory bit-cells coupled to a local bit-line which in turn is coupled to a global bit-line and/or a gain circuitry to reduce overall parasitic capacitance on selected global bit-line, which allows reducing in polarization target. In at least one embodiment, BL is parallel to PL and sense line (when a gain transistor is used). In at least one embodiment, unit cells are homogenous unit cells in that they comprise same memory architecture and circuit orientation, which is indicated by the right-angled triangle at the bottom left corner of unit-cells.

Figure 16:
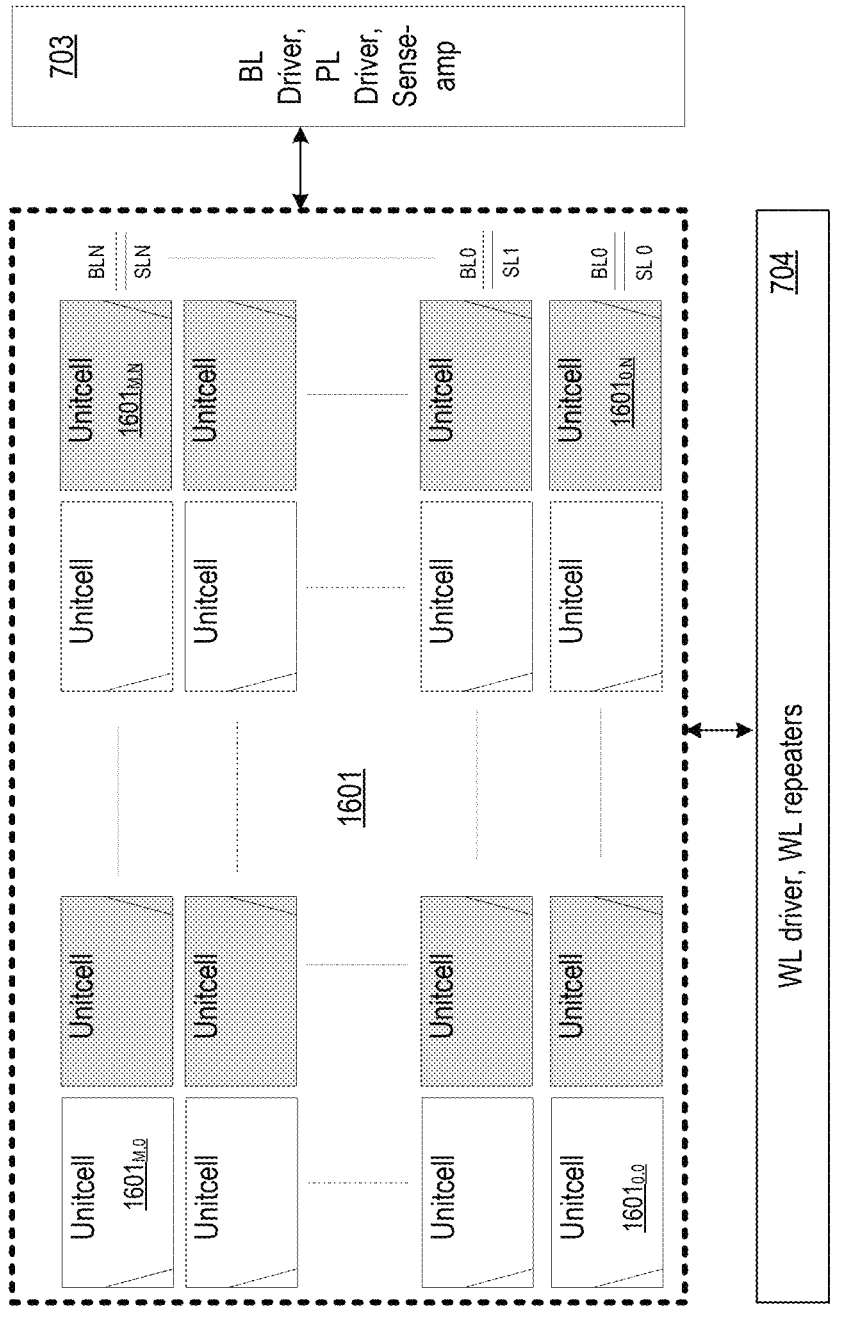
FIG. 16 illustrates a memory architecture with a plurality of first unit cells and a plurality of second unit cells, where an individual first unit cell is a flipped version of an individual second unit cell, wherein the first unit cell and second unit cell may include a plurality of 1T1C memory bit-cells, in accordance with at least one embodiment.

FIG. 16 illustrates memory architecture 1600 with a plurality of first unit cells and a plurality of second unit cells, where an individual first unit cell is a flipped version of an individual second unit cell, wherein the first unit cell and second unit cell may include a plurality of 1T1C memory bit-cells, in accordance with at least one embodiment. In at least one embodiment, memory architecture 1600 comprises memory array 1601, logic circuitry 703 for BL driver, PL driver, and sense amplifier, and logic circuitry 704 for WL driver and WL repeaters.

In at least one embodiment, plate-lines PL0, PL1, through PLN are parallel to bit-lines BL0, BL1, through BLN, while word-lines WL0, WL1, through WLM are orthogonal to plate-lines and bit-lines, where 'N' is a number greater than 1 and 'M' is greater than 1. In at least one embodiment, sense lines SL0, SL1, through SLN are parallel to bit-lines BL0, BL1, through BLN. In at least one embodiment, individual memory unit-cells in memory array 1601 are organized in rows and columns. For example, memory unit-cells $1601_{0,0}$ through $1601_{M,N}$ are organized in an array. In at least one embodiment, PL is parallel to WL and orthogonal to BL and sense line (when a gain transistor is used). In at least one embodiment, memory array 1601 comprises a plurality of unit cells organized as rows and columns including unit cells $1601_{0,0}$ through $1601_{M,N}$. In at least one embodiment, an individual memory unit-cell (e.g., $1601_{0,0}$) comprises a plurality of 1T1C memory bit-cells coupled to a local bit-line which in turn is coupled to a global bit-line and/or a gain circuitry to reduce overall parasitic capacitance on selected global bit-line, which allows reducing in polarization target. In at least one embodiment, BL is parallel to PL and sense line (when a gain transistor is used). In at least one embodiment, unit cells are heterogeneous unit cells. Here, heterogeneous cells refer to unit-cells that are not the same or identical. Differences in unit-cells may be differences in architecture and/or circuit orientation. Here, shaded unit-cells are indicated with a right-angled triangle at the lower right corner of unit cells. In some embodiments, alternating rows of unit-cells may be different unit-cells. In at least one embodiment, different unit-cells may be sprinkled throughout memory 1601.

Figure 17:
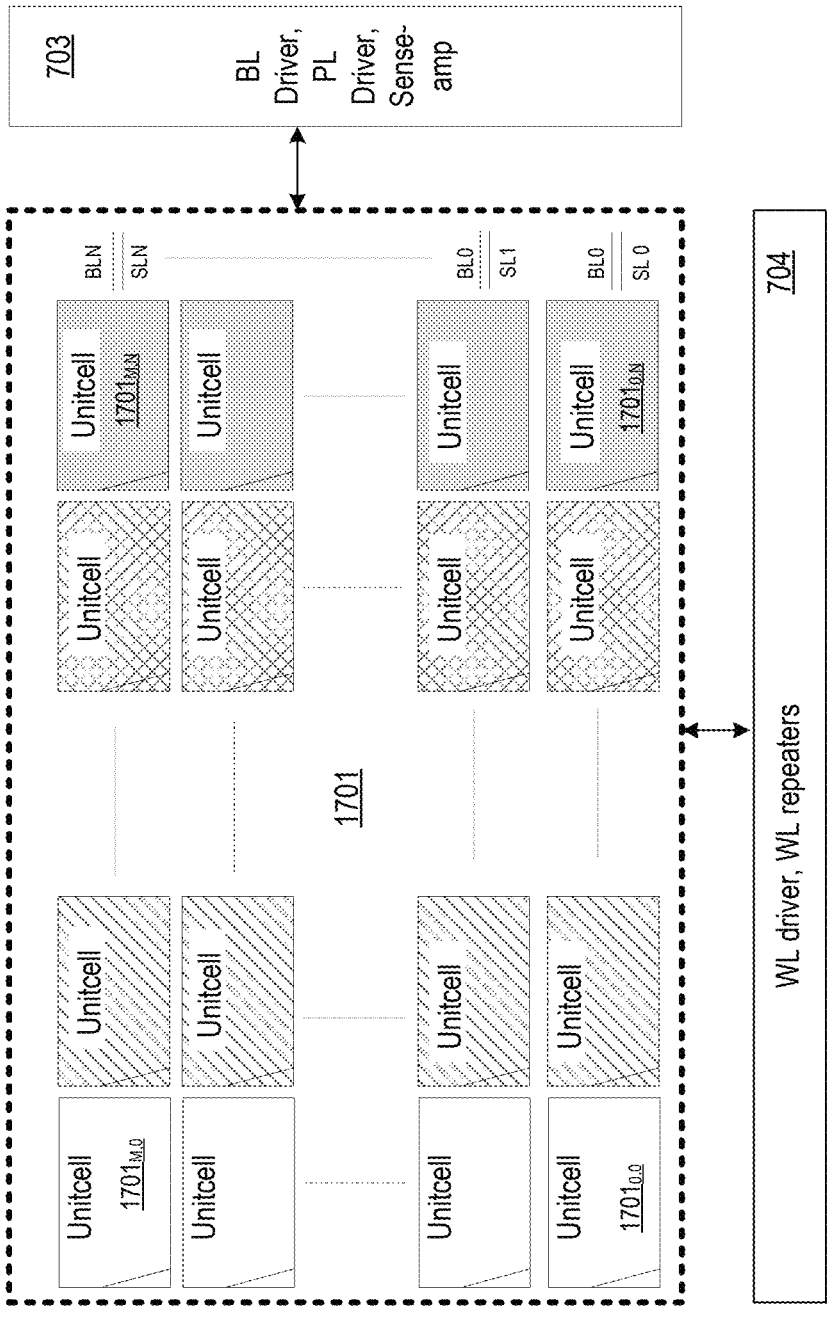
FIG. 17 illustrates a memory architecture with a plurality of heterogeneous unit cells, where an individual heterogeneous unit cell may include a plurality of 1T1C memory bit-cells, in accordance with at least one embodiment.

FIG. 17 illustrates memory architecture 1700 with a plurality of heterogeneous unit cells, where an individual heterogeneous unit cell may include a plurality of 1T1C memory bit-cells, in accordance with at least one embodiment. In at least one embodiment, memory architecture 1700 comprises memory array 1701, logic circuitry 703 for BL driver, PL driver, and sense amplifier, and logic circuitry 704 for WL driver and WL repeaters. In at least one embodiment, plate-lines PL0, PL1, through PLN are parallel to bit-lines BL0, BL1, through BLN, while word-lines WL0, WL1, through WLM are orthogonal to plate-lines and bit-lines, where 'N' is a number greater than 1 and 'M' is greater than 1. In at least one embodiment, sense lines SL0, SL1, through SLN are parallel to bit-lines BL0, BL1 through BLN. In at least one embodiment, individual memory unit-cells in memory array 1701 are organized in rows and columns. For example, memory unit-cells $1701_{0,0}$ through $1701_{M,N}$ are organized in an array. In at least one embodiment, PL is parallel to WL and orthogonal to BL and sense line (when a gain transistor is used). In at least one embodiment, memory array 1701 comprises a plurality of unit cells organized as rows and columns including unit cells $1701_{0,0}$ through $1701_{M,N}$. In at least one embodiment, an individual memory unit-cell (e.g., $1701_{0,0}$) comprises a plurality of 1T1C memory bit-cells coupled to a local bit-line which in turn is coupled to a global bit-line and/or a gain circuitry to reduce overall parasitic capacitance on selected global bit-line, which allows reducing in polarization target. In at least one embodiment, BL is parallel to PL and sense line (when a gain transistor is used). In at least one embodiment, unit cells are heterogeneous unit cells of different types. Compared to heterogeneous cells of FIG. 16, here, two or more different unit-cells are used. Differences in unit-cells may be differences in architecture and/or circuit orientation. Here, shaded unit-cells, non-shared cells, and patterned cells are three different types of unit cells. In at least one embodiment, as shown, all unit-cells have circuits with same orientation which is indicated by right-angled triangle at the lower left corners of unit cells. In some embodiments, alternating rows of unit-cells may be different unit-cells. In at least one embodiment, different unit-cells may be sprinkled throughout memory 1701. FIGS. 18-47 illustrates various types of unit-cells can be based for memory architectures of FIGS. 15-17, in accordance with at least one embodiment. Here, symbol '/' in figures next to signal names indicates that those interconnects or wires extend in and out of a page (e.g., WL0 through WLk,) while interconnects without symbol '/' (e.g., BL0, LBLx with symbol "—") extend orthogonal to those interconnects.

Figure 18:
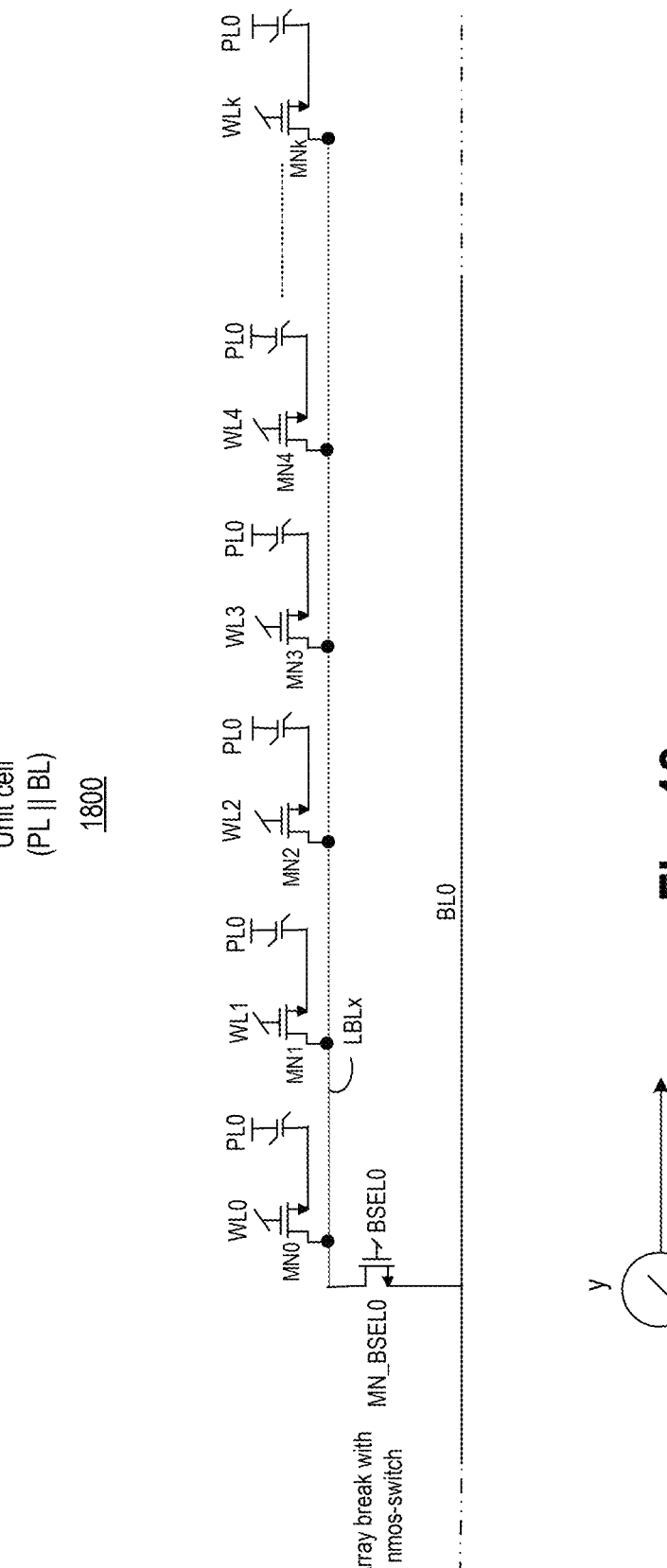
FIG. 18 illustrates a unit cell with a plurality of memory bit-cells coupled to a local bit-line which in turn is coupled to a global bit-line via an n-type switch transistor, where PL is parallel to BL, in accordance with at least one embodiment.

FIG. 18 illustrates unit cell 1800 with a plurality of memory bit-cells coupled to a local bit-line which in turn is coupled to a global bit-line via an n-type switch transistor, where PL is parallel to BL, in accordance with at least one embodiment. In at least one embodiment, an individual bit-cell comprises a 1T1C configuration with a transistor coupled to a capacitor, wherein a PL is coupled to the capacitor and WL is coupled to a gate of the transistor. In at least one embodiment, capacitor can be according in any capacitor of a capacitor according to any one of FIG. 2, FIG. 3A, FIG. 3B, FIGS. 4A-C, FIG. 5A, or FIG. 5B. In at least one embodiment, unit cell 1800 comprises a local bit-line LBLx coupled to a global bit-line BLx (e.g., BL0) via n-type select transistor MN_BSEL0. In at least one embodiment, n-type select transistor MN_BSEL0 is controllable by select signal BSEL0. In at least one embodiment, plurality of memory bit-cells includes 'k' number of 1T1C cells. In at least one embodiment, 'k' bit-cells includes bit-cell with n-type transistor MN0 controlled by word-line WL0, and associated coupled capacitor coupled to plate-line PL0, bit-cell with n-type transistor MN1 controlled by word-line WL1, and associated coupled capacitor coupled to plate-line PL0, bit-cells with n-type transistor MN2 controlled by word-line WL2, and associated coupled capacitor coupled to plate-line PL0, bit-cell with n-type transistor MN3 controlled by word-line WL3, and associated coupled capacitor coupled to plate-line PL0, bit-cell with n-type transistor MN4 controlled by word-line WL4, and associated coupled capacitor coupled to plate-line PL0, . . . and bit-cell with n-type transistor MNk controlled by word-line WLk, and associated coupled capacitor coupled to plate-line PL0.

In at least one embodiment, memory array can be isolated, split, or broken by select transistor MN_BSEL0. In at least one embodiment, by separating bit-line into local bit-line LBLx from global bit-line BLx (e.g., BL0), capacitance on global bit-line is reduced because bit-cell capacitances are not transferred from local bit-line to global bit-line. In at least one embodiment, polarization requirements or targets of capacitors of bit-cells are reduced because local bit-lines are introduced that are decoupled from global bit-lines. In at least one embodiment, bit-cells can have n-type transistors instead of n-type transistors. In at least one embodiment, select transistor MN_BSEL0 can be replaced with p-type transistors.

Figure 19:
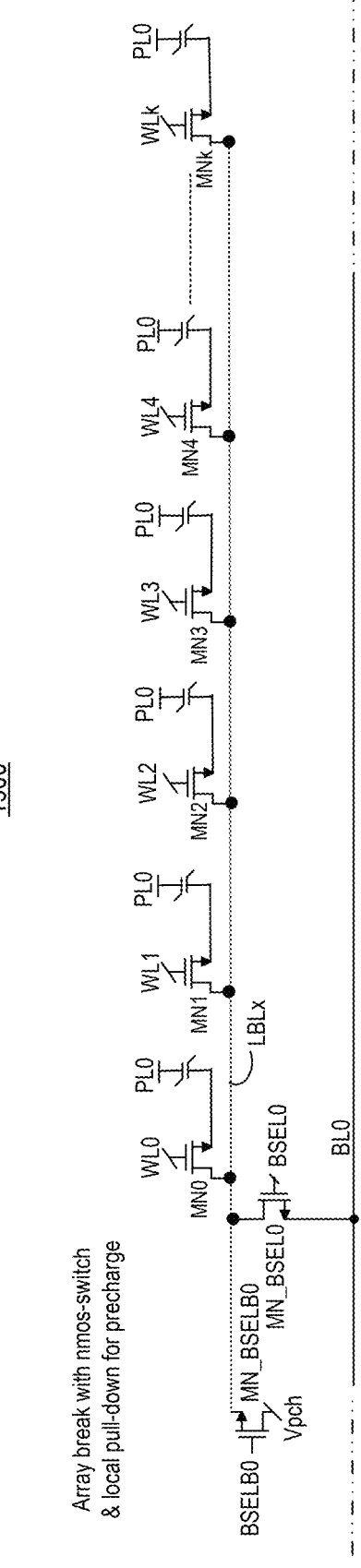
FIG. 19 illustrates a unit cell with a plurality of memory bit-cells coupled to a local bit-line which in turn is coupled to a global bit-line via an n-type switch transistor, where PL is parallel to BL, and where the local bit-line is pre-charged by a pre-charge transistor, in accordance with at least one embodiment.
Figure 19:
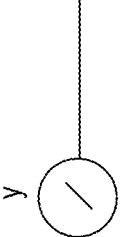

FIG. 19 illustrates unit cell 1900 with a plurality of memory bit-cells coupled to a local bit-line which in turn is coupled to a global bit-line via an n-type switch transistor, where PL is parallel to BL, and where the local bit-line is pre-charged by a pre-charge transistor, in accordance with at least one embodiment. Unit cell 1900 is similar to unit cell 1800 in feature and function. Here, r n-type pre-charge transistor MN_BSELB0 is coupled to local bit-line LBLx, in accordance with at least one embodiment. In at least one embodiment, n-type pre-charge transistor MN_BSELB0 is controllable by BSELB0, which is an inverse of BSEL0. In at least one embodiment, n-type pre-charge transistor MN_BSELB0 is also coupled to a pre-charge signal (e.g., a predetermined or programmable pre-charge voltage Vpch). In at least one embodiment, n-type pre-charge transistor MN_BSELB0 pre-charges local bit-line LBLx to a known voltage to avoid or mitigate leakage through capacitors of bit-cells coupled to LBLx. In at least one embodiment, n-type pre-charge transistor MN_BSELB0 pre-charges local bit-line LBLx when select transistor MN_BSEL0 is off (e.g., when LBLx is not being actively coupled to global bit-line BLx (e.g., BL0). In at least one embodiment, n-type pre-charge transistor can be replaced with a p-type transistor and polarity of its control signal can be modified for correct function.

Figure 20:
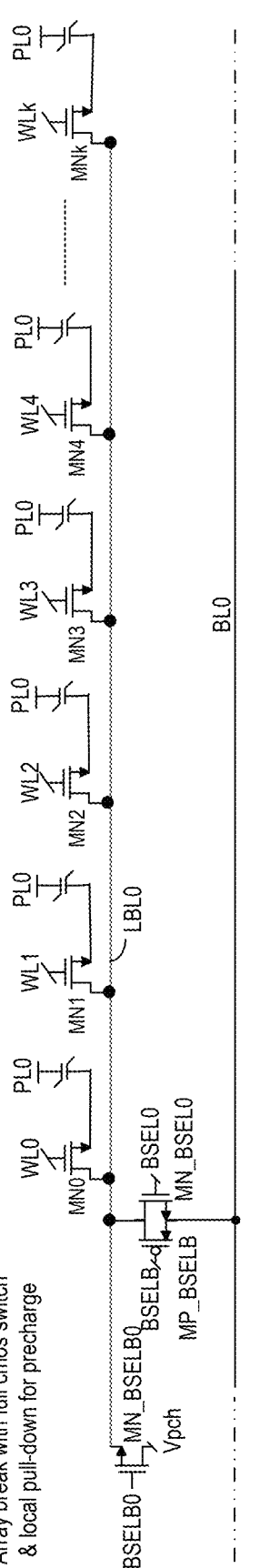
FIG. 20 illustrates a unit cell with a plurality of memory bit-cells coupled to a local bit-line which in turn is coupled to a global bit-line via a pass-gate transistor, where PL is parallel to BL, and where the local bit-line is pre-charged by a pre-charge transistor, in accordance with at least one embodiment.
Figure 20:
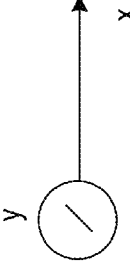

FIG. 20 illustrates unit cell 2000 with a plurality of memory bit-cells coupled to a local bit-line which in turn is coupled to a global bit-line via a pass-gate transistor, where PL is parallel to BL, and where the local bit-line is pre-charged by a pre-charge transistor, in accordance with at least one embodiment. Unit cell 2000 is similar to unit cell 1900 but n-type select transistor MN_BSELN is paired in parallel with p-type select transistor MP_BSELB to form a transition gate (e.g., a full CMOS switch). In at least one embodiment, p-type select transistor MP_BSELB is controllable by BSELB, which is opposite polarity to BSEL0. In at least one embodiment, transmission gate that couples local bit-line LBLx (e.g., LBLx) with global bit-line BLx (e.g., BL0) allows for full voltage transfer from local bit-line LBLx (e.g., LBLx) to global bit-line BLx (e.g., BL0).

Figure 21:
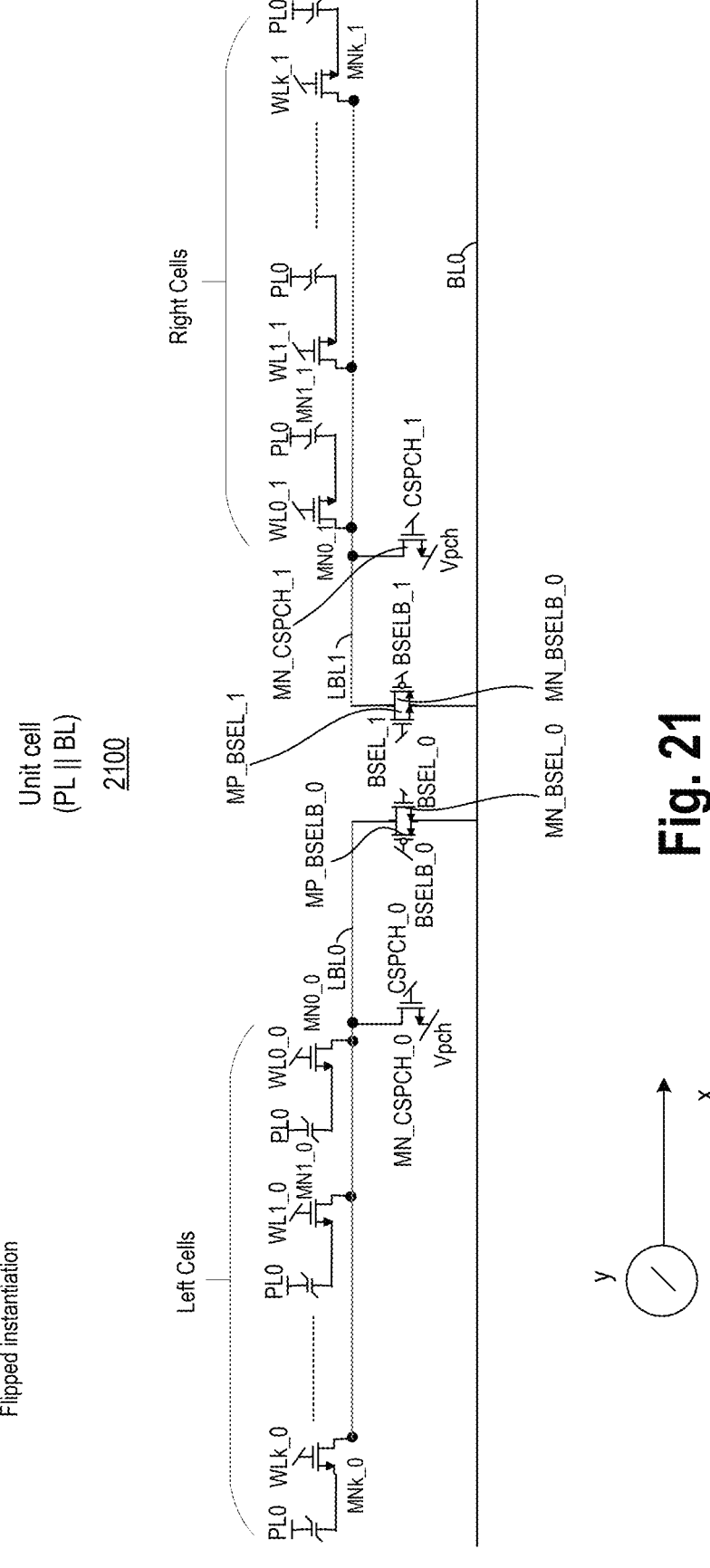
FIG. 21 illustrates a unit cell with two sets of plurality of memory bit-cells, where one set is a flipped version of another set, wherein an individual set of plurality of memory bit-cells has a local bit-line coupled to a global bit-line via pass-gate transistor, where PL is parallel to BL, and where the local-line line is pre-charged by a pre-charge transistor, in accordance with at least one embodiment.

FIG. 21 illustrates unit cell 2100 with two sets of plurality of memory bit-cells, where one set is a flipped version of another set, wherein an individual set of plurality of memory bit-cells has a local bit-line coupled to a global bit-line via pass-gate transistor, where PL is parallel to BL, and where the local-line line is pre-charged by a pre-charge transistor, in accordance with at least one embodiment. Unit cell 2100 is similar to unit cell 2000 but with two instances (e.g., left cells and right cells) of unit cell 2000 coupled to a global bit-line BLx (e.g., BL0), in accordance with at least one embodiment. In at least one embodiment, two instances of unit cell 2000 are mirror images of each other such that a first instance (e.g., left cells) is a horizontally flipped version of a second instance (e.g., right cells).

In at least one embodiment, both instances of plurality of memory bit-cells (e.g., left cells and right cells) are coupled to same plate-line (e.g., PL0), but different word-lines. In at least one embodiment, transistors MN0_0, MN1_0, . . . MNk_0 of bit-cells of left cells are coupled word-line WL0_0, WL1_0 . . . WLk_0, respectively. In at least one embodiment, transistors MN0_1, MN1_1 . . . MNk_1 of bit-cells of right cells are coupled word-line WL0_1, WL1_1, . . . WLk_1, respectively. In at least one embodiment, local bit-lines of one of left cells or right cells are coupled to a global bit-line via their respective select transmission gates.

In at least one embodiment, local bit-line LBL0 of left cells is coupled to global bit-line BL0 via transmission gates comprising p-type transistor MP_BSELB_0 and n-type transistor MN_BSEL_0. In at least one embodiment, p-type transistor MP_BSELB_0 is controllable by BSELB_0. In at least one embodiment, n-type transistor MN_BSELB_0 is controllable by BSEL_0, which is an inverse of BSELB_0. In at least one embodiment, local bit-line LBL1 of left cells is coupled to global bit-line BL0 via transmission gates comprising p-type transistor MP_BSELB_1 and n-type transistor MN_BSEL_1. In at least one embodiment, p-type transistor MP_BSELB_1 is controllable by BSELB_1. In at least one embodiment, n-type transistor MN_BSELB_1 is controllable by BSEL_1, which is an inverse of BSELB_1.

In at least one embodiment, local bit-lines are pre-charged to a predetermined or programmable voltage by a pre-charge transistor. In at least one embodiment, n-type pre-charge transistor MN_CSPCH_0 is coupled to local bit-line LBL0 to pre-charge local bit-line LBL0 to Vpch voltage, where n-type pre-charge transistor MN_CSPCH_0 is controllable by CSPCH_0, which is an inverse of BSEL_0. In at least one embodiment, n-type pre-charge transistor MN_CSPCH_1 is coupled to local bit-line LBL1 to pre-charge local bit-line LBL1 to Vpch voltage, where n-type pre-charge transistor MN_CSPCH_1 is controllable by CSPCH_1, which is an inverse of BSEL_1.

In at least one embodiment, two sets of plurality of memory bit-cells, where one set is a flipped version of another set, are coupled to global bit-line without or with minimal impact on parasitic capacitance on global bit-line. In at least one embodiment, parasitic capacitance on global bit-line is reduced by introducing separate local bit-lines for each set of plurality of memory bit-cells and selectively coupling the local bit-line via transmission gates. By reducing capacitance of global bit-line BL0, sensing margin of sense amplifier is improved, in accordance with at least one embodiment. In at least one embodiment, by reducing capacitance of global bit-line BL0 (compared to sum of parasitic capacitance of two local bit-lines LBL0 and LBL1), polarization targets for capacitors for two sets of plurality of memory bit-cells can be reduced, which allows for lower voltage operation of a memory.

Figure 22:
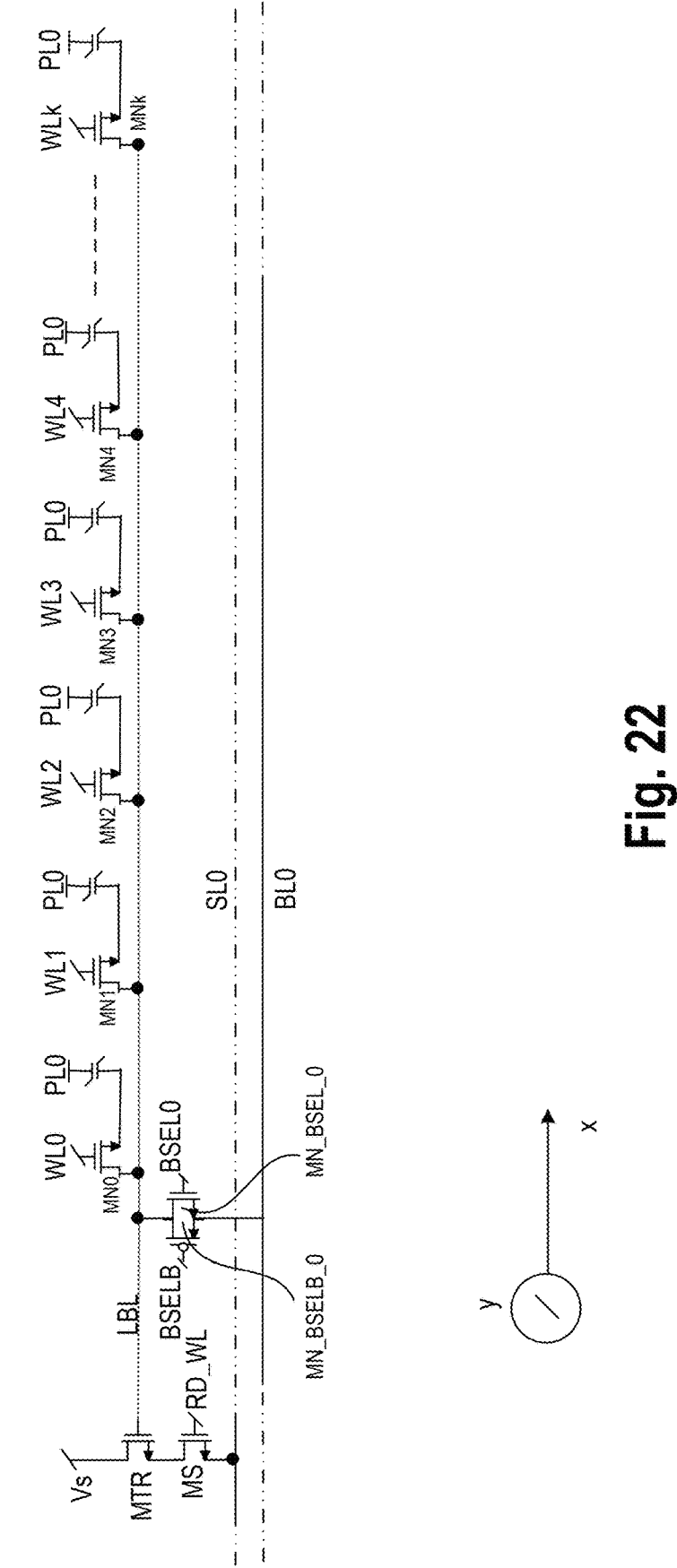
FIG. 22 illustrates a unit cell with a plurality of memory bit-cells coupled to a local bit-line which in turn is coupled to a global bit-line via a pass-gate transistor, where PL is parallel to BL, and where the plurality of memory bit-cells is coupled to a gain transistor, in accordance with at least one embodiment.

FIG. 22 illustrates unit cell 2200 with a plurality of memory bit-cells coupled to a local bit-line which in turn is coupled to a global bit-line via a pass-gate transistor, where PL is parallel to BL, and where the plurality of memory bit-cells is coupled to a gain transistor, in accordance with at least one embodiment. In at least one embodiment, unit cell 2200 is similar to unit cell 2000 but without pre-charge transistor and with gain circuitry. In at least one embodiment, gain circuitry includes gain transistor MTR, series transistor MS, read word-line (RD_WL), and reference Vs.

In at least one embodiment, leakage on sense line (e.g., SL0) is reduced by coupling a series transistor MS with gain transistor MTR. In at least one embodiment, series transistor MS is controlled by a read word-line (RD_WL). In at least one embodiment, gate terminal of series transistor MS is controlled by RD_WL. In at least one embodiment, RD_WL is parallel to plate-line PL0, local bit-line LBL, and global bit-line BL0. In at least one embodiment, source terminal of series transistor MS is connected to or coupled to sense-line (SL) (e.g., SL0). In at least one embodiment, drain terminal of series transistor MS is coupled to reference Vs via gain transistor MTR. In at least one embodiment, n-type transistors can be replaced with p-type transistors and polarity of control signals (e.g., RW_WL) can be modified for correction operation of memory bit-cell. In at least one embodiment, a mix of p-type and n-type transistors may be used for transistors of unit cell 2200. In at least one embodiment, size of series transistor MS is smaller than size of gain transistor MTR. In at least one embodiment, during read phase series transistor MS is turned on during a read phase to reduce leakage on SL0.

In at least one embodiment, local bit-line LBL is coupled to gate of gain transistor MTR, which is also coupled to reference Vs. In at least one embodiment, switch transistor MS is coupled to sense line (e.g., SL0) and to gain transistor MTR. In at least one embodiment, transmission gate (e.g., MN_BSELB_0 and MN_BSEL_0) is coupled to global bit-line (BL0) and local bit-line LBL. In at least one embodiment, gain transistor MTR is coupled to sense line SL0 while switch transistor is coupled to reference Vs and read word-line RD_WL.

FIG. 23 illustrates unit cell 2300 with two sets of plurality of memory bit-cells, according to at least one embodiment. Unit cell 2300 is similar to unit cell 2200 but with two instances (e.g., left cells and right cells) of unit cell 2300 coupled to a global bit-line BLx (e.g., BL0), in accordance with at least one embodiment. In at least one embodiment, two instances of unit cell 2200 are mirror images of each other such that a first instance (e.g., left cells) is a horizontally flipped version of a second instance (e.g., right cells). In at least one embodiment, PL is parallel to BL. In at least one embodiment, the two sets of plurality of memory bit-cells are decoupled via column select transistors. In at least one embodiment, gain circuitry (e.g., gain circuitry) is shared by the two sets of plurality of memory bit-cells, in accordance with at least one embodiment.

In at least one embodiment, both instances of plurality of memory bit-cells (e.g., left cells and right cells) are coupled to same plate-line (e.g., PL0), but different word-lines. In at least one embodiment, transistors MN0_0, MN1_0, . . . MNk_0 of bit-cells of left cells are coupled word-line WL0_0, WL1_0 . . . WLk_0, respectively. In at least one embodiment, transistors MN0_1, MN1_1 . . . MNk_1 of bit-cells of right cells are coupled word-line WL0_1, WL1_1, . . . WLk_1, respectively. In at least one embodiment, local bit-lines of one of left cells or right cells are coupled to a global bit-line via their respective select transmission gates.

In at least one embodiment, an individual set of plurality of memory bit-cells has a local bit-line coupled to a gain circuitry via pass-gate transistor. In at least one embodiment, local bit-line LBL0 of left cells is coupled node s1 via a first column multiplexer transistor or pass-gate MN_CS0_0, where node s1 is coupled to gain circuitry (e.g., gain transistor MTR, series transistor MS, read word-line RD_WL, and reference Vs). In at least one embodiment, first column multiplexer transistor or pass-gate MN_CS0_0 is controllable by signal CS0_0. In at least one embodiment, local bit-line LBL1 of right cells is coupled to node s1 via a second column multiplexer transistor or pass-gate MN_CS0_1, where node s1 is coupled to gain circuitry. In at least one embodiment, gain circuitry is coupled to sense line SL0. In at least one embodiment, gain transistor MTR is coupled to reference Vs and is also coupled in series with series transistor MS which is controllable by read word-line RD_WL. In at least one embodiment, gain transistor MTR is coupled to sense line SL0 while switch transistor is coupled to reference Vs and read word-line RD_WL.

In at least one embodiment, local bit-line LBL0 of left cells is coupled to global bit-line BL0 via transmission gates comprising p-type transistor MP_BSELB_0 and n-type transistor MN_BSEL_0. In at least one embodiment, p-type transistor MP_BSELB_0 is controllable by BSELB_0. In at least one embodiment, n-type transistor MN_BSELB_0 is controllable by BSEL_0, which is an inverse of BSELB_0.

In at least one embodiment, local bit-line LBL1 of left cells is coupled to global bit-line BL0 via transmission gates comprising p-type transistor MP_BSELB_1 and n-type transistor MN_BSEL_1. In at least one embodiment, p-type transistor MP_BSELB_1 is controllable by BSELB_1. In at least one embodiment, n-type transistor MN_BSELB_1 is controllable by BSEL_1, which is an inverse of BSELB_1.

In at least one embodiment, two sets of plurality of memory bit-cells, where one set is a flipped version of another set, are coupled to global bit-line with minimal impact on parasitic capacitance on global bit-line. In at least one embodiment, parasitic capacitance on global bit-line is reduced by introducing separate local bit-lines for each set of plurality of memory bit-cells and selectively coupling the local bit-line via transmission gates. By reducing capacitance of global bit-line BL0, sensing margin of sense amplifier is improved, in accordance with at least one embodiment. In at least one embodiment, by reducing capacitance of global bit-line BL0 (compared to sum of parasitic capacitance of two local bit-lines LBL0 and LBL1), polarization targets for capacitors for two sets of plurality of memory bit-cells can be reduced, which allows for lower voltage operation of a memory.

Figure 24:
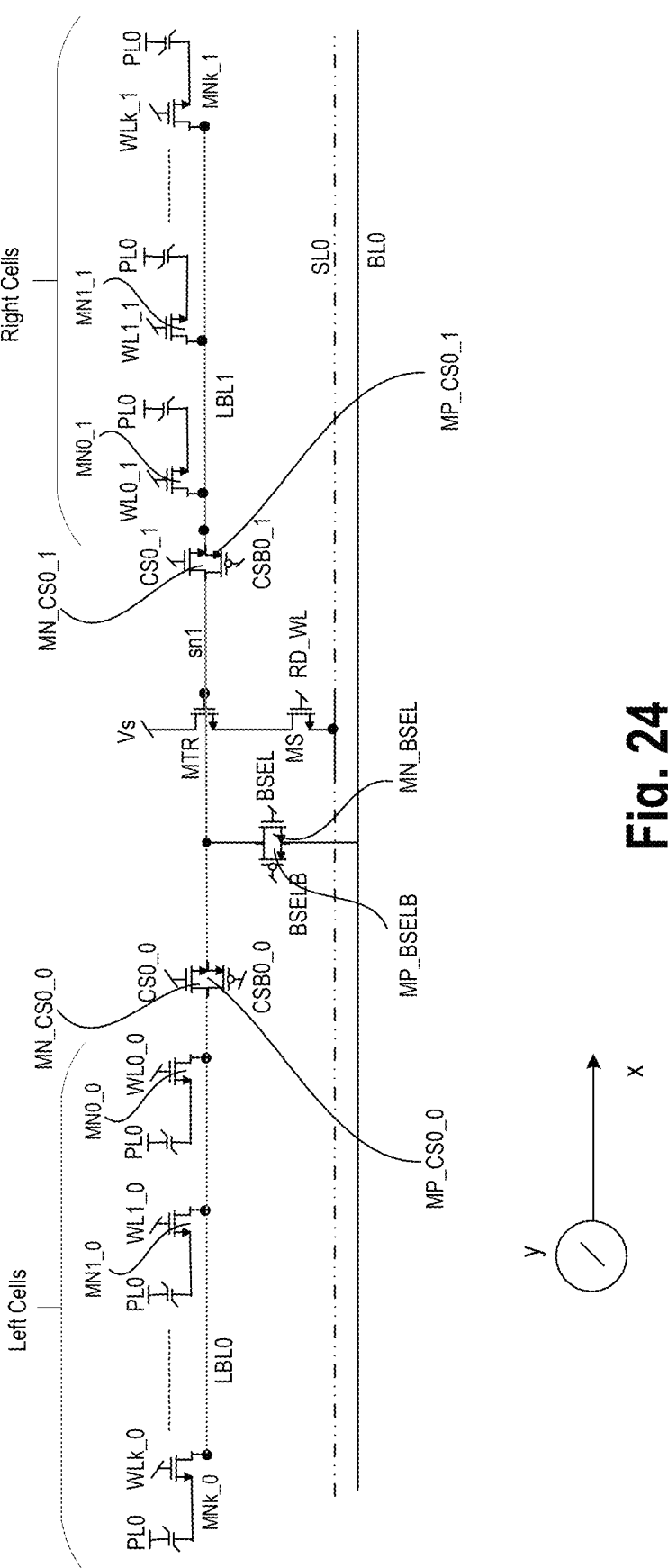
FIG. 24 illustrates a unit cell which is similar to unit cell of FIG. 23 but with transmission gate based column select transistors, in accordance with at least one embodiment.

FIG. 24 illustrates unit cell 2400 which is similar to unit cell of FIG. 23 but with transmission gate based column select transistors, in accordance with at least one embodiment. In at least one embodiment, first column multiplexer n-type transistor or pass-gate MN_CS0_0 is paired with first column multiplexer p-type transistor or pass-gate MP_CS0_0. In at least one embodiment, first column multiplexer n-type transistor or pass-gate MN_CS0_0 has a gate terminal controllable by signal CS0_0. In at least one embodiment, first column multiplexer p-type transistor or pass-gate MP_CS0_0 has a gate terminal controllable by signal CSB0_0, which is an inverse of signal CS0_0. In at least one embodiment, second column multiplexer n-type transistor or pass-gate MN_CS0_1 is paired with second column multiplexer p-type transistor or pass-gate MP_CS0_1. In at least one embodiment, second column multiplexer p-type transistor or pass-gate MN_CS0_1 has a gate terminal controllable by signal CS0_1. In at least one embodiment, second column multiplexer p-type transistor or pass-gate MP_CS0_1 has a gate terminal controllable by signal CSB0_1, which is an inverse of signal CS0_1. In at least one embodiment, using transmission gates (e.g., full CMOS switches) instead of just an n-type or p-type transistor allows for full charge on local bit-lines LBL0 and LBL1 to transfer over to node sn1.

In at least one embodiment, instead of two bit-line selection transmission gates of FIG. 23, a bit-line selection transmission gate is coupled to node sn1 and global bit-line BL0. In at least one embodiment, bit-line selection transmission gate comprises n-type transistor MN_BSEL coupled in parallel to p-type transistor MP_BSELB. In at least one embodiment, n-type transistor MN_BSEL is controllable by BSEL, while p-type transistor MP_BSELB is controllable by BSELB, which is an inverse of BSEL.

In at least one embodiment, two sets of plurality of memory bit-cells, where one set is a flipped version of another set, are coupled to global bit-line with minimal impact on parasitic capacitance on global bit-line. In at least one embodiment, parasitic capacitance on global bit-line is reduced by introducing separate local bit-lines for each set of plurality of memory bit-cells and selectively coupling the local bit-line via column multiplexer transmission gates and bit selection transmission gate. By reducing capacitance of global bit-line BL0, sensing margin of sense amplifier is improved, in accordance with at least one embodiment. In at least one embodiment, by reducing capacitance of global bit-line BL0 (compared to sum of parasitic capacitance of two local bit-lines LBL0 and LBL1), polarization targets for capacitors for two sets of plurality of memory bit-cells can be reduced, which allows for lower voltage operation of a memory.

Figure 25:
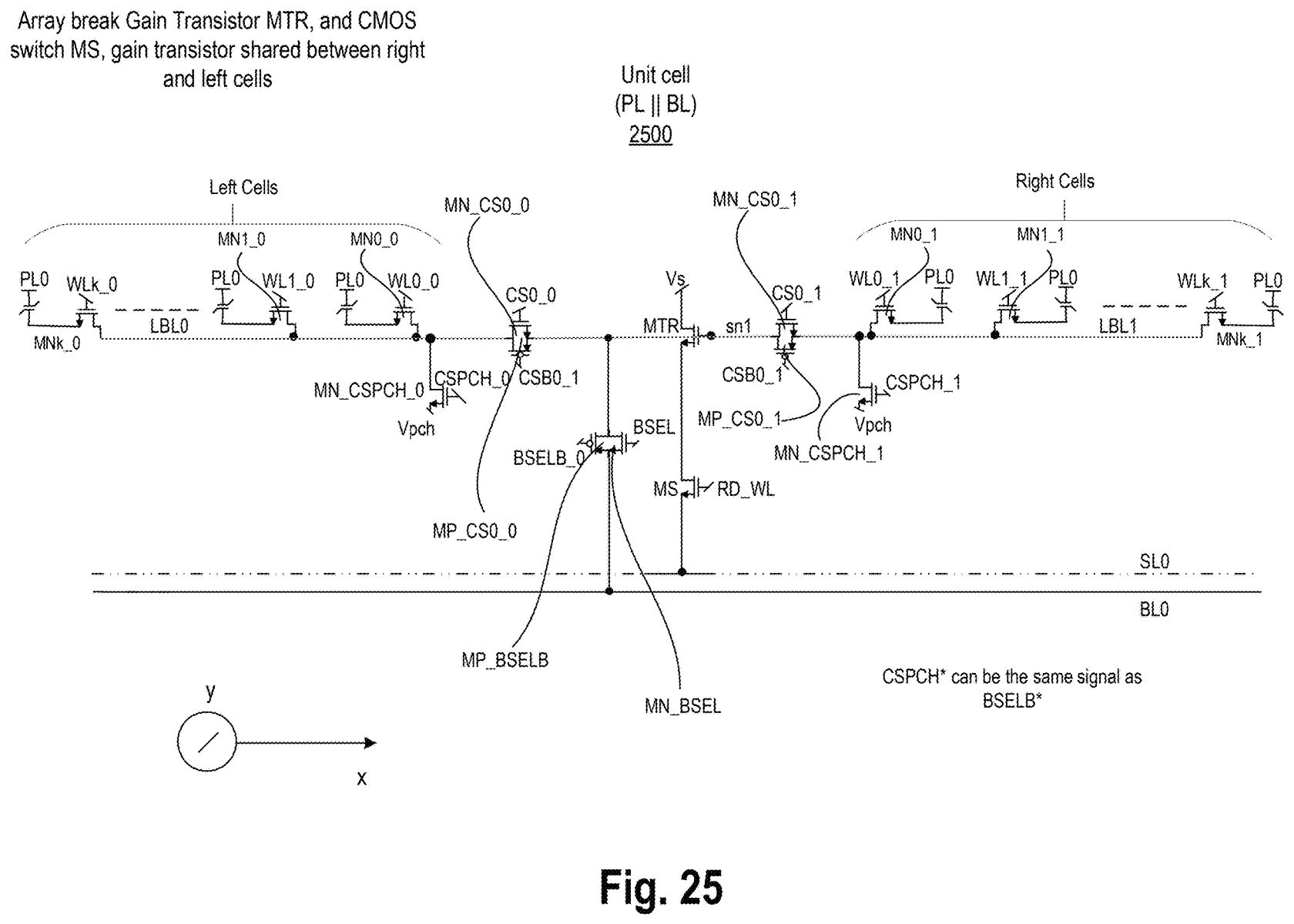

FIG. 25 illustrates unit cell 2500 which is similar to unit cell of FIG. 24 but with pre-charge transistors for pre-charging respective local bit-lines, in accordance with at least one embodiment. In at least one embodiment, local bit-lines are pre-charged to a predetermined or programmable voltage by a pre-charge transistor. In at least one embodiment, n-type pre-charge transistor MN_CSPCH_0 is coupled to local bit-line LBL0 to pre-charge local bit-line LBL0 to Vpch voltage, where n-type pre-charge transistor MN_CSPCH_0 is controllable by CSPCH_0, which is an inverse of BSEL. In at least one embodiment, n-type pre-charge transistor MN_CSPCH_1 is coupled to local bit-line LBL1 to pre-charge local bit-line LBL1 to Vpch voltage, where n-type pre-charge transistor MN_CSPCH_1 is controllable by CSPCH_1, which is an inverse of BSEL.

Figure 26:
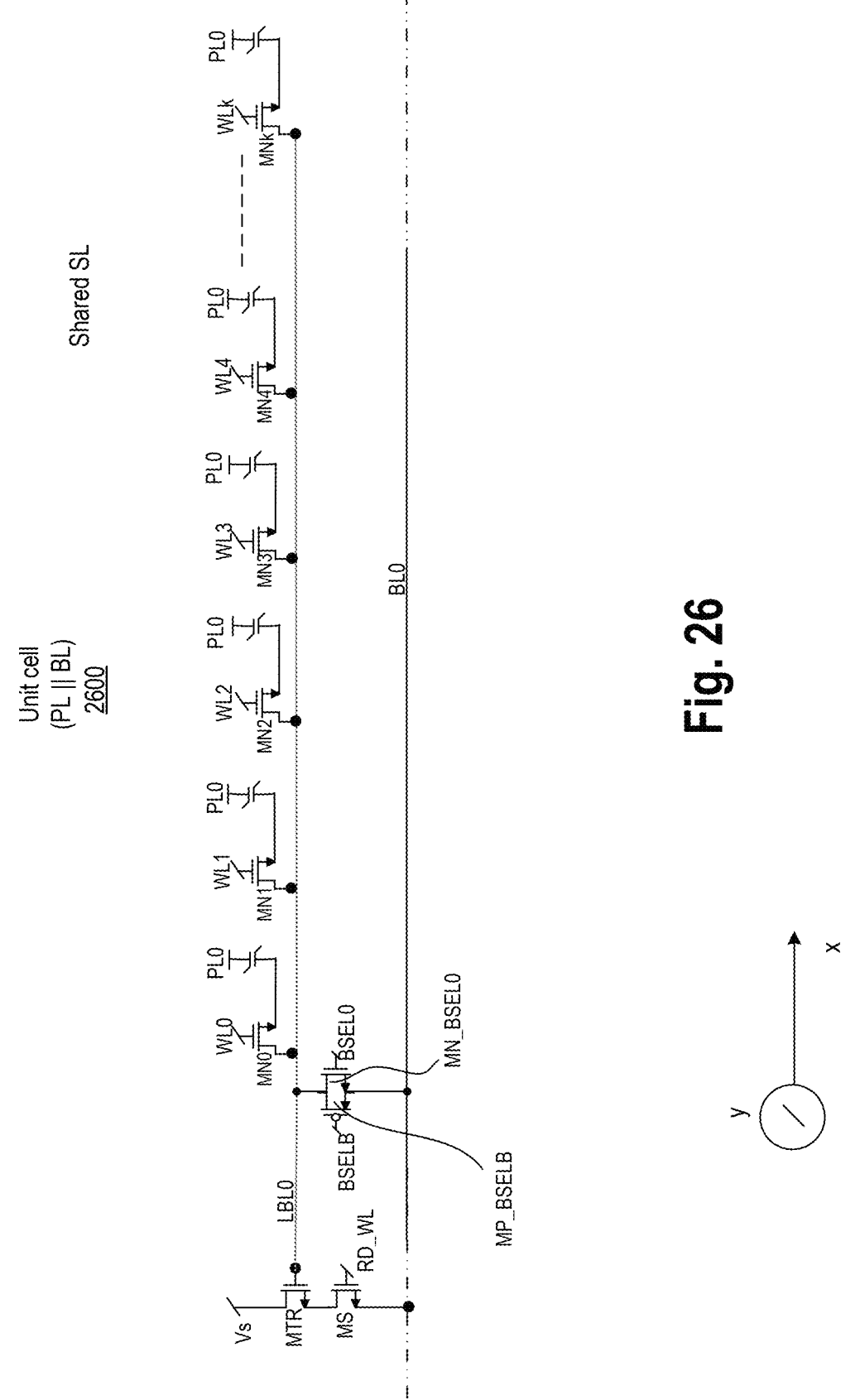
FIG. 26 illustrates a unit cell with gain transistor and where sense line (SL) is shared with bit line (BL), in accordance with at least one embodiment.

FIG. 26 illustrates unit cell 2600 with gain transistor and where sense line (SL) is shared with BL, in accordance with at least one embodiment. In at least one embodiment, unit cell 2600 is similar to unit cell 2200 in feature and function. Here, shared global bit-line BL0 and sense line SL are described. In at least one embodiment both gain circuitry and bit selection transmission gate (e.g., transistors MN_BSEL0 and MP_BSELB) are coupled to global bit-line BL0. In at least one embodiment, gain transistor MTR is coupled to reference Vs and is also coupled in series with series transistor MS which is controllable by read word-line RD_WL. In at least one embodiment, gain transistor MTR is coupled to global bit-line BL0 while switch transistor is coupled to reference Vs and read word-line RD_WL. Compared to FIG. 22, in at least one embodiment, extra interconnect routing of sense line SL0 is avoided and traded by some parasitic capacitance on global bit-line BL0 from series transistor MS. In at least one embodiment, series transistor MS is much smaller in size than gain transistor MTR, and so negligible parasitic capacitance is added to global bit-line BL0. Due to lower capacitance on global bit-line BL0 than local bit-line LBL0, polarization targets for capacitors of memory bit-cells are reduced allowing operation of memory at lower power supply (e.g., 1V or less).

Figure 27:
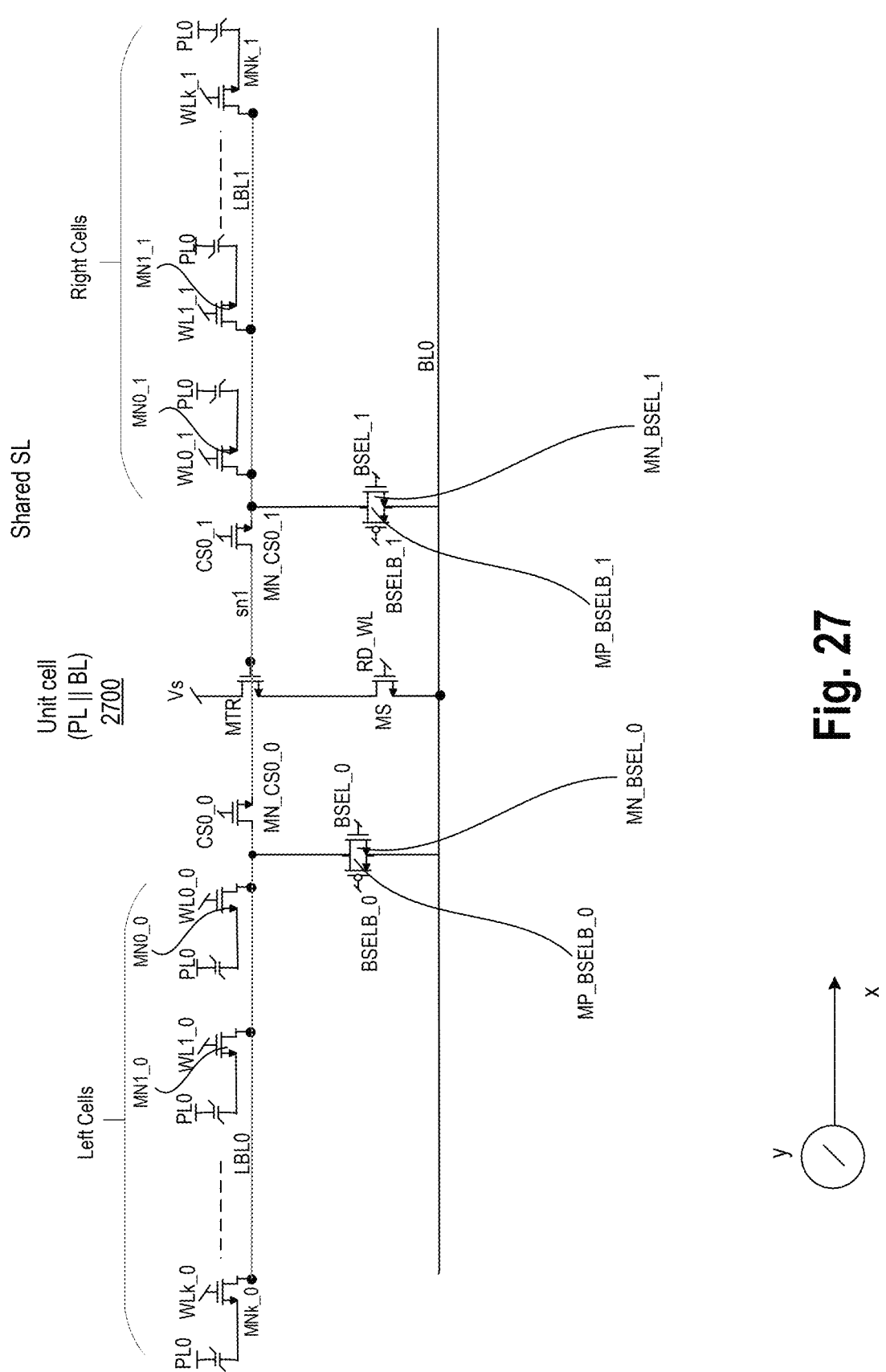
FIG. 27 illustrates a unit cell with two sets of plurality of memory bit-cells like FIG. 23 but with shared SL, in accordance with at least one embodiment.

FIG. 27 illustrates unit cell 2700 with two sets of plurality of memory bit-cells like FIG. 23 but with shared SL, in accordance with at least one embodiment. In at least one embodiment, unit cell 2700 is similar to unit cell 2300 in feature and function. Here, shared global bit-line BL0 and sense line SL and provided, in accordance with at least one example. In at least one embodiment both gain circuitry and bit selection transmission gates (e.g., transistors MN_BSEL_0 and MP_BSELB_0, and transistors MN_BSEL_1 and MP_BSELB_1) are coupled to global bit-line BL0. In at least one embodiment, gain transistor MTR is coupled to reference Vs and is also coupled in series with series transistor MS which is controllable by read word-line RD_WL. In at least one embodiment, gain transistor MTR is coupled to global bit-line BL0 while switch transistor is coupled to reference Vs and read word-line RD_WL. Compared to FIG. 23, in at least one embodiment, extra interconnect routing of sense line SL0 is avoided and traded by some parasitic capacitance on global bit-line BL0 from series transistor MS. In at least one embodiment, series transistor MS is much smaller in size than gain transistor MTR, and so negligible parasitic capacitance is added to global bit-line BL0. Due to lower capacitance on global bit-line BL0 than local bit-line LBL0, polarization targets for capacitors of memory bit-cells are reduced allowing operation of memory at lower power supply (e.g., 1V or less).

Figure 28:
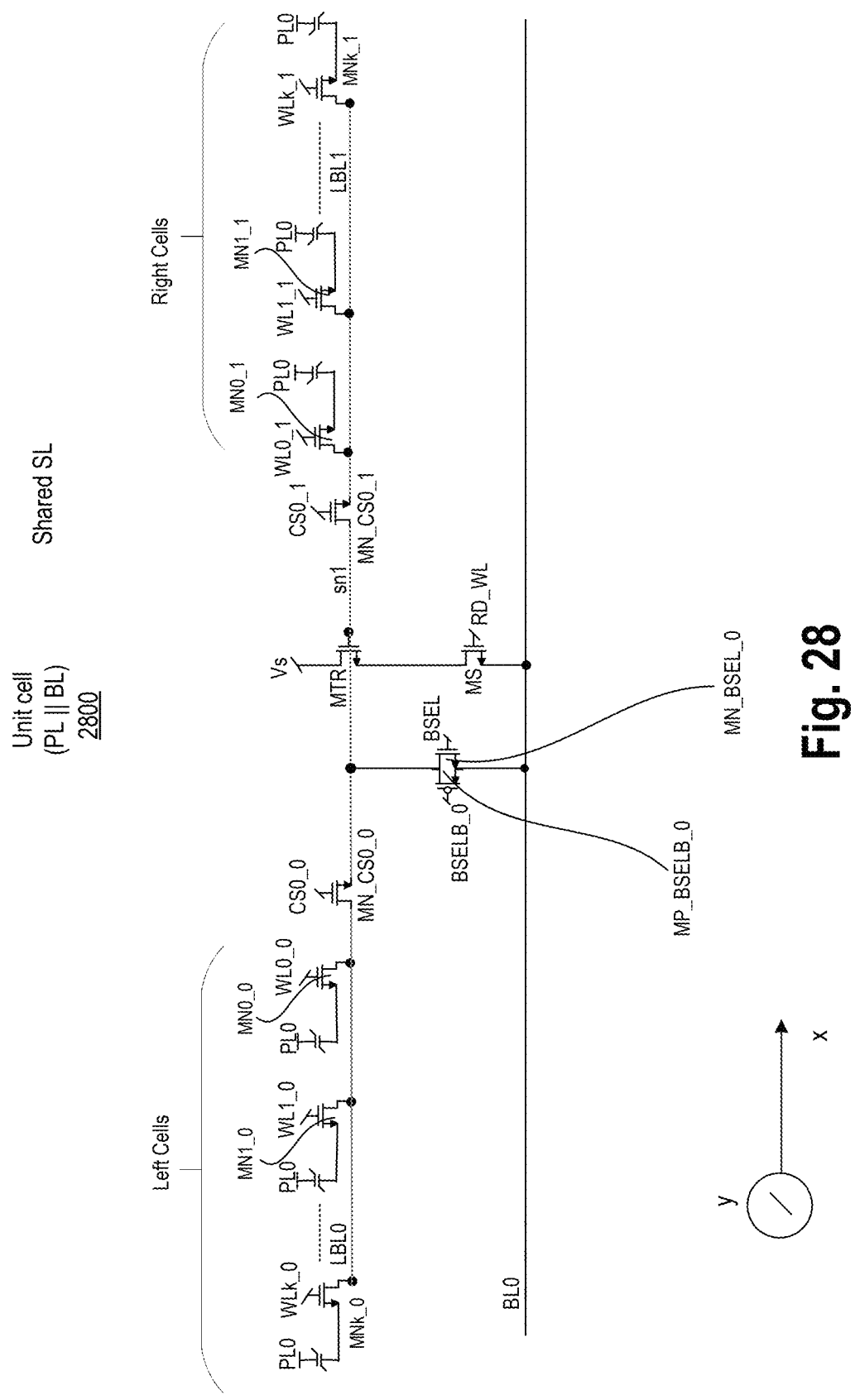
FIG. 28 illustrates a unit cell with two sets of plurality of memory bit-cells like FIG. 24 but with shared SL and one conductivity pass-gate for column selection per set of plurality of bit-cells, in accordance with at least one embodiment.

FIG. 28 illustrates unit cell 2800 with two sets of plurality of memory bit-cells like FIG. 24 but with shared SL and one conductivity pass-gate for column selection per set of plurality of bit-cells, in accordance with at least one embodiment. In at least one embodiment, unit cell 2800 is similar to unit cell 2400 in function and feature. Here, shared global bit-line BL0 and sense line SL are provided in accordance with at least one example. In at least one embodiment both gain circuitry and bit selection transmission gate (e.g., transistors MN_BSEL_0 and MP_BSELB_0) are coupled to global bit-line BL0. In at least one embodiment, gain transistor MTR is coupled to reference Vs and is also coupled in series with series transistor MS which is controllable by read word-line RD_WL. In at least one embodiment, gain transistor MTR is coupled to global bit-line BL0 while switch transistor is coupled to reference Vs and read word-line RD_WL. Compared to FIG. 24, in at least one embodiment, extra interconnect routing of sense line SL0 is avoided and traded by some parasitic capacitance on global bit-line BL0 from series transistor MS. In at least one embodiment, series transistor MS is much smaller in size than gain transistor MTR, and so negligible parasitic capacitance is added to global bit-line BL0. Due to lower capacitance on global bit-line BL0 than local bit-line LBL0, polarization targets for capacitors of memory bit-cells are reduced allowing operation of memory at lower power supply (e.g., 1V or less).

FIG. 29 illustrates unit cell 2900 with two sets of plurality of memory bit-cells like FIG. 28 but with transmission gate based column multiplexers, in accordance with at least one embodiment. In at least one embodiment, first column multiplexer n-type transistor or pass-gate MN_CS0_0 is paired with first column multiplexer p-type transistor or pass-gate MP_CS0_0. In at least one embodiment, first column multiplexer n-type transistor or pass-gate MN_CS0_0 has a gate terminal controllable by signal CS0_0. In at least one embodiment, first column multiplexer p-type transistor or pass-gate MP_CS0_0 has a gate terminal controllable by signal CSB0_0, which is an inverse of signal CS0_0. In at least one embodiment, second column multiplexer n-type transistor or pass-gate MN_CS0_1 is paired with second column multiplexer p-type transistor or pass-gate MP_CS0_1. In at least one embodiment, second column multiplexer p-type transistor or pass-gate MN_CS0_1 has a gate terminal controllable by signal CS0_1. In at least one embodiment, second column multiplexer p-type transistor or pass-gate MP_CS0_1 has a gate terminal controllable by signal CSB0_1, which is an inverse of signal CS0_1. In at least one embodiment, using transmission gates (e.g., full CMOS switches) instead of just an n-type or p-type transistor allows for full charge on local bit-lines LBL0 and LBL1 to transfer over to node sn1.

FIG. 30 illustrates unit cell 3000 with two sets of plurality of memory bit-cells like FIG. 25 but with shared SL, in accordance with at least one embodiment. In at least one embodiment both gain circuitry and bit selection transmission gate (e.g., transistors MN_BSEL_0 and MP_B-SELB_0) are coupled to global bit-line BL0. In at least one embodiment, gain transistor MTR is coupled to reference Vs and is also coupled in series with series transistor MS which is controllable by read word-line RD_WL. In at least one embodiment, gain transistor MTR is coupled to global bit-line BL0 while switch transistor is coupled to reference Vs and read word-line RD_WL. Compared to FIG. 25, in at least one embodiment, extra interconnect routing of sense line SL0 is avoided and traded by some parasitic capacitance on global bit-line BL0 from series transistor MS. In at least one embodiment, series transistor MS is much smaller in size than gain transistor MTR, and so negligible parasitic capacitance is added to global bit-line BL0. Due to lower capacitance on global bit-line BL0 than local bit-line LBL0 and local bit-line LBL1, polarization targets for capacitors of memory bit-cells are reduced allowing operation of memory at lower power supply (e.g., 1V or less).

Figure 31:
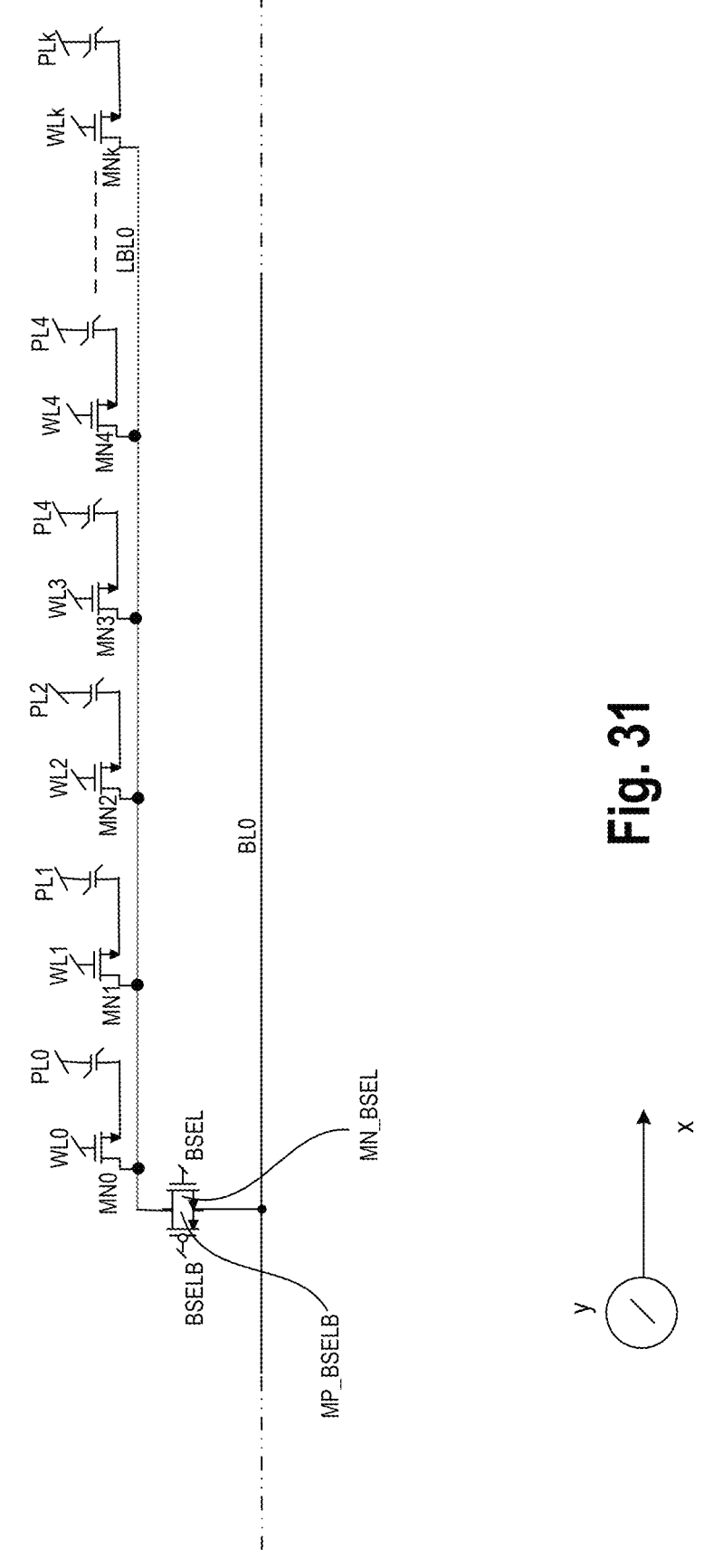
FIG. 31 illustrates a unit cell with a plurality of memory bit-cells coupled to a local bit-line which in turn is coupled to a global bit-line via a pass-gate, where PL is parallel to word-line (WL), in accordance with at least one embodiment.

FIG. 31 illustrates unit cell 3100 with a plurality of memory bit-cells coupled to a local bit-line which in turn is coupled to a global bit-line via a pass-gate, where PL is parallel to word-line (WL), in accordance with at least one embodiment. In at least one embodiment, unit cell 3100 is similar to unit cell 1800. Here, a transmission gate as bit selection circuitry and PL parallel to WL are provided, in accordance with at least one example. In at least one embodiment, transmission gate based bit selection circuitry include p-type transistor MP_BSELB coupled in parallel to n-type transistor MN_BSEL, where p-type transistor MP_B-SELB and n-type transistor MN_BSEL couple local bit-line LBL0 to global bit-line BL0. In at least one embodiment, p-type transistor MP_BSELB is controllable by BSELB, which is inverse of signal BSEL. In at least one embodiment, WL and PL are orthogonal to local bit-line LBL0 and/or global bit-line BL0.

Figure 32:
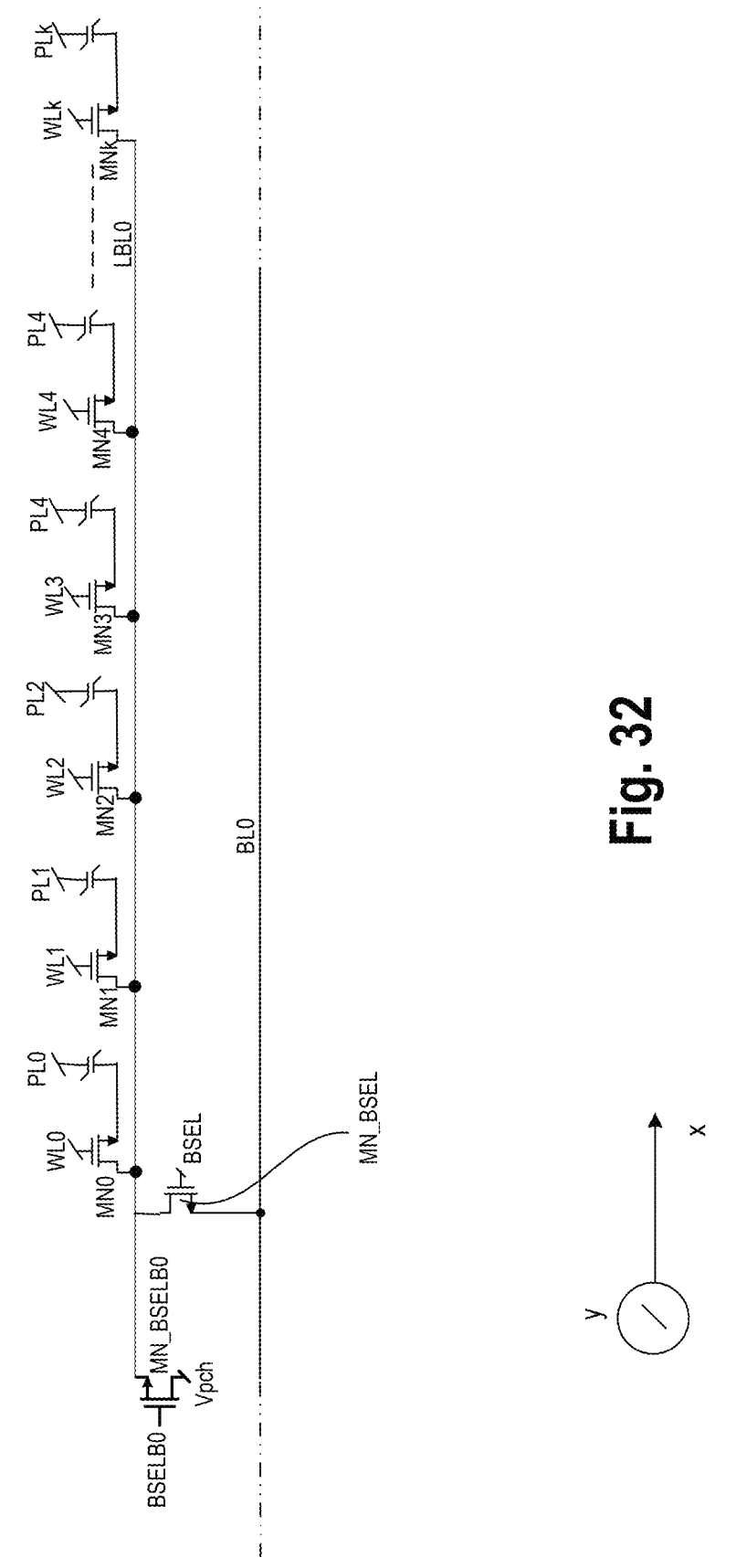
FIG. 32 illustrates a unit cell with a plurality of memory bit-cells coupled to a local bit-line which in turn is coupled to a global bit-line via an n-type transistor, where PL is parallel to WL, and where the local bit-line is pre-charged by a pre-charge transistor, in accordance with at least one embodiment.

FIG. 32 illustrates unit cell 3200 with a plurality of memory bit-cells coupled to a local bit-line which in turn is coupled to a global bit-line via an n-type transistor, where PL is parallel to WL, and where the local bit-line is pre-charged by a pre-charge transistor, in accordance with at least one embodiment. In at least one embodiment, unit cell 3200 is similar to unit cell 1900. Here, WL is parallel to PL, in accordance with at least one example. In at least one embodiment, WL and PL are orthogonal to local bit-line LBL0 and/or global bit-line BL0.

Figure 33:
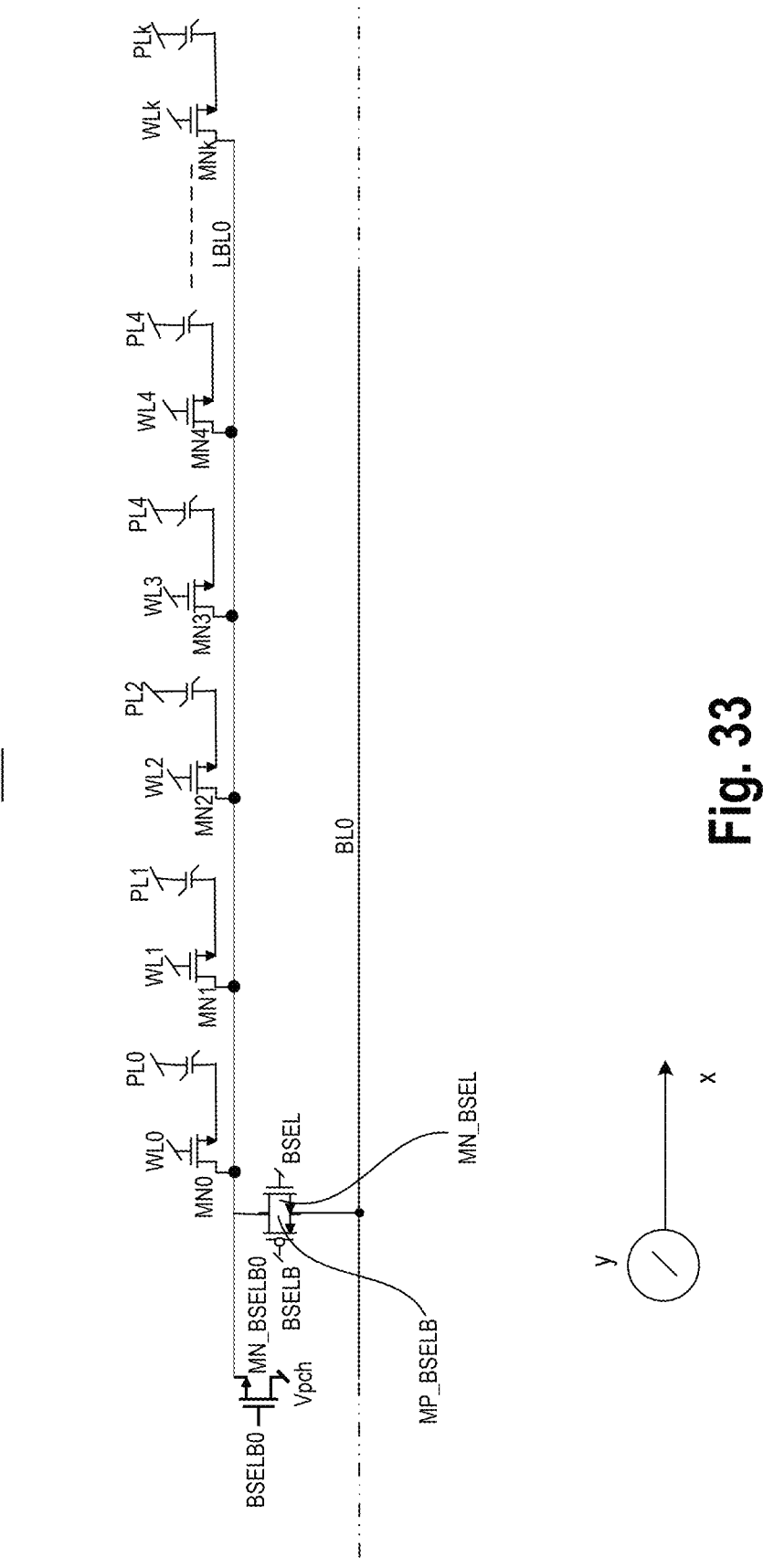
FIG. 33 illustrates a unit cell with a plurality of memory bit-cells coupled to a local bit-line which in turn is coupled to a global bit-line via a pass-gate, where PL is parallel to WL, and where the local bit-line is pre-charged by a pre-charge transistor, in accordance with at least one embodiment.

FIG. 33 illustrates unit cell 3300 with a plurality of memory bit-cells coupled to a local bit-line which in turn is coupled to a global bit-line via a pass-gate, where PL is parallel to WL, and where the local bit-line is pre-charged by a pre-charge transistor, in accordance with at least one embodiment. In at least one embodiment, unit cell 3300 is similar to unit cell 2000. Here, WL is parallel to PL, in accordance with at least one embodiment. In at least one embodiment, WL and PL are orthogonal to local bit-line LBL0 and/or global bit-line BL0.

Figure 34:
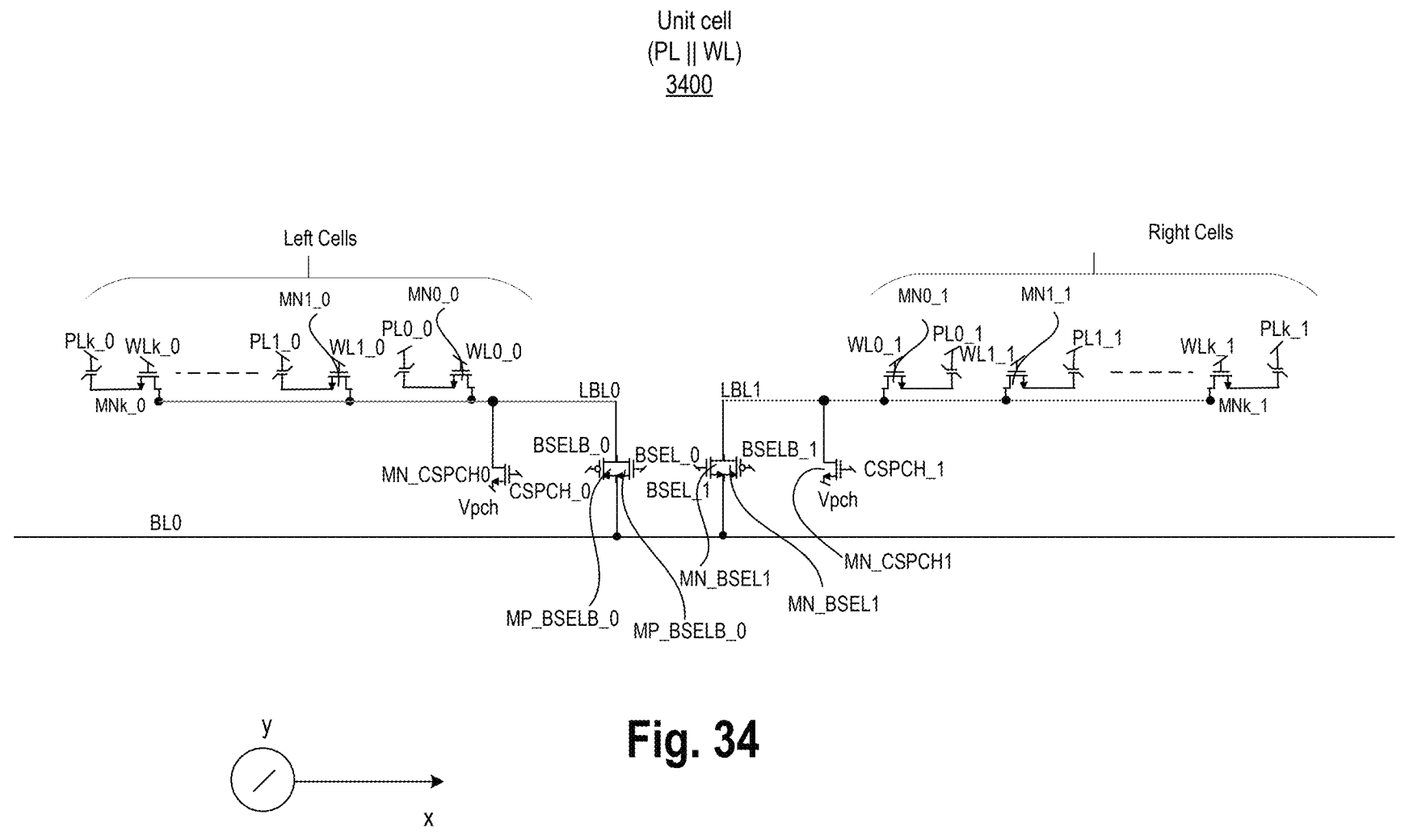

FIG. 34 illustrates unit cell 3400 with two sets of plurality of memory bit-cells, where one set is a flipped version of another set, wherein an individual set of plurality of memory bit-cells has a local bit-line coupled to a global bit-line via pass-gate transistor, where PL is parallel to WL, and where the local-line line is pre-charged by a pre-charge transistor, in accordance with at least one embodiment. In at least one embodiment, unit cell 3400 is similar to unit cell 2100. Here, WL is parallel to PL in accordance with at least one example. In at least one embodiment, WL and PL are orthogonal to local bit-line LBL0 and/or global bit-line BL0.

Figure 35:
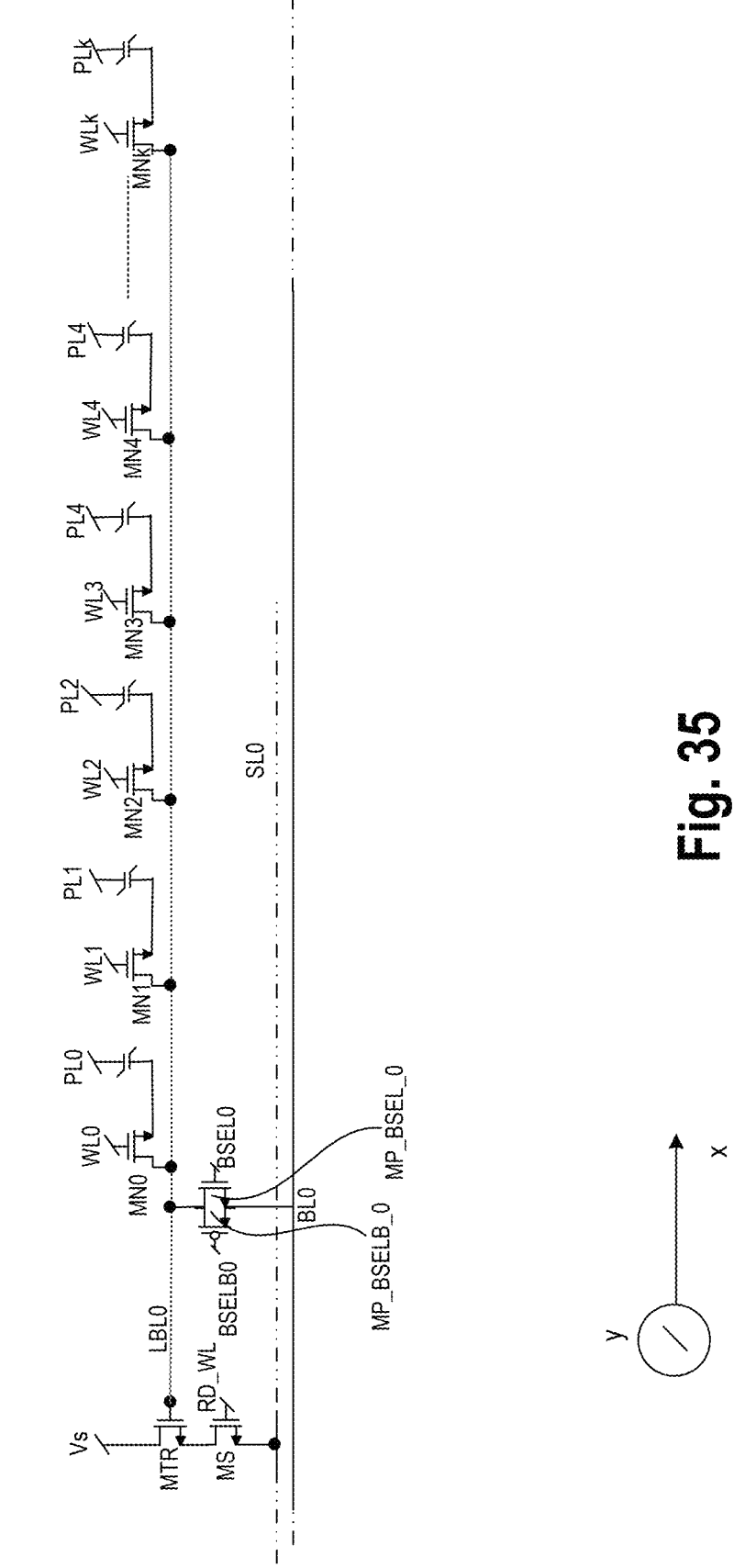
FIG. 35 illustrates a unit cell with a plurality of memory bit-cells coupled to a local bit-line which in turn is coupled to a global bit-line via a pass-gate transistor, where PL is parallel to WL, and where the plurality of memory bit-cells is coupled to a gain transistor, in accordance with at least one embodiment.

FIG. 35 illustrates unit cell 3500 with a plurality of memory bit-cells coupled to a local bit-line which in turn is coupled to a global bit-line via a pass-gate transistor, where PL is parallel to WL, and where the plurality of memory bit-cells is coupled to a gain transistor, in accordance with at least one embodiment. In at least one embodiment, unit cell 3500 is similar to unit cell 2200. Here, WL is parallel to PL in accordance with one example. In at least one embodiment, WL and PL are orthogonal to local bit-line LBL0 and/or global bit-line BL0.

Figure 36:
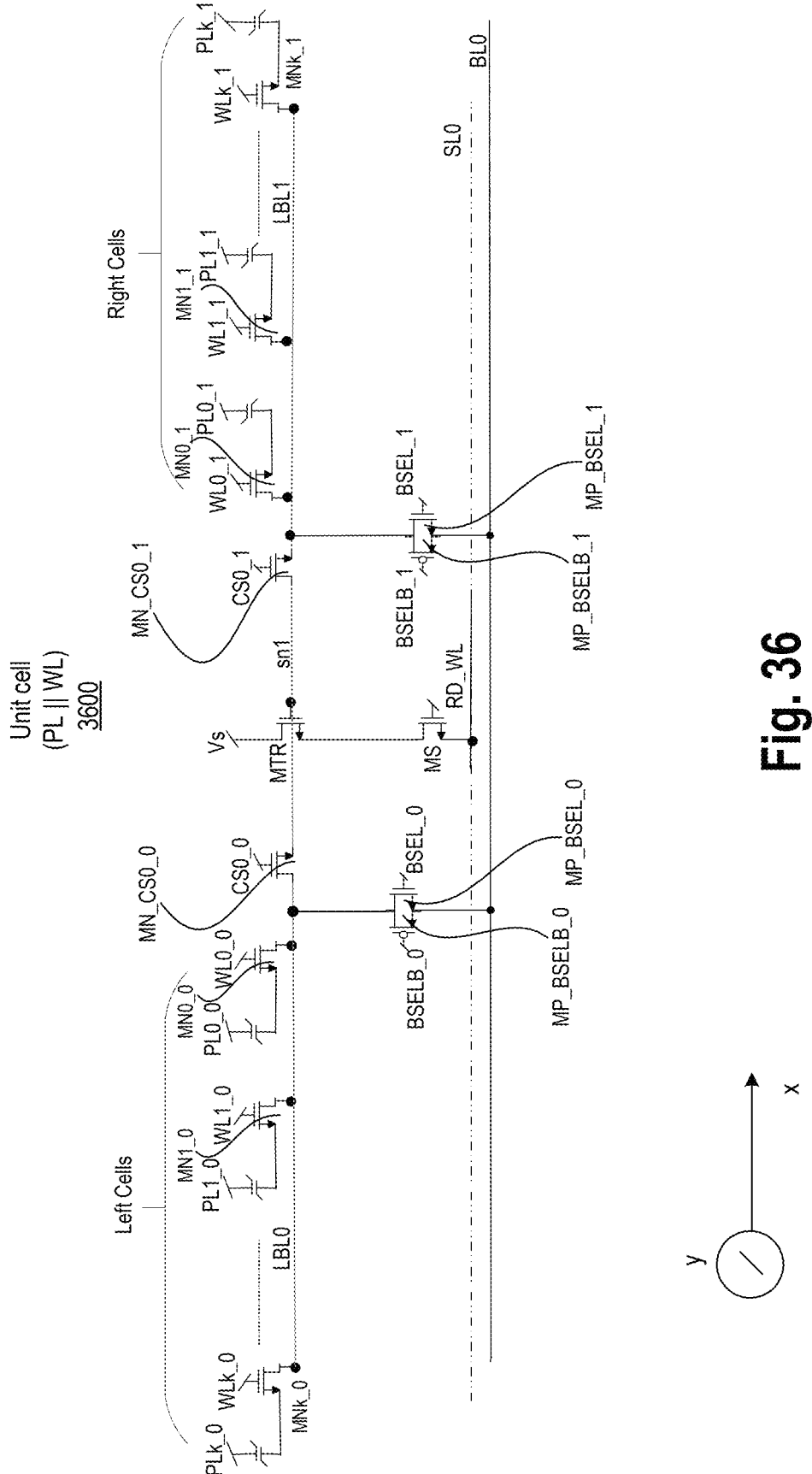
FIG. 36 illustrates a unit cell with two sets of plurality of memory bit-cells, where one set is a flipped version of another set, wherein an individual set of plurality of memory bit-cells has a local bit-line coupled to a global bit-line via a pass-gate transistor, where PL is parallel to WL, and where the two sets of plurality of memory bit-cells are decoupled via column select transistors, and where a gain cell is shared by the two sets of plurality of memory bit-cells, in accordance with at least one embodiment.

FIG. 36 illustrates unit cell 3600 with two sets of plurality of memory bit-cells, where one set is a flipped version of another set, wherein an individual set of plurality of memory bit-cells has a local bit-line coupled to a global bit-line via a pass-gate transistor, where PL is parallel to WL, and where the two sets of plurality of memory bit-cells are decoupled via column select transistors, and where a gain cell is shared by the two sets of plurality of memory bit-cells, in accordance with at least one embodiment. In at least one embodiment, unit cell 3600 is similar to unit cell 2300. Here, WL is parallel to PL in accordance with at least one example. In at least one embodiment, WL and PL are orthogonal to local bit-line LBL0 and/or global bit-line BL0.

Figure 37:
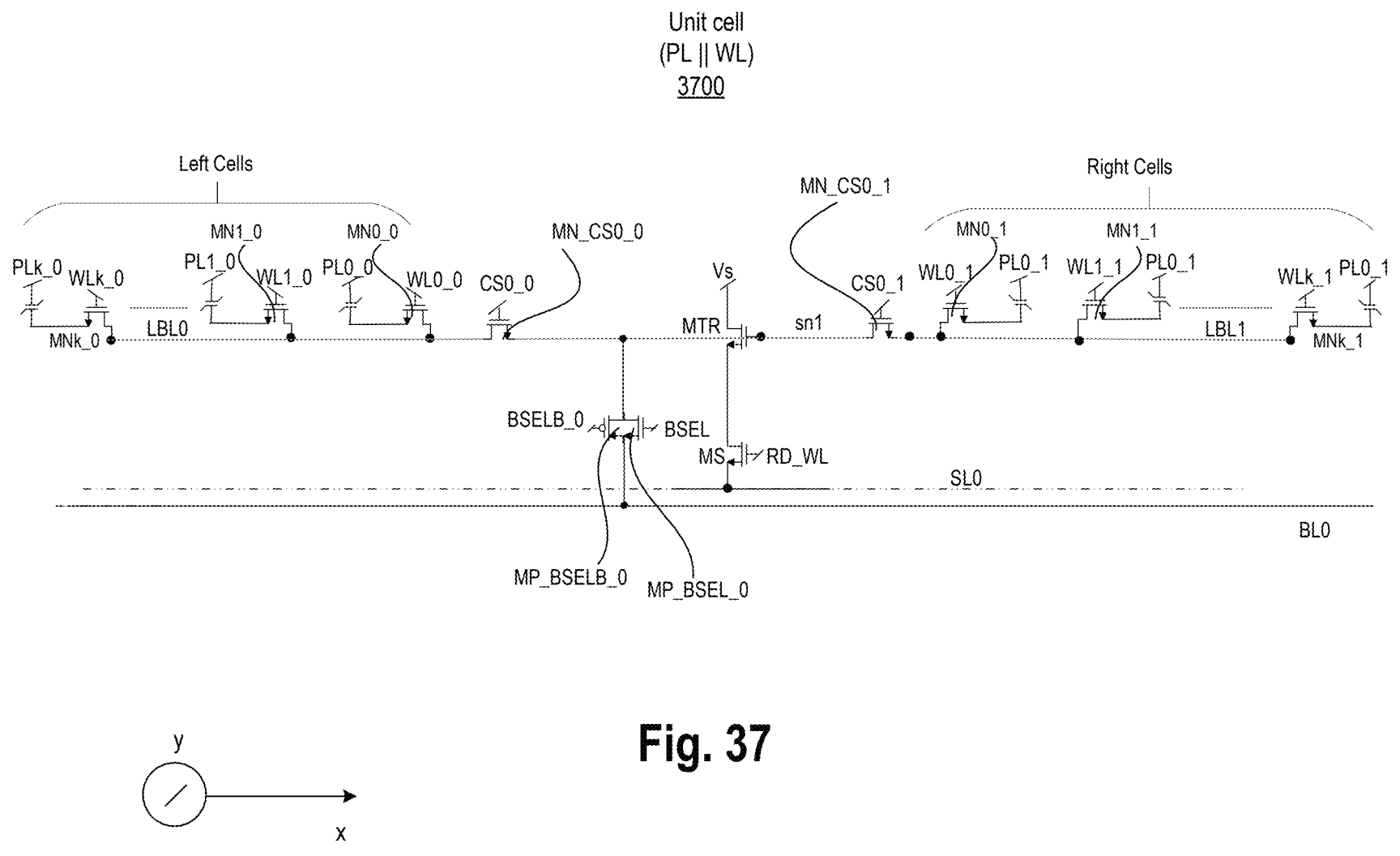

FIG. 37 illustrates unit cell 3700 with two sets of plurality of memory bit-cells, where one set is a flipped version of another set, wherein an individual set of plurality of memory bit-cells has a local bit-line coupled to a global bit-line via a pass-gate, where PL is parallel to WL, and where the two sets of plurality of memory bit-cells are decoupled via column select transistors, and where a gain cell is shared by the two sets of plurality of memory bit-cells, in accordance with at least one embodiment. In at least one embodiment, unit cell 3700 is similar to unit cell 2400. Here, WL is parallel to PL in accordance with at least one example. In at least one embodiment, WL and PL are orthogonal to local bit-line LBL0 and/or global bit-line BL0. In at least one embodiment, column selection transmission gates are replaced with pass-gate transistors MN_CS0_0 and MN_CS0_1 as shown.

Figure 38:
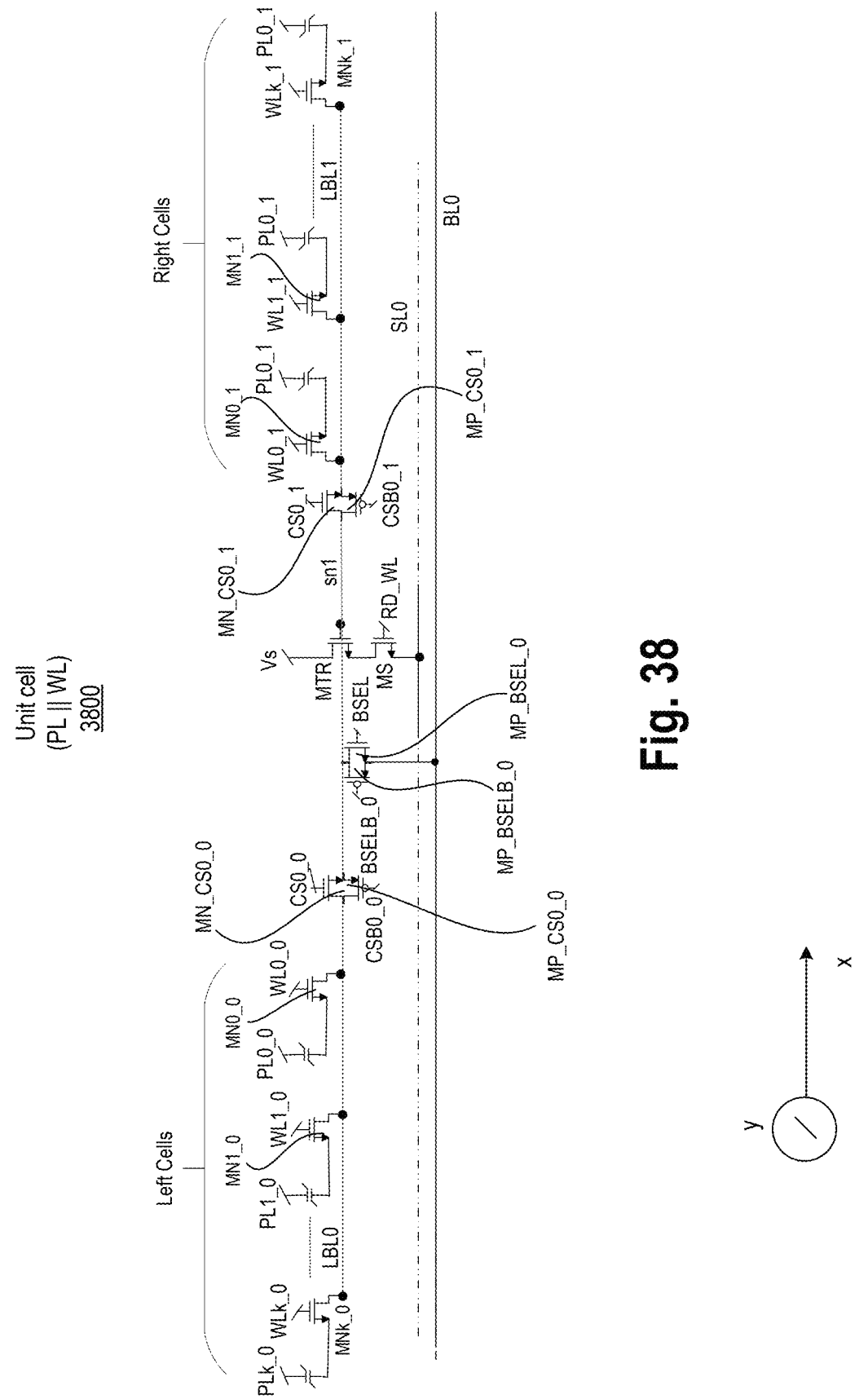
FIG. 38 illustrates a unit cell with two sets of plurality of memory bit-cells similar to FIG. 37, but where column select transistors are replaced by pass-gates, in accordance with at least one embodiment.

FIG. 38 illustrates unit cell 3800 with two sets of plurality of memory bit-cells similar to FIG. 37 but where column select transistors are replaced by pass-gates, in accordance with at least one embodiment. In at least one embodiment, unit cell 3800 is similar to unit cell 2400. Here, WL is parallel to PL in accordance with at least one example. In at least one embodiment, WL and PL are orthogonal to local bit-line LBL0 and/or global bit-line BL0.

Figure 39:
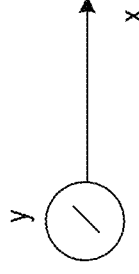
FIG. 39 illustrates a unit cell which is similar to unit cell of FIG. 38, but with pre-charge transistors for pre-charging respective local bit-lines, in accordance with at least one embodiment.

FIG. 39 illustrates unit cell 3900 which is similar to unit cell of FIG. 38. Here, pre-charge transistors are used for pre-charging respective local bit-lines, in accordance with at least one embodiment. In at least one embodiment, unit cell 3900 is similar to unit cell 2500. Here, WL is parallel to PL in accordance with at least one example. In at least one embodiment, WL and PL are orthogonal to local bit-line LBL0 and/or global bit-line BL0.

Figure 40:
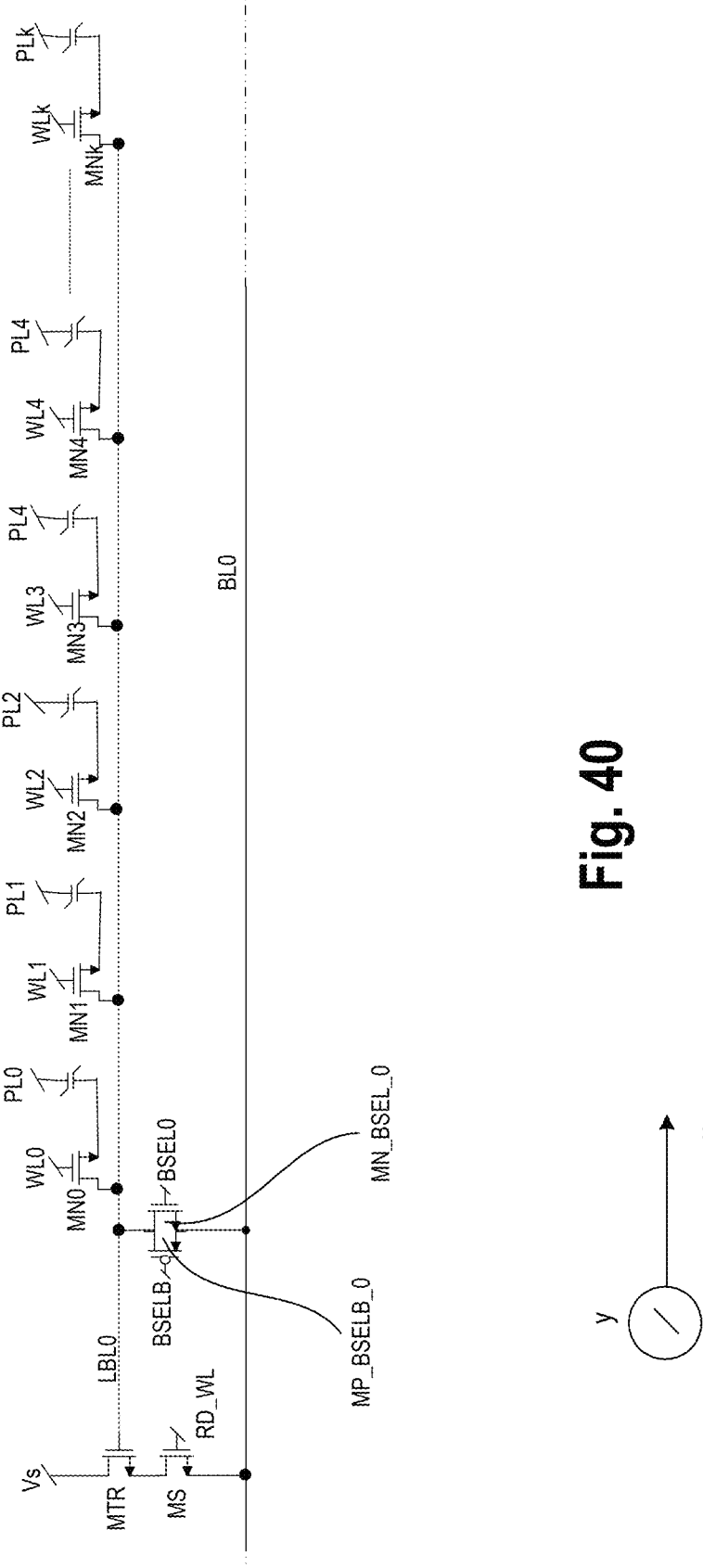
FIG. 40 illustrates a unit cell with gain transistor and where SL is shared with BL, and where PL is parallel to WL, in accordance with at least one embodiment.

FIG. 40 illustrates unit cell 4000 with gain transistor and where SL is shared with BL, and where PL is parallel to WL, in accordance with at least one embodiment. In at least one embodiment, unit cell 4000 is similar to unit cell 2600. Here, WL is parallel to PL in accordance with at least one example. In at least one embodiment, WL and PL are orthogonal to local bit-line LBL0 and/or global bit-line BL0.

Figure 41:
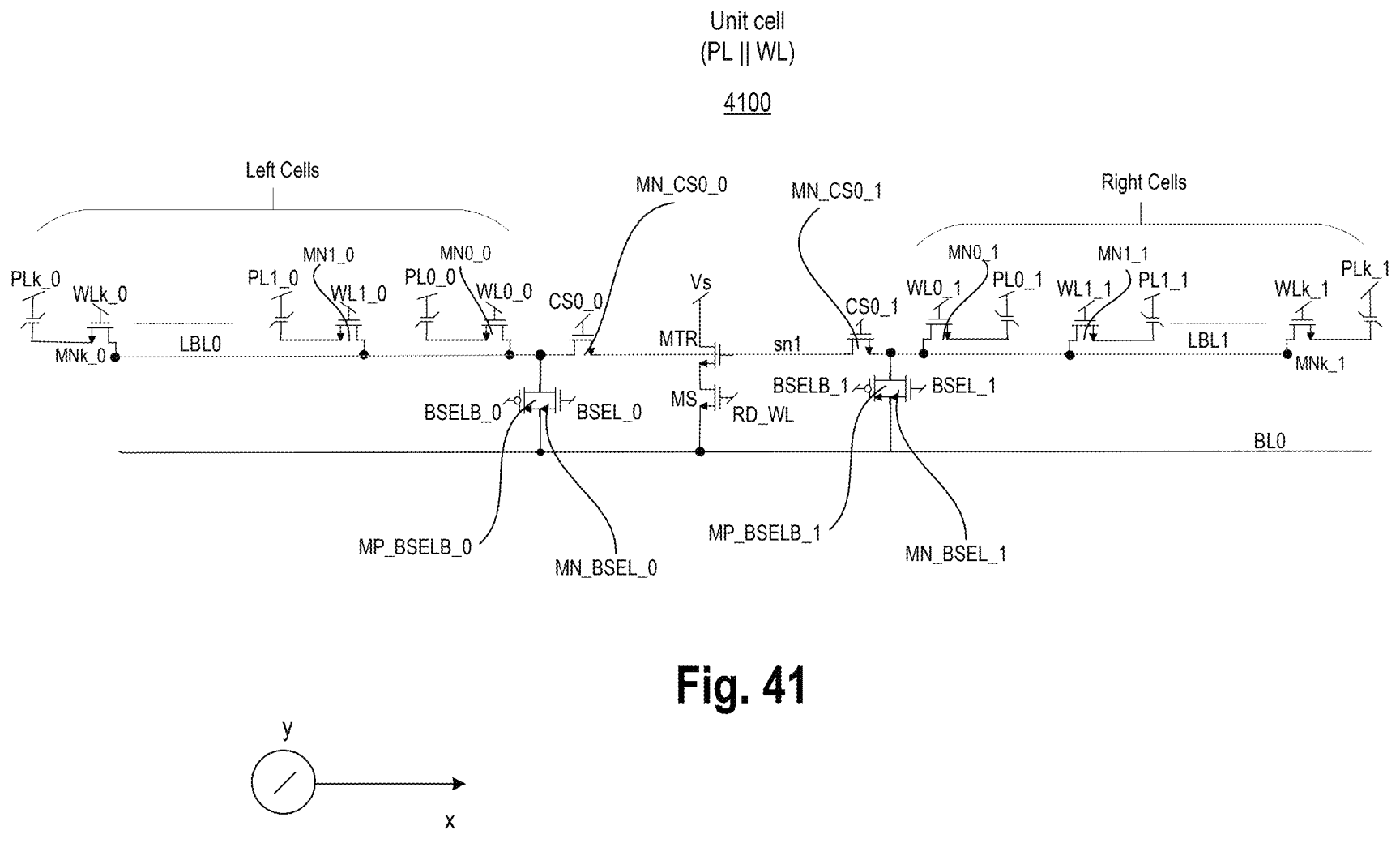

FIG. 41 illustrates unit cell 4100 with two sets of plurality of memory bit-cells like FIG. 40 but with shared SL, and where PL is parallel to WL, in accordance with at least one embodiment. In at least one embodiment, unit cell 4100 is similar to unit cell 2700. Here, WL is parallel to PL, in accordance with at least one example. In at least one embodiment, WL and PL are orthogonal to local bit-line LBL0 and/or global bit-line BL0.

Figure 42:
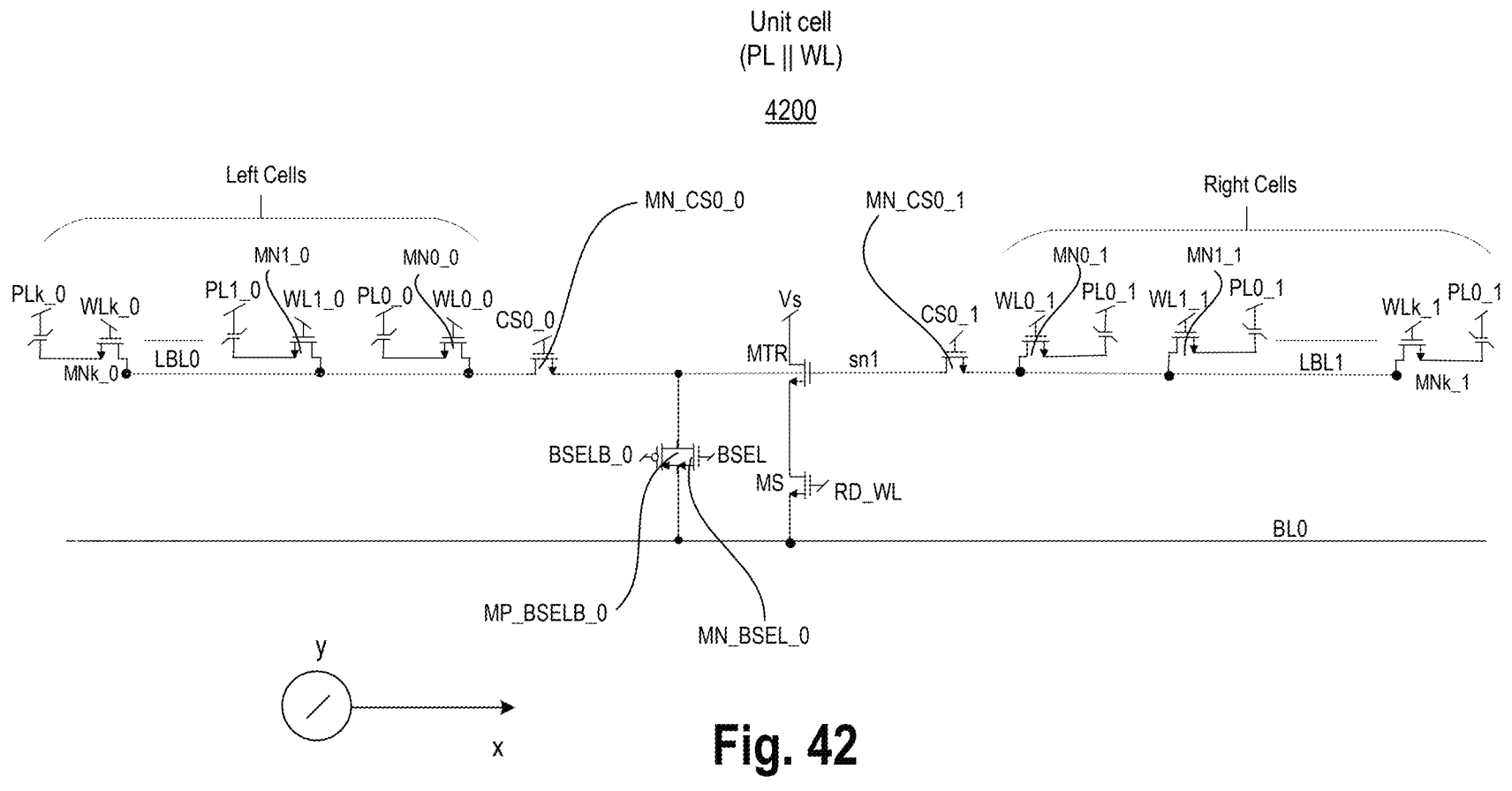

FIG. 42 illustrates unit cell 4200 with two sets of plurality of memory bit-cells like FIG. 41 but with shared SL and one conductivity pass-gate for column selection per set of plurality of bit-cells, and where PL is parallel to WL, in accordance with at least one embodiment. In at least one embodiment, unit cell 4200 is similar to unit cell 2800. Here, WL is parallel to PL in accordance with at least one example. In at least one embodiment, WL and PL are orthogonal to local bit-line LBL0 and/or global bit-line BL0.

Figure 43:
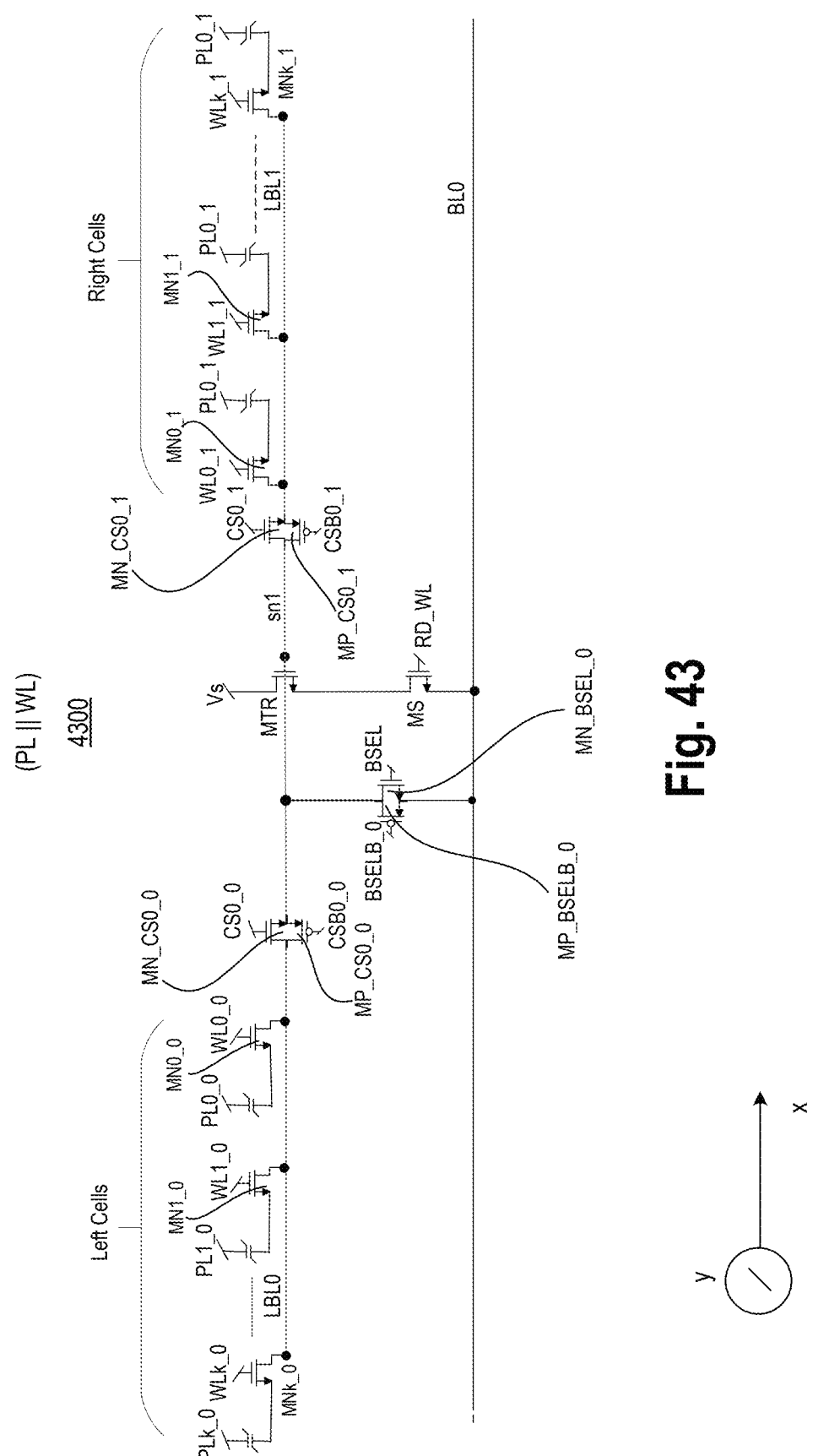
FIG. 43 illustrates a unit cell with two sets of plurality of memory bit-cells like FIG. 42, but with shared SL, where column select transistors are pass-gates, and where PL is parallel to WL, in accordance with at least one embodiment.

FIG. 43 illustrates unit cell 4300 with two sets of plurality of memory bit-cells like FIG. 42 but with shared SL, where column select transistors are pass-gates, and where PL is parallel to WL, in accordance with at least one embodiment. In at least one embodiment, unit cell 4300 is similar to unit cell 2900. Here, WL is parallel to PL. In at least one embodiment, WL and PL are orthogonal to local bit-line LBL0 and/or global bit-line BL0.

Figure 44:
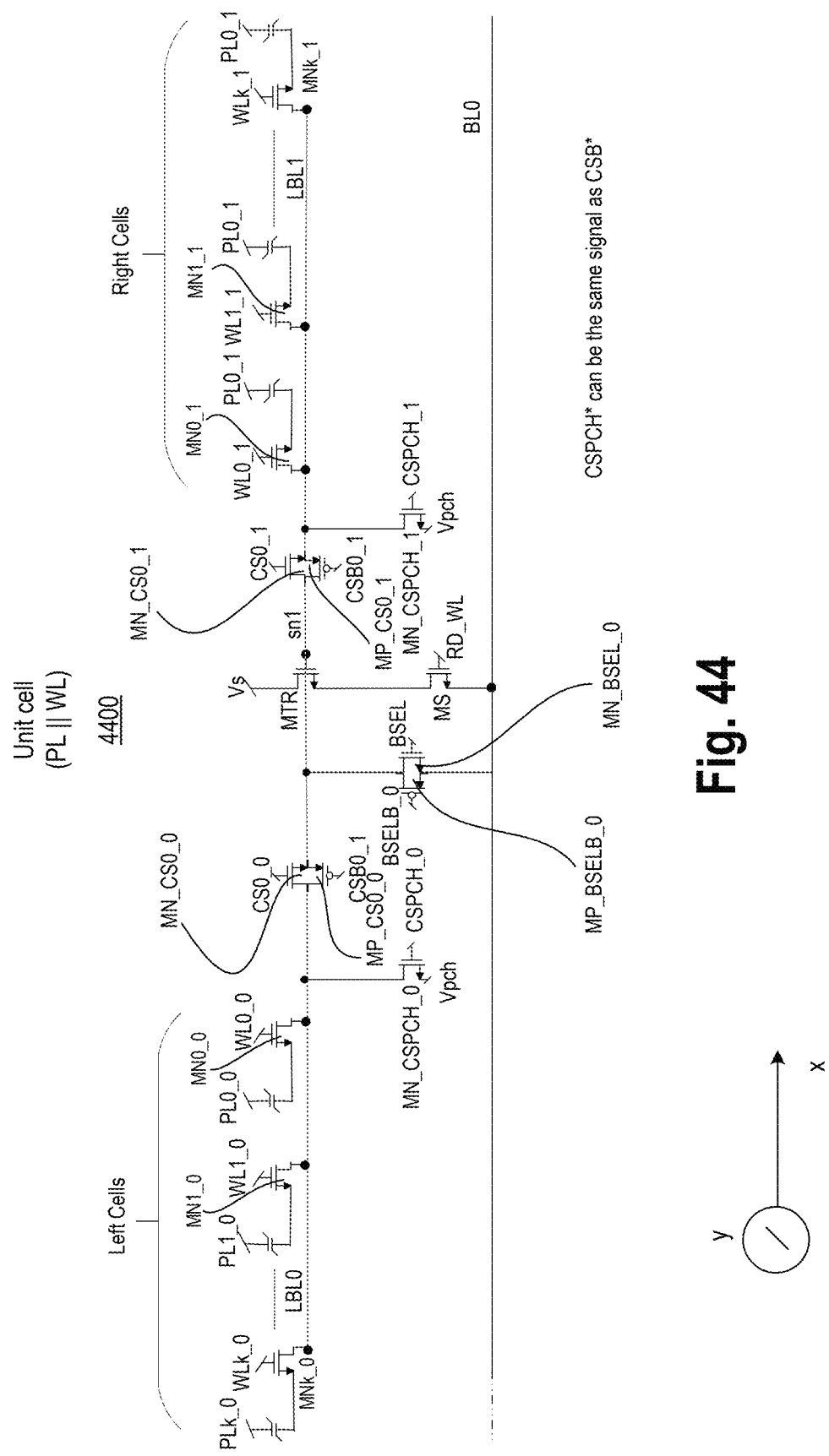
FIG. 44 illustrates a unit cell which is similar to unit cell of FIG. 43, but with pre-charge transistors for pre-charging respective local bit-lines, in accordance with at least one embodiment.

FIG. 44 illustrates unit cell 4400 which is similar to unit cell of FIG. 43. Here, pre-charge transistors are used for pre-charging respective local bit-lines, in accordance with at least one embodiment. In at least one embodiment, unit cell 4400 is similar to unit cell 3000 in features and function. Here, WL is parallel to PL, in accordance with at least one example. In at least one embodiment, WL and PL are orthogonal to local bit-line LBL0 and/or global bit-line BL0.

Figure 45:
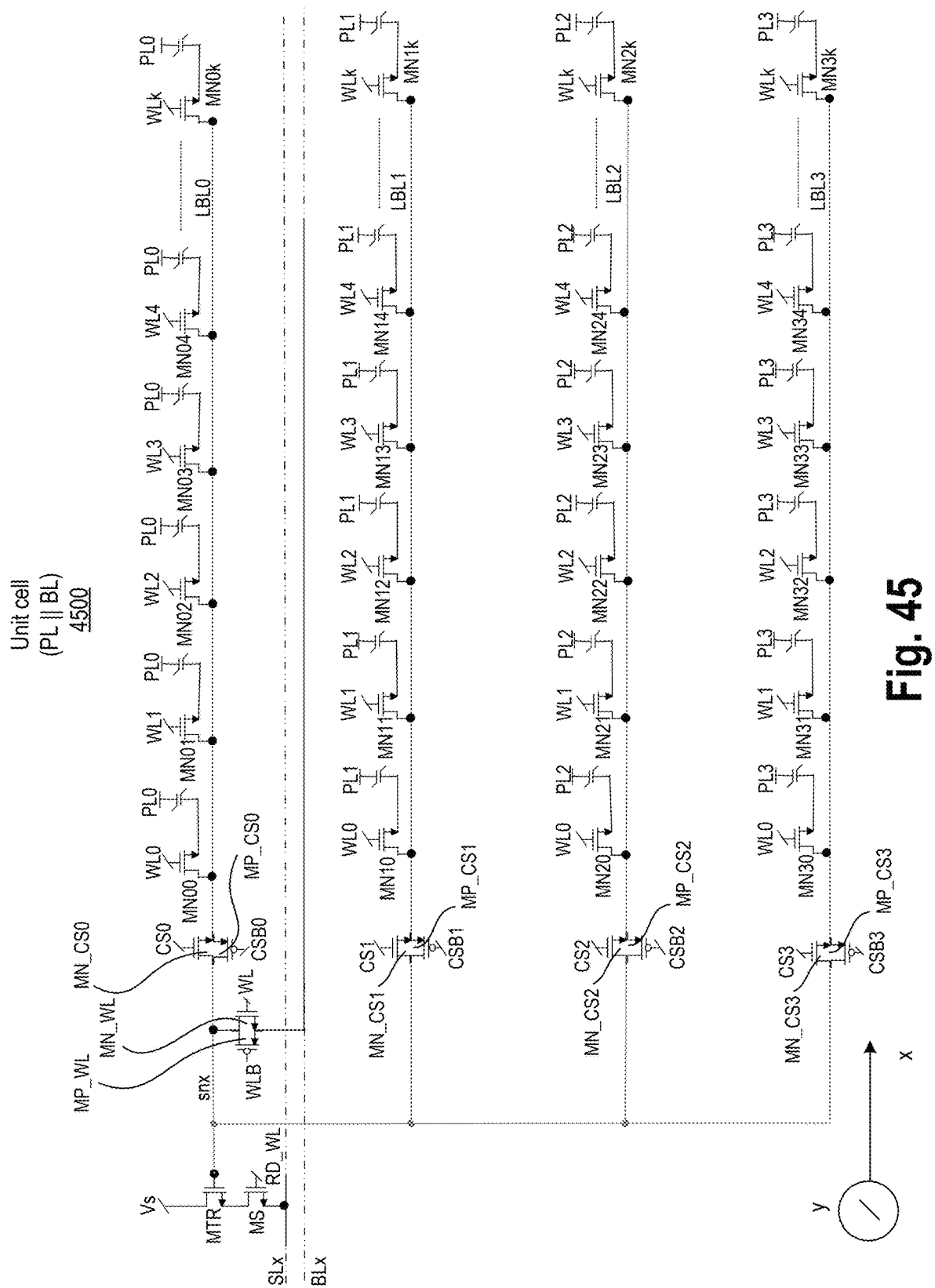
FIG. 45 illustrates a unit cell with multiple sets of plurality of memory bit-cells that are multiplexed to couple one local bit-line from a set of plurality of memory bit-cells to a global bit-line, where the unit cell includes a gate transistor, where PL is parallel to WL, in accordance with at least one embodiment.

FIG. 45 illustrates unit cell 4500 with multiple sets of plurality of memory bit-cells that are multiplexed to couple one local bit-line from a set of plurality of memory bit-cells to a global bit-line, where the unit cell includes a gate transistor, where PL is parallel to WL, in accordance with at least one embodiment. In at least one embodiment, multiple rows of plurality of bit-cells are provided which can selectively couple to sense line and global bit-line BLx. In this example, four rows of multiple bit-cells are shown, but any number of rows may be used and more levels of multiplexing can be added to select a row of bit-cells and eventually a bit-cell. In at least one embodiment, each row of plurality of memory bit-cells is coupled to a local bit-line. In at least one embodiment, each local bit-line is coupled to a column multiplexer (e.g., a transmission gate).

In at least one embodiment, first column multiplexer comprises p-type transistor MP_CS0 and n-type transistor MN_CS0 coupled in parallel and also coupled to first local bit-line LBL0 and node snx. In at least one embodiment, p-type transistor MP_CS0 is controllable by CSB0 and n-type transistor MN_CS0 is controllable by CS0, which is an inverse of CSB0. In at least one embodiment, second column multiplexer comprises p-type transistor MP_CS1 and n-type transistor MN_CS1 coupled in parallel and also coupled to second local bit-line LBL1 and node snx. In at least one embodiment, p-type transistor MP_CS1 is controllable by CSB1 and n-type transistor MN_CS1 is controllable by CS1, which is an inverse of CSB1. In at least one embodiment, third column multiplexer comprises p-type transistor MP_CS2 and n-type transistor MN_CS2 coupled in parallel and also coupled to second local bit-line LBL2 and node snx. In at least one embodiment, p-type transistor MP_CS2 is controllable by CSB2 and n-type transistor MN_CS2 is controllable by CS2, which is an inverse of CSB2. In at least one embodiment, fourth column multiplexer comprises p-type transistor MP_CS3 and n-type transistor MN_CS3 coupled in parallel and also coupled to second local bit-line LBL3 and node snx. In at least one embodiment, p-type transistor MP_CS3 is controllable by CSB3 and n-type transistor MN_CS3 is controllable by CS3, which is an inverse of CSB3.

In at least one embodiment, first plurality of memory bit-cells includes 'k' number of 1T1C cells. In at least one embodiment, 'k' bit-cells includes bit-cell with n-type transistor MN00 controlled by word-line WL0, and associated coupled capacitor coupled to plate-line PL0, bit-cell with n-type transistor MN01 controlled by word-line WL1, and associated coupled capacitor coupled to plate-line PL0, bit-cell with n-type transistor MN02 controlled by word-line WL2, and associated coupled capacitor coupled to plate-line PL0, bit-cell with n-type transistor MN03 controlled by word-line WL3, and associated coupled capacitor coupled to plate-line PL0, bit-cell with n-type transistor MN04 controlled by word-line WL4, and associated coupled capacitor coupled to plate-line PL0, . . . and bit-cell with n-type transistor MN0k controlled by word-line WLk, and associated coupled capacitor coupled to plate-line PL0.

In at least one embodiment, second plurality of memory bit-cells includes 'k' number of 1T1C cells. In at least one embodiment, 'k' bit-cells includes bit-cell with n-type transistor MN10 controlled by word-line WL0, and associated coupled capacitor coupled to plate-line PL1, bit-cell with n-type transistor MN11 controlled by word-line WL1, and associated coupled capacitor coupled to plate-line PL1, bit-cell with n-type transistor MN12 controlled by word-line WL2, and associated coupled capacitor coupled to plate-line PL1, bit-cell with n-type transistor MN13 controlled by word-line WL3, and associated coupled capacitor coupled to plate-line PL1, bit-cell with n-type transistor MN14 controlled by word-line WL4, and associated coupled capacitor coupled to plate-line PL1, . . . and bit-cell with n-type transistor MN1k controlled by word-line WLk, and associated coupled capacitor coupled to plate-line PL1.

In at least one embodiment, third plurality of memory bit-cells includes 'k' number of 1T1C cells. In at least one embodiment, 'k' bit-cells includes bit-cell with n-type transistor MN20 controlled by word-line WL0, and associated coupled capacitor coupled to plate-line PL2, bit-cell with n-type transistor MN21 controlled by word-line WL1, and associated coupled capacitor coupled to plate-line PL2, bit-cell with n-type transistor MN22 controlled by word-line WL2, and associated coupled capacitor coupled to plate-line PL2, bit-cell with n-type transistor MN23 controlled by word-line WL3, and associated coupled capacitor coupled to plate-line PL2, bit-cell with n-type transistor MN24 controlled by word-line WL4, and associated coupled capacitor coupled to plate-line PL2, . . . and bit-cell with n-type transistor MN2k controlled by word-line WLk, and associated coupled capacitor coupled to plate-line PL2.

In at least one embodiment, fourth plurality of memory bit-cells includes 'k' number of 1T1C cells. In at least one embodiment, 'k' bit-cells includes bit-cell with n-type transistor MN30 controlled by word-line WL0, and associated coupled capacitor coupled to plate-line PL3, bit-cell with n-type transistor MN31 controlled by word-line WL1, and associated coupled capacitor coupled to plate-line PL3, bit-cell with n-type transistor MN32 controlled by word-line WL2, and associated coupled capacitor coupled to plate-line PL3, bit-cell with n-type transistor MN33 controlled by word-line WL3, and associated coupled capacitor coupled to plate-line PL3, bit-cell with n-type transistor MN34 controlled by word-line WL4, and associated coupled capacitor coupled to plate-line PL3, . . . and bit-cell with n-type transistor MN3k controlled by word-line WLk, and associated coupled capacitor coupled to plate-line PL3.

In at least one embodiment, each column multiplexer is coupled to a word-line selection circuitry (e.g., a transmission gate). In at least one embodiment, word-line selection circuitry comprises p-type transistor MP_WL and n-type transistor MN_WL coupled in parallel and also coupled to node snx and global bit-line BLx. In at least one embodiment, node snx is selectively coupled to a local bit-line (e.g., one of LBL0, LBL1, LBL2, and LBL3). In at least one embodiment, node snx is coupled to gain circuitry. In at least one embodiment, gain circuitry comprises gain transistor MTR and series transistor MS.

In at least one embodiment, gain transistor MTR is coupled to reference Vs and is also coupled in series with series transistor MS which is controllable by read word-line RD_WL. In at least one embodiment, gain transistor MTR is coupled to sense line SLx while switch transistor is coupled to reference Vs and read word-line RD_WL. In at least one embodiment, series transistor MS is much smaller in size than gain transistor MTR, and so negligible parasitic capacitance is added to global bit-line BL0. Due to lower capacitance on global bit-line BL0 than local bit-lines (e.g., LBL0, LBL1, LBL2, and LBL3), polarization targets for capacitors of memory bit-cells are reduced allowing operation of memory at lower power supply (e.g., 1V or less).

Figure 46:
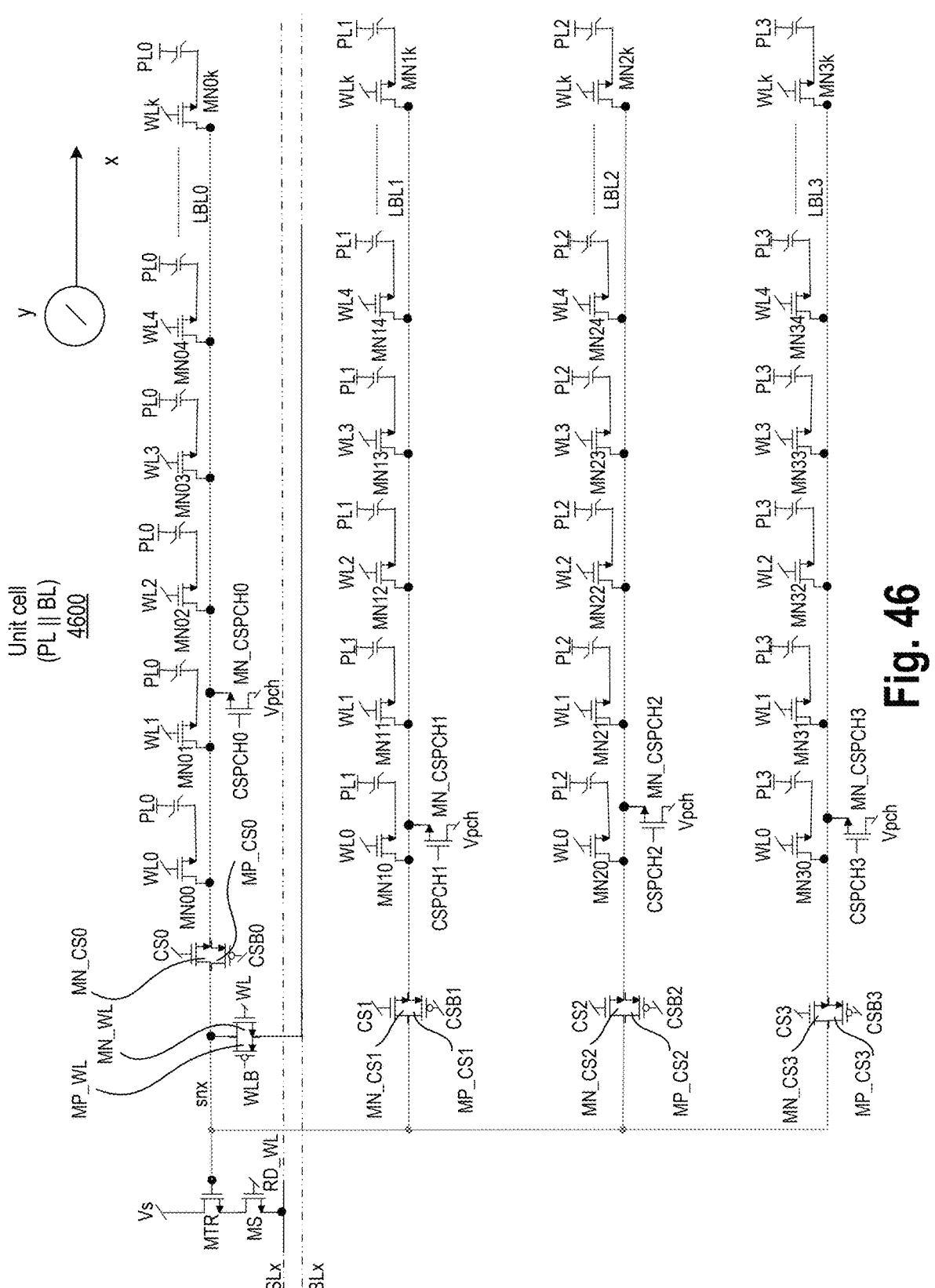
FIG. 46 illustrates a unit cell similar to FIG. 45, where an individual set of plurality of memory bit-cells includes a pre-charge transistor coupled to an individual local bit-line, in accordance with at least one embodiment.

FIG. 46 illustrates unit cell 4600 similar to FIG. 45 where an individual set of plurality of memory bit-cells includes a pre-charge transistor coupled to an individual local bit-line, in accordance with at least one embodiment. In at least one embodiment, first pre-charge n-type transistor MN_CSPCH0 is coupled to first local bit-line LBL0. In at least one embodiment, first pre-charge n-type transistor MN_CSPCH0 is controllable by signal CSPCH0, which is inverse of signal CS0. In at least one embodiment, first pre-charge n-type transistor MN_CSPCH0 has a source or drain terminal coupled to pre-charge voltage Vpch which can be a pre-determined or programmable voltage. In at least one embodiment, when first local bit-line LBL0 is not selected to couple to node snx by first column multiplexer, first local bit-line LBL0 is pre-charged by pre-charge n-type transistor MN_CSPCH0 to pre-charge voltage Vpch.

In at least one embodiment, second pre-charge n-type transistor MN_CSPCH1 is coupled to second local bit-line LBL1. In at least one embodiment, second pre-charge n-type transistor MN_CSPCH1 is controllable by signal CSPCH1, which is inverse of signal CS1. In at least one embodiment, second pre-charge n-type transistor MN_CSPCH1 has a source or drain terminal coupled to pre-charge voltage Vpch which can be a pre-determined or programmable voltage. In at least one embodiment, when second local bit-line LBL1 is not selected to couple to node snx by second column multiplexer, second local bit-line LBL1 is pre-charged by pre-charge n-type transistor MN_CSPCH1 to pre-charge voltage Vpch.

In at least one embodiment, third pre-charge n-type transistor MN_CSPCH2 is coupled to third local bit-line LBL2. In at least one embodiment, third pre-charge n-type transistor MN_CSPCH2 is controllable by signal CSPCH2, which is inverse of signal CS2. In at least one embodiment, third pre-charge n-type transistor MN_CSPCH2 has a source or drain terminal coupled to pre-charge voltage Vpch which can be a pre-determined or programmable voltage. In at least one embodiment, when third local bit-line LBL2 is not selected to couple to node snx by third column multiplexer, third local bit-line LBL2 is pre-charged by pre-charge n-type transistor MN_CSPCH2 to pre-charge voltage Vpch.

In at least one embodiment, fourth pre-charge n-type transistor MN_CSPCH3 is coupled to fourth local bit-line LBL3. In at least one embodiment, fourth pre-charge n-type transistor MN_CSPCH3 is controllable by signal CSPCH3, which is inverse of signal CS3. In at least one embodiment, fourth pre-charge n-type transistor MN_CSPCH3 has a source or drain terminal coupled to pre-charge voltage Vpch which can be a pre-determined or programmable voltage. In at least one embodiment, when fourth local bit-line LBL3 is not selected to couple to node snx by fourth column multiplexer, fourth local bit-line LBL3 is pre-charged by pre-charge n-type transistor MN_CSPCH3 to pre-charge voltage Vpch.

Figure 47:
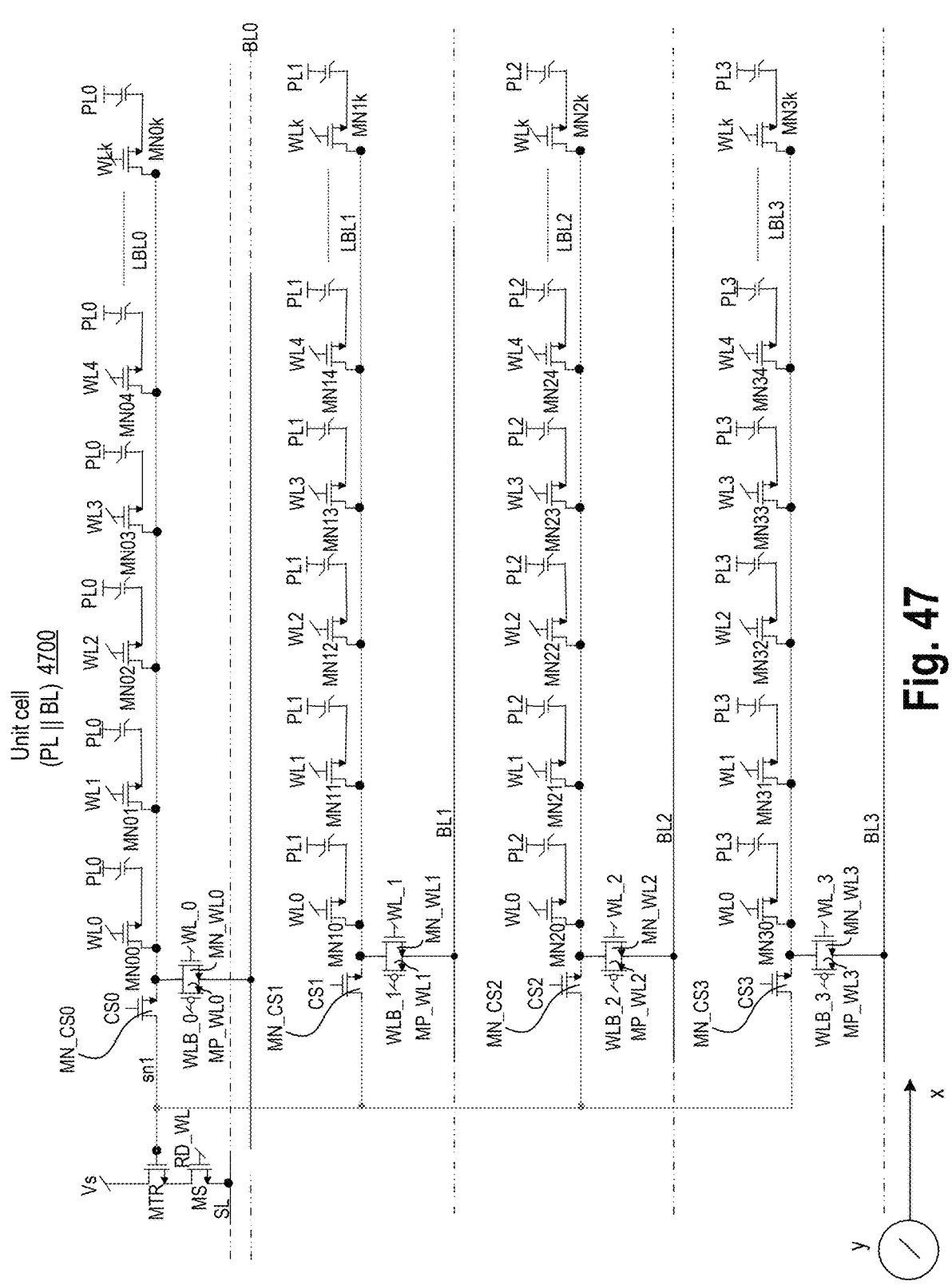
FIG. 47 illustrates a unit cell similar to FIG. 45, where bit-line coupling transistor is coupled to a set of plurality of memory bit-cells before an individual column select transistor is coupled to a gain transistor, in accordance with at least one embodiment.

FIG. 47 illustrates unit cell 4700 similar to FIG. 45 where bit-line coupling transistor is coupled to a set of plurality of memory bit-cells before an individual column select transistor is coupled to a gain transistor, in accordance with at least one embodiment. Here, column multiplexer transmission gates are replaced with pass-gates, in accordance with at least one embodiment. In at least one embodiment, first column multiplexer comprises n-type transistor MN_CS0 coupled to first local bit-line LBL0 and node sn1, where n-type transistor MN_CS0 is controllable by signal CS0. In at least one embodiment, second column multiplexer comprises n-type transistor MN_CS1 coupled to second local bit-line LBL1 and node sn1, where n-type transistor MN_CS1 is controllable by signal CS1. In at least one embodiment, third column multiplexer comprises n-type transistor MN_CS2 coupled to third local bit-line LBL2 and node sn1, where n-type transistor MN_CS2 is controllable by signal CS2. In at least one embodiment, fourth column multiplexer comprises n-type transistor MN_CS3 coupled to fourth local bit-line LBL3 and node sn1, where n-type transistor MN_CS3 is controllable by signal CS3.

In at least one embodiment, bit-line selection circuitry is coupled to local bit-line instead of node sn1. In at least one embodiment, first bit-selection circuitry comprises first bit-selection transmission gate coupled to local bit-load LBL0 and first global bit-line BL0. In at least one embodiment, first bit-selection circuitry comprises p-type transistor MP_WL0 and n-type transistor MN_WL0 coupled in parallel. In at least one embodiment, p-type transistor MP_WL0 is controllable by signal WLB_0. In at least one embodiment, n-type transistor MN_WL0 is controllable by signal WL_0, which is an inverse of WLB_0.

In at least one embodiment, second bit-selection circuitry comprises second bit-selection transmission gate coupled to local bit-load LBL1 and first global bit-line BL1. In at least one embodiment, second bit-selection circuitry comprises p-type transistor MP_WL1 and n-type transistor MN_WL1 coupled in parallel. In at least one embodiment, p-type transistor MP_WL1 is controllable by signal WLB_1. In at least one embodiment, n-type transistor MN_WL1 is controllable by signal WL_1, which is an inverse of WLB_1.

In at least one embodiment, third bit-selection circuitry comprises third bit-selection transmission gate coupled to local bit-load LBL2 and first global bit-line BL2. In at least one embodiment, third bit-selection circuitry comprises p-type transistor MP_WL2 and n-type transistor MN_WL2 coupled in parallel. In at least one embodiment, p-type transistor MP_WL2 is controllable by signal WLB_2. In at least one embodiment, n-type transistor MN_WL2 is controllable by signal WL_2, which is an inverse of WLB_2.

In at least one embodiment, fourth bit-selection circuitry comprises fourth bit-selection transmission gate coupled to local bit-load LBL3 and first global bit-line BL3. In at least one embodiment, fourth bit-selection circuitry comprises p-type transistor MP_WL3 and n-type transistor MN_WL3 coupled in parallel. In at least one embodiment, p-type transistor MP_WL3 is controllable by signal WLB_3. In at least one embodiment, n-type transistor MN_WL3 is controllable by signal WL_3, which is an inverse of WLB_3.

Figure 48:
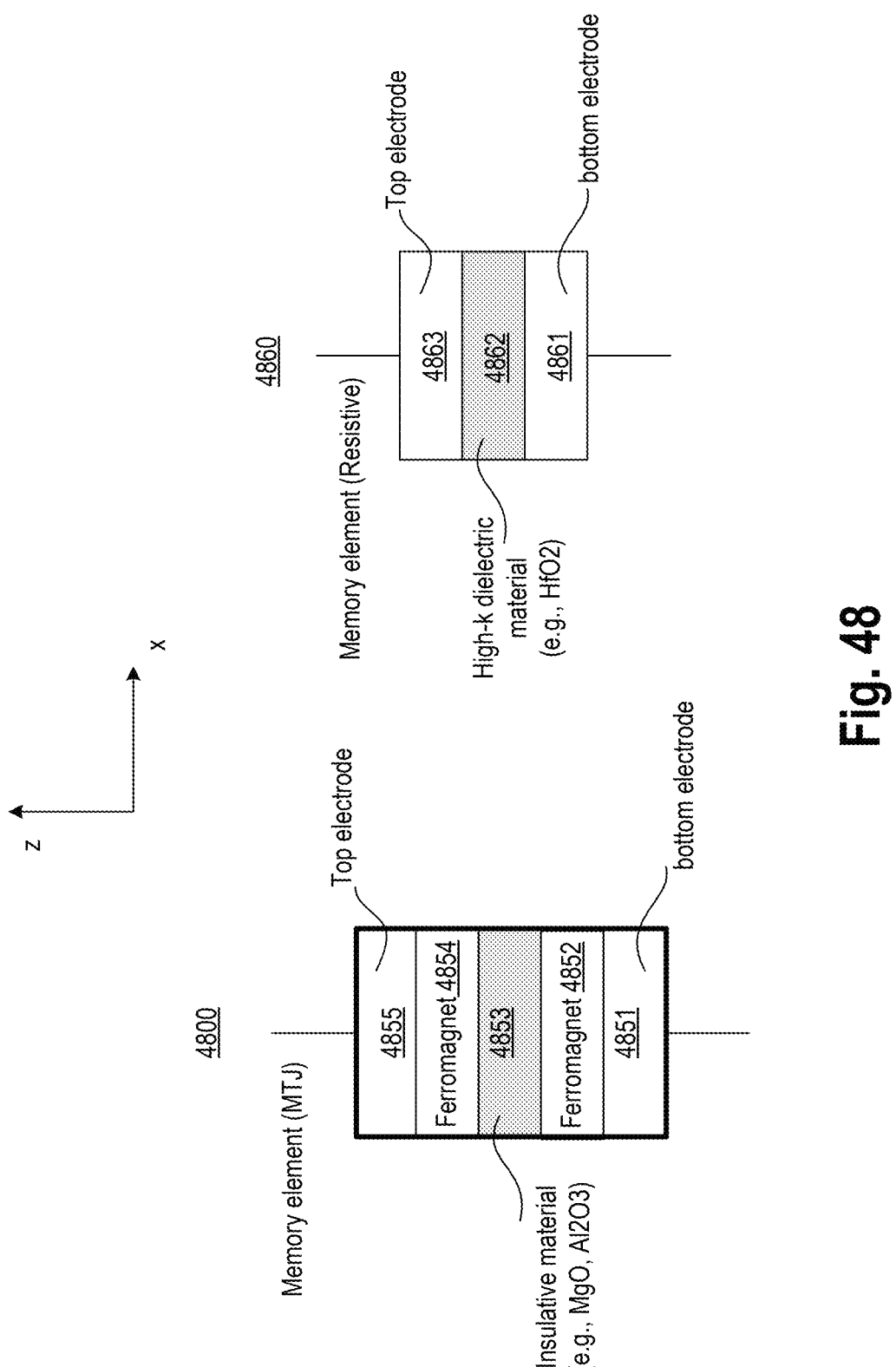
FIG. 48 illustrates memory elements (MEs) for use in memory bit-cells, in accordance with at least one embodiment.

FIG. 48 illustrates memory elements (MEs) for use in memory bit-cells, in accordance with at least one embodiment. In at least one embodiment, planar memory element structures are resistive elements. In at least one embodiment, planar memory element structures are magnetic tunnel junctions (MTJs). In at least one embodiment, planar memory element structures are phase change memory (PCM) memories.

In at least one embodiment, MTJ 4800 comprises a bottom electrode 4851, free ferromagnetic layer 4852, insulative material 4853 (e.g., tunnel barrier materials such as MgO, $Al_2O_3$, or $SrTiO_3$), fixed ferromagnetic layer 4854, and top electrode 4855. In at least one embodiment, free ferromagnetic layer 4852 comprises one or more of CrO2, Heusler alloys, Fe, or CoFeB. In at least one embodiment, insulative material 4853 (also referred to as tunnel barrier) includes one of: MgO, AlOx (where x is a number or fraction), or $SrTiO_3$. In at least one embodiment, fixed ferromagnetic layer 4854 includes one of $CrO_2$, Heusler alloys, FeCo(001) or CoFeB. In at least one embodiment, an anti-ferromagnetic layer (not shown) is formed over fixed ferromagnetic layer 4854. In at least one embodiment, anti-ferromagnetic (AFM) layer comprises Ru or Ir. In at least one embodiment, AFM layer comprises a super lattice of Co and Pt coupled with Ru or Ir. In at least one embodiment, bottom electrode 4851 and top electrode 4855 includes one or more of: Al, Ti, Cu, Ag, Pt, TiN, TaN, Al doped ZnO, Ga-doped ZnO, or Indium tin oxide (ITO). In at least one embodiment, bottom electrode 4851 and top electrode 4855 are symmetric. In at least one embodiment, bottom electrode 4851 and top electrode 4855 are asymmetric. In at least one embodiment, bottom electrode 4851 and top electrode 4855 may have same materials as those discussed with reference to electrodes in FIG. 4B.

In at least one embodiment, resistive memory 4860 (Re-RAM) comprises bottom electrode 4861, insulative material 4862, and top electrode 4863. In at least one embodiment, insulative material 4862 includes: $HfO_x$, $TiO_x$, $TaO_x$, NiO, $ZnO_x$, $Zn_2TiO_4$, $KnO_x$, MgO, $AlO_x$, $ZrO_x$, $Cu_xO_y$, $SnO_z$, $GeO_x$, $LaO_x$, $YO_x$, $MoO_x$, or $CoO_x$ (where 'x' and 'y' are a number or a fraction). In at least one embodiment, insulative material 4862 for ReRAM includes oxides of: Mg, Ce, Y, La, Ti, Zr, Hf, V, Nb, Tn, Cr, Mo, W, Mn, Fe, Gd, Co, Ni, Cu, Zn, Al, Ga, Si, Ge, Sn, Yb, or Lu. In at least one embodiment, bottom electrode 4861 and top electrode 4863 includes one or more of: Al, Ti, Cu, Ag, Pt, TiN, TaN, Al doped ZnO, Ga-doped ZnO, or Indium tin oxide (ITO). In at least one embodiment, bottom electrode 4861 and top electrode 4863 are symmetric. In at least one embodiment, bottom electrode 4861 and top electrode 4863 are asymmetric. In at least one embodiment, bottom electrode 4861 and top electrode 4863 may have same materials as those discussed with reference to electrodes in FIG. 4B.

In at least one embodiment, in ReRAM systems that use forming of filaments, an initial operation may begin by applying a voltage pulse with an increasing magnitude, between top electrode 4863 and bottom electrode 4861. In at least one embodiment, magnitude of voltage pulse may be substantially greater than a voltage level utilized to cycle ReRAM device during regular course of programming. In at least one embodiment, a high voltage pulse may be utilized to perform an intentional one-time breakdown process, known as forming. In at least one embodiment, forming process creates one or more conductive filaments that provide pathways for electron transport during device operation.

In at least one embodiment, resistive memory 4860 is a phase-change memory (PC-RAM). In at least one embodiment, resistive memory 4860 comprises bottom electrode 4861, insulative material 4862, and top electrode 4863. In at least one embodiment, insulative material 4862 is a phase-change material. In at least one embodiment, phase-change material comprises phase-change chalcogenides. In at least one embodiment, phase-change material includes one of: $(GeTe)m(Sb_2Te_3)n$, $Ge_2Sb_2Te_5$, $Ge_2Sb_2Te_4$, AgInSbTe, super lattices of GeTe, $Sb_2Te_3$, super lattices of $TiTe_2$ and $Sb_2Te_3$, $WSe_2$, $WS_2$, or $PtSe_2$ (where m and n are numbers or fractions). In at least one embodiment, phase-change material includes binary transition metal oxides such as NiO or $TiO_2$, perovskites such as $Sr(Zr)TiO_3$ or PCMO, solid-state electrolytes such as GeS, GeSe, $SiO_x$, or $Cu_2S$, organic materials such as AlDCN, or layered materials, such as hexagonal boron nitride.

In at least one embodiment, when ME structures are not capacitors (as those described with reference to at least one embodiment herein), current based pulsing scheme(s) are used to drive (e.g., write) and for sensing (e.g., read). In at least one embodiment, plate-lines flow current to configure or read ME structures. In at least one embodiment, ME structures may be a mix of various types of ME structures (e.g., ferroelectric based capacitors, paraelectric based capacitors, MTJ, ReRAM, or PC-RAM). In at least one embodiment, all ME structures for an array are of the same type.

Figure 49:
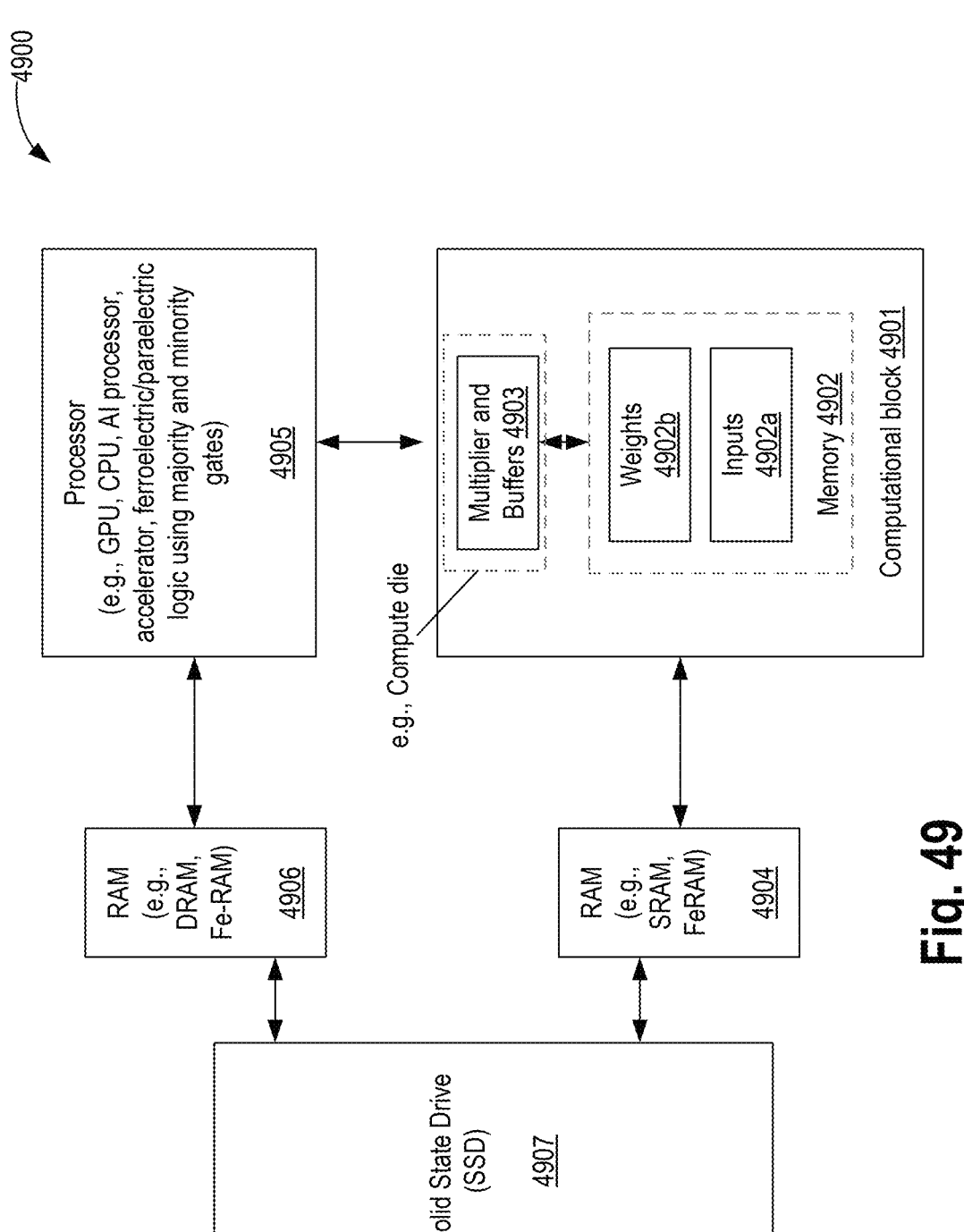
FIG. 49 illustrates a high-level architecture of an artificial intelligence (AI) machine comprising a compute die stacked over a memory die, where the memory die includes memory arrays with bit-cells according to any memory bit-cells described herein, in accordance with at least one embodiment.

FIG. 49 illustrates a high-level architecture of an artificial intelligence (AI) machine comprising a compute die stacked over a memory die, where the memory die includes memory arrays with bit-cells according to any memory bit-cells described herein, in accordance with at least one embodiment. In at least one embodiment, AI machine 4900 comprises computational block 4901 or processor having random-access memory (RAM) 4902 and multiplier and buffers 4903; first random-access memory 4904 (e.g., static RAM (SRAM), ferroelectric or paraelectric RAM (FeRAM), ferroelectric or paraelectric static random-access memory (FeSRAM)), main processor 4905, second random-access memory 4906 (dynamic RAM (DRAM), FeRAM), and solid-state memory or drive (SSD) 4907. In at least one embodiment, some or all components of AI machine 4900 are packaged in a single package forming a system-on-chip (SoC). In at least one embodiment, SoC can be configured as a logic-on-logic configuration, which can be in a 3D configuration or a 2.5D configuration.

In at least one embodiment, computational block 4901 is packaged in a single package and then coupled to processor 4905 and memories 4904, 4906, and 4907 on a printed circuit board (PCB). In at least one embodiment, computational block 4901 is configured as a logic-on-logic configuration, which can be in a 3D configuration or a 2.5D configuration. In at least one embodiment, computational block 4901 comprises a special purpose compute die 4903 or microprocessor. In at least one embodiment, compute die 4903 is a compute chiplet that performs a function of an accelerator or inference. In at least one embodiment, memory 4902 is DRAM which forms a special memory/cache for special purpose compute die 4903. In at least one embodiment, DRAM can be embedded DRAM (eDRAM) such as 1T1C (one transistor and one capacitor) based memories. In at least one embodiment, RAM 4902 is ferroelectric or paraelectric RAM (Fe-RAM).

In at least one embodiment, compute die 4903 is specialized for applications such as Artificial Intelligence, graph processing, and algorithms for data processing. In at least one embodiment, compute die 4903 further has logic computational blocks, for multipliers and buffers, a special data memory block (e.g., buffers) comprising DRAM, FeRAM, or a combination of them. In at least one embodiment, RAM

4902 has weights and inputs stored to improve computational efficiency. In at least one embodiment, interconnects between processor 4905 (also referred to as special purpose processor), first RAM 4904, and compute die 4903 are optimized for high bandwidth and low latency. In at least one embodiment, architecture of FIG. 49 allows efficient packaging to lower energy, power, or cost, and provides for ultra-high bandwidth between RAM 4904 and compute chiplet 4903 of computational block 4901.

In at least one embodiment, RAM 4902 is partitioned to store input data (or data to be processed) 4902a and weight factors 4902b. In at least one embodiment, input data 4902a is stored in a separate memory (e.g., separate memory die) and weight factors 4902b are stored in a separate memory (e.g., separate memory die).

In at least one embodiment, computational logic or compute chiplet 4903 comprises matrix multiplier, adder, concatenation logic, buffers, and combinational logic. In at least one embodiment, compute chiplet 4903 performs multiplication operation on inputs 4902a and weights 4902b. In at least one embodiment, weights 4902b are fixed weights. In at least one embodiment, processor 4905 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes weights for a training model. Once weights are computed, they are stored in memory 4902. In at least one embodiment, input data that is to be analyzed using a trained model is processed by computational block 4901 with computed weights 4902b to generate an output (e.g., a classification result).

In at least one embodiment, first RAM 4904 is ferroelectric or paraelectric based SRAM. For example, a six transistor (6T) SRAM bit-cell having ferroelectric or paraelectric transistors is used to implement a non-volatile FeSRAM. In at least one embodiment, SSD 4907 comprises NAND flash cells. In at least one embodiment, SSD 4907 comprises NOR flash cells. In at least one embodiment, SSD 4907 comprises multi-threshold NAND flash cells.

In at least one embodiment, non-volatility of FeRAM is used to introduce new features such as security, functional safety, and faster reboot time of AI machine 4900. In at least one embodiment, non-volatile FeRAM is a low power RAM that provides fast access to data and weights. FeRAM 4904 can also serve as fast storage for computational block 4901 (which can be an inference die or an accelerator), which typically has low capacity and fast access requirements.

In at least one embodiment, FeRAM (FeDRAM or FeSRAM) includes ferroelectric or paraelectric material. In at least one embodiment, ferroelectric or paraelectric material may be in a transistor gate stack or in a capacitor of memory. In at least one embodiment, ferroelectric material can be any suitable low voltage FE material discussed herein. While at least one embodiment here is described with reference to ferroelectric material, at least one embodiment is applicable to any of nonlinear polar materials described herein.

Figure 50:
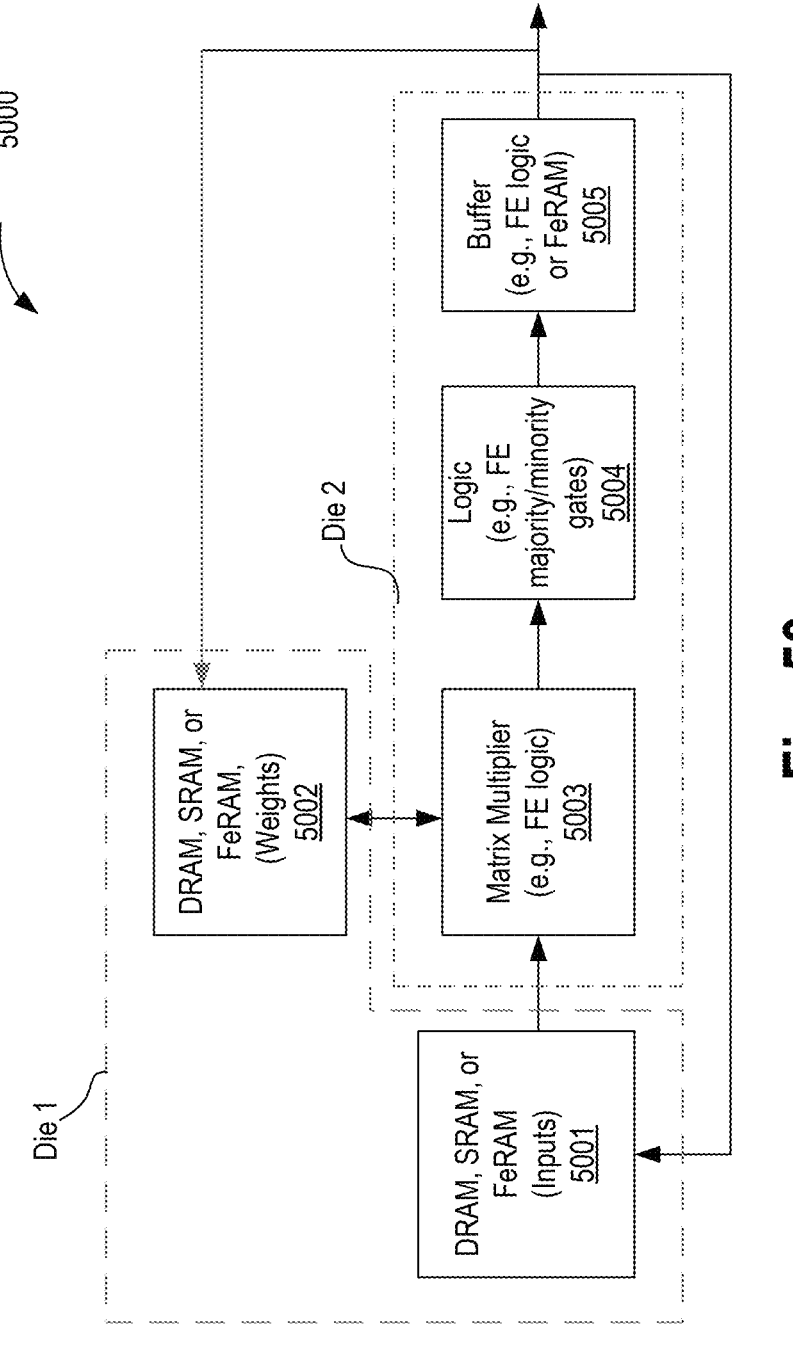
FIG. 50 illustrates an architecture of a computational block comprising a compute die stacked with a memory die, where the memory die includes memory arrays with bit-cells according to any memory bit-cells described herein, in accordance with at least one embodiment.

FIG. 50 illustrates an architecture of a computational block comprising a compute die stacked with a memory die, where the memory die includes memory arrays with bit-cells according to any memory bit-cells described herein, in accordance with at least one embodiment. In at least one embodiment, architecture of FIG. 50 illustrates an architecture for a special purpose compute die where RAM memory buffers for inputs and weights are split on die-1 and logic and optional memory buffers are split on die-2.

In at least one embodiment, memory die (e.g., Die 1) is positioned below compute die (e.g., Die 2) such that a heat sink or thermal solution is adjacent to compute die. In at least one embodiment, memory die is embedded in an interposer. In at least one embodiment, memory die behaves as an interposer in addition to its basic memory function. In at least one embodiment, memory die is a high bandwidth memory (HBM) which comprises multiple dies of memories in a stack and a controller to control read and write functions to stack of memory dies. In at least one embodiment, memory die comprises a first die to store input data and a second die to store weight factors. In at least one embodiment, memory die is a single die that is partitioned such that first partition 5001 of memory die is used to store input data and second partition 5002 of memory die is used to store weights. In at least one embodiment, memory die comprises DRAM. In at least one embodiment, memory die comprises FE-SRAM or FE-DRAM. In at least one embodiment, memory die comprises MRAM. In at least one embodiment, memory die comprises SRAM. In at least one embodiment, memory partitions 5001 and 5002, or memory dies 5001 and 5002 include one or more of: DRAM, FE-SRAM, FE-DRAM, SRAM, and/or MRAM. In at least one embodiment, input data stored in memory partition or die 5001 is data to be analyzed by a trained model with fixed weights stored in memory partition or die 5002.

In at least one embodiment, compute die comprises ferroelectric or paraelectric logic (e.g., majority, minority, and/or threshold gates) to implement matrix multiplier 5003, logic 5004, and temporary buffer 5005. In at least one embodiment, matrix multiplier 5003 performs multiplication operation on input data 'X' and weights 'W' to generate an output 'Y'. In at least one embodiment, this output may be further processed by logic 5004. In at least one embodiment, logic 5004 performs a threshold operation, pooling and drop out operations, and/or concatenation operations to complete AI logic primitive functions.

In at least one embodiment, output of logic 5004 (e.g., processed output 'Y') is temporarily stored in buffer 5005. In at least one embodiment, buffer 5005 is memory such as one or more of: DRAM, Fe-SRAM, Fe-DRAM, MRAM, resistive RAM (Re-RAM) and/or SRAM. In at least one embodiment, buffer 5005 is part of memory die (e.g., Die 1). In at least one embodiment, buffer 5005 performs function of a re-timer. In at least one embodiment, output of buffer 5005 (e.g., processed output 'Y') is used to modify weights in memory partition or die 5002. In at least one embodiment, architecture 5000 not only operates as an inference circuitry, but also as a training circuitry to train a model. In at least one embodiment, matrix multiplier 5003 includes an array of multiplier cells, wherein first partition 5001 (e.g., DRAMs) and second partition 5002 (e.g., DRAMs) include arrays of memory bit-cells, respectively, wherein each multiplier cell is coupled to a corresponding memory bit-cell of first partition 5001 (e.g., DRAMs) and second partition 5002 (e.g., DRAMs). In at least one embodiment, architecture 5000 comprises an interconnect fabric coupled to array of multiplier cells such that each multiplier cell is coupled to interconnect fabric.

In at least one embodiment, architecture 5000 provides reduced memory access for compute die (e.g., die 2) by providing data locality for weights, inputs, and outputs. In at least one embodiment, data from and to AI computational blocks (e.g., matrix multiplier 5003) is locally processed within a same packaging unit. In at least one embodiment, architecture 5000 also segregates memory and logic operations onto a memory die (e.g., Die 1) and a logic die (e.g., Die 2), respectively, allowing for optimized AI processing. In at least one embodiment, desegregated dies allow for improved yield of dies. In at least one embodiment, a high-capacity memory process for Die 1 allows reduction of power of external interconnects to memory, reduces cost of integration, and results in a smaller footprint.

Figure 51:
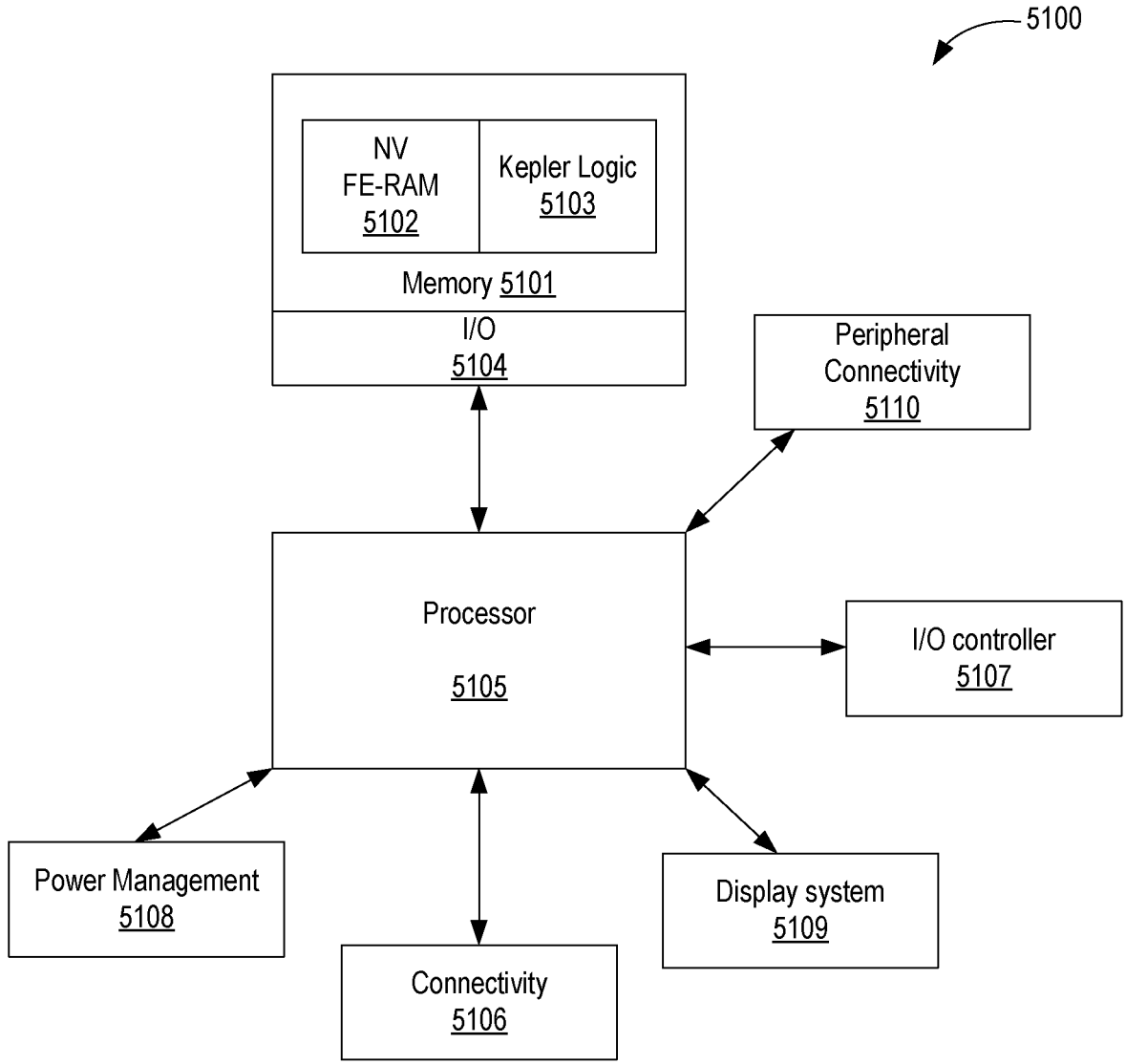
FIG. 51 illustrates a system-on-chip (SOC) that uses memory arrays including bit-cells according to any memory bit-cells described herein, in accordance with at least one embodiment.

FIG. 51 illustrates a system-on-chip (SOC) that uses memory arrays including bit-cells according to any memory bit-cells described herein, in accordance with at least one embodiment. In at least one embodiment, SoC 5100 comprises memory 5101 having static random-access memory (SRAM) or FE based random-access memory FE-RAM, or any other suitable memory. In at least one embodiment, memory can be non-volatile (NV) or volatile memory. In at least one embodiment, memory 5101 may also comprise logic 5103 to control memory 5102. In at least one embodiment, write and read drivers are part of logic 5103. In at least one embodiment, these drivers and other logic are implemented using majority or threshold gates discussed herein. In at least one embodiment, logic 5103 can comprise majority or threshold gates and traditional logic (e.g., CMOS based NAND, NOR etc.).

In at least one embodiment, SoC further comprises a memory I/O (input-output) interface 5104. In at least one embodiment, interface may be a double-data rate (DDR) compliant interface or any other suitable interface to communicate with a processor. In at least one embodiment, processor 5105 of SoC 5100 can be a single core or multiple core processor. In at least one embodiment, processor 5105 can be a general-purpose processor (CPU), a digital signal processor (DSP), or an Application Specific Integrated Circuit (ASIC) processor. In at least one embodiment, processor 5105 is an artificial intelligence (AI) processor (e.g., a dedicated AI processor, a graphics processor configured as an AI processor). In at least one embodiment, processor 5105 executes instructions that are stored in memory 5101.

In at least one embodiment, AI is a broad area of hardware and software computations where data is analyzed, classified, and then a decision is made regarding data. In at least one embodiment, a model describing classification of data for a certain property or properties is trained over time with large amounts of data. In at least one embodiment, process of training a model requires large amounts of data and processing power to analyze data. In at least one embodiment, when a model is trained, weights or weight factors are modified based on outputs of model. In at least one embodiment, once weights for a model are computed to a high confidence level (e.g., 95% or more) by repeatedly analyzing data and modifying weights to get expected results, model is deemed "trained." In at least one embodiment, trained model with fixed weights is then used to make decisions about new data. In at least one embodiment, training a model and then applying trained model for new data is hardware intensive activity. In at least one embodiment, AI processor has reduced latency of computing training model and using training model, which reduces power consumption of such AI processor systems.

In at least one embodiment, processor 5105 may be coupled to number of other chiplets that can be on same die as SoC 5100 or on separate dies. In at least one embodiment, these chiplets include connectivity circuitry 5106, I/O controller 5107, power management 5108, display system 5109, and connectivity circuitry 5106 (e.g., peripheral connectivity).

In at least one embodiment, connectivity circuitry 5106 represents hardware devices and software components for communicating with other devices. In at least one embodiment, connectivity circuitry 5106 may support various connectivity circuitries and standards. In at least one embodiment, connectivity circuitry 5106 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In at least one embodiment, connectivity circuitry 5106 may support non-cellular standards such as WiFi.

In at least one embodiment, I/O controller 5107 represents hardware devices and software components related to interaction with a user. In at least one embodiment, I/O controller 5107 is operable to manage hardware that is part of an audio subsystem and/or display subsystem. In at least one embodiment, input through a microphone or other audio device can provide input or commands for one or more applications or functions of SoC 5100. In at least one embodiment, I/O controller 5107 illustrates a connection point for additional devices that connect to SoC 5100 through which a user might interact with system. In at least one embodiment, devices that can be attached to SoC 5100 might include microphone devices, speaker or stereo systems, video systems or other display devices, keyboard or keypad devices, or other I/O devices for use with specific applications such as card readers or other devices.

In at least one embodiment, power management 5108 represents hardware or software that performs power management operations, e.g., based at least in part on receiving measurements from power measurement circuitries, temperature measurement circuitries, charge level of battery, and/or any other appropriate information that may be used for power management. In at least one embodiment, by using majority and threshold gates discussed herein, non-volatility is achieved at output of these logics. In at least one embodiment, power management 5108 may accordingly put such logic into low power state without worry of losing data. In at least one embodiment, power management may select a power state according to Advanced Configuration and Power Interface (ACPI) specification for one or all components of SoC 5100.

In at least one embodiment, display system 5109 represents hardware (e.g., display devices) and software (e.g., drivers) components that provide a visual and/or tactile display for a user to interact with processor 5105. In at least one embodiment, display system 5109 includes a touch screen (or touch pad) device that provides both output and input to a user. In at least one embodiment, display system 5109 may include a display interface, which includes particular screen or hardware device used to provide a display to a user. In at least one embodiment, display interface includes logic separate from processor 5105 to perform at least some processing related to display.

In at least one embodiment, peripheral connectivity 5110 may represent hardware devices and/or software devices for connecting to peripheral devices such as printers, chargers, cameras, etc. In at least one embodiment, peripheral connectivity 5110 may support communication protocols, e.g., PCIe (Peripheral Component Interconnect Express), USB (Universal Serial Bus), Thunderbolt, High-Definition Multimedia Interface (HDMI), Firewire, etc.

In at least one embodiment, SoC 5100 includes a coherent cache or memory-side buffer chiplet (not shown) which includes ferroelectric or paraelectric memory. In at least one embodiment, coherent cache, or memory-side buffer chiplet can be coupled to processor 5105 and/or memory 5101 as described herein (e.g., via silicon bridge or vertical stacking).

Here, "device" may generally refer to an apparatus according to context of usage of that term. In at least one embodiment, a device may refer to a stack of layers or structures, a single structure or layer, a connection of various structures having active and/or passive elements, etc. Generally, a device is a three-dimensional structure with a plane along x-y direction and a height along z direction of an x-y-z Cartesian coordinate system. In at least one embodiment, plane of device may also be plane of an apparatus, which comprises device.

Throughout specification, and in claims, "connected" may generally refer to a direct connection, such as electrical, mechanical, or magnetic connection between things that are connected, without any intermediary devices.

Here, "coupled" may generally refer to a direct or indirect connection, such as a direct electrical, mechanical, or magnetic connection between things that are connected or an indirect connection, through one or more passive or active intermediary devices.

Here, "adjacent" may generally refer to a position of a thing being next to (e.g., immediately next to or close to with one or more things between them) or adjoining another thing (e.g., abutting it).

Here, "circuit" or "module" may generally refer to one or more passive and/or active components that are arranged to cooperate with one another to provide a desired function.

Here, "signal" may generally refer to at least one current signal, voltage signal, magnetic signal, or data/clock signal. Here, meaning of "a," "an," and "the" include plural references. Here, meaning of "in" includes "in" and "on."

Here, "analog signal" generally refers to any continuous signal for which time varying feature (variable) of signal is a representation of some other time varying quantity, e.g., analogous to another time varying signal.

Here, "digital signal" may generally refer to a physical signal that is a representation of a sequence of discrete values (a quantified discrete-time signal), for example of an arbitrary bit stream, or of a digitized (sampled and analog-to-digital converted) analog signal.

Here, "scaling" may generally refer to converting a design (schematic and layout) from one process technology to another process technology and subsequently being reduced in layout area. Here, "scaling" may generally refer to downsizing layout and devices within same technology node. Here, "scaling" may also generally refer to adjusting (e.g., slowing down or speeding up—e.g., scaling down, or scaling up respectively) of a signal frequency relative to another parameter, for example, power supply level.

Here, terms "substantially," "close," "approximately," "near," and "about," generally refer to being within +/−10% of a target value. For example, unless otherwise specified in explicit context of their use, terms "substantially equal," "about equal" and "approximately equal" mean that there is no more than incidental variation between things so described. In at least one embodiment, such variation is no more than +/−10% of a predetermined target value.

Unless otherwise specified use of ordinal adjectives "first," "second," and "third," etc., to describe a common object, merely indicate that different instances of like objects are being referred to and are not intended to imply that objects so described must be in a given sequence, either temporally, spatially, in ranking, or in any other manner.

For purposes of present disclosure, phrases "A and/or B" and "A or B" mean (A), (B), or (A and B). In at least one embodiment, phrase "A, B, and/or C" means (A), (B), (C), (A and B), (A and C), (B and C), or (A, B and C).

Here, "left," "right," "front," "back," "top," "bottom," "over," "under," and like in description and in claims, if any, are used for descriptive purposes and not necessarily for describing permanent relative positions. In at least one embodiment, "over," "under," "front side," "back side," "top," "bottom," "over," "under," and "on" as used herein refer to a relative position of one component, structure, or material with respect to other referenced components, structures, or materials within a device, where such physical relationships are noteworthy. In at least one embodiment, these terms are employed herein for descriptive purposes only and predominantly within context of a device z-axis and therefore may be relative to an orientation of a device. In at least one embodiment, a first material "over" a second material in context of a figure provided herein may also be "under" second material if device is oriented upside-down relative to context of figure provided. In context of materials, one material disposed over or under another may be directly in contact or may have one or more intervening materials. Moreover, one material disposed between two materials may be directly in contact with two layers or may have one or more intervening layers. In at least one embodiment, a first material "on" a second material is in direct contact with that second material. Similar distinctions are to be made in context of component assemblies.

Here, "between" may be employed in context of z-axis, x-axis or y-axis of a device. In at least one embodiment, a material that is between two other materials may be in contact with one or both of those materials, or it may be separated from both of other two materials by one or more intervening materials. In at least one embodiment, a material "between" two other materials may therefore be in contact with either of other two materials, or it may be coupled to other two materials through an intervening material. In at least one embodiment, a device that is between two other devices may be directly connected to one or both of those devices, or it may be separated from both of other two devices by one or more intervening devices.

Here, multiple non-silicon semiconductor material layers may be stacked within a single fin structure. In at least one embodiment, multiple non-silicon semiconductor material layers may include one or more "P-type" layers that are suitable (e.g., offer higher hole mobility than silicon) for P-type transistors. In at least one embodiment, multiple non-silicon semiconductor material layers may further include one or more "N-type" layers that are suitable (e.g., offer higher electron mobility than silicon) for N-type transistors. In at least one embodiment, multiple non-silicon semiconductor material layers may further include one or more intervening layers separating N-type from P-type layers. In at least one embodiment, intervening layers may be at least partially sacrificial, for example, to allow one or more of a gate, a source, or a drain to wrap completely around a channel region of one or more of N-type and P-type transistors. In at least one embodiment, multiple non-silicon semiconductor material layers may be fabricated, at least in part, with self-aligned techniques such that a stacked CMOS device may include both a high-mobility N-type and P-type transistor with a footprint of a single FET (field effect transistor).

Here, "backend" or back-end-of-line (BOEL) may generally refer to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of backend of die. Here, "frontend" may generally refer to a section of die that includes active region (e.g., where transistors are fabricated) and low-level metal layers and corresponding vias that are closer to active region (e.g., metal layer 5 and below in ten-metal stack die, for example).

Reference in specification to "an embodiment," "one embodiment," "in at least one embodiment," "some embodiments," or "other embodiments" means that a particular feature, structure, or characteristic described in connection with embodiments is included in at least some embodiments, but not necessarily all embodiments. Various appearances of "an embodiment," "one embodiment," "in at least one embodiment," or "some embodiments" are not necessarily all referring to same embodiments. If specification states a component, feature, structure, or characteristic "may," "might," or "could" be included, that particular component, feature, structure, or characteristic is not required to be included. If specification or claim refers to "a" or "an" element, that does not mean there is only one of that element. If specification or claims refer to "an additional" element, that does not preclude there being more than one additional elements.

Furthermore, particular features, structures, functions, or characteristics may be combined in any suitable manner in one or more embodiments. For example, a first embodiment may be combined with a second embodiment anywhere particular features, structures, functions, or characteristics associated with two embodiments are not mutually exclusive.

While at least one embodiment has been described in conjunction with specific embodiments thereof, many alternatives, modifications and variations of such embodiments will be apparent to those of ordinary skill in art in light of foregoing description. At least one embodiment is intended to embrace all such alternatives, modifications, and variations as to fall within broad scope of appended claims.

In addition, well-known power/ground connections to integrated circuit (IC) chips and other components may or may not be shown within presented figures, for simplicity of illustration and discussion, and so as not to obscure any embodiment. Further, arrangements may be shown in block diagram form to avoid obscuring any embodiment, and also in view of fact that specifics with respect to implementation of such block diagram arrangements are highly dependent upon platform within which an embodiment is to be implemented (e.g., such specifics should be well within purview of one skilled in art). Where specific details (e.g., circuits) are set forth to describe example embodiments of disclosure, it should be apparent to one skilled in art that disclosure can be practiced without, or with variation of, these specific details. Description of an embodiment is thus to be regarded as illustrative instead of limiting.

In at least one embodiment, structures described herein can also be described as method(s) of forming those structures or apparatuses, and method(s) of operation of these structures or apparatuses. The following examples are provided that illustrate at least one embodiment. An example can be combined with any other example. As such, at least one embodiment can be combined with at least another embodiment without changing scope of an embodiment.

Example 1 is an apparatus comprising: a first set of plurality of memory bit-cells coupled to a first bit-line; a second set of plurality of memory bit-cells coupled to a second bit-line, wherein an individual bit-cell of the first set of plurality of memory bit-cells and the second set of plurality of memory bit-cells comprises a transistor and a capacitor coupled to the transistor, wherein the transistor comprises non-linear polar material; a third bit-line; a first isolation circuitry to selectively couple or decouple the first bit-line to the third bit-line; and a second isolation circuitry to selectively couple or decouple the second bit-line to the third bit-line.

Example 2 is an apparatus of any example herein, particularly example 1, comprises a gain circuitry coupled to the third bit-line via one or more devices, wherein the gain circuitry is to amplify a signal on the third bit-line and provide an amplified signal on a sense line, wherein the sense line is coupled to a sense amplifier.

Example 3 is an apparatus of any example herein, particularly example 2, wherein the gain circuitry comprises: a gain transistor having a gate terminal coupled to the third bit-line via the one or more devices; and a series transistor coupled in series with the gain transistor, wherein the series transistor is controllable by a read word-line, wherein the series transistor is coupled to the sense line.

Example 4 is an apparatus of any example herein, particularly example 3, wherein the gain transistor is larger in size than the series transistor.

Example 5 is an apparatus of any example herein, particularly example 3, wherein the gain transistor is coupled to a reference voltage.

Example 6 is an apparatus of any example herein, particularly example 1, comprises a sense amplifier to sense a voltage on the third bit-line.

Example 7 is an apparatus of any example herein, particularly example 1, comprises a first pre-charge circuitry coupled to the first bit-line, wherein the first pre-charge circuitry is to pre-charge the first bit-line after the first isolation circuitry decouples the first bit-line from the third bit-line.

Example 8 is an apparatus of any example herein, particularly example 1, comprises a second pre-charge circuitry coupled to the second bit-line, wherein the second pre-charge circuitry is to pre-charge the second bit-line after the second isolation circuitry decouples the second bit-line from the third bit-line.

Example 9 is an apparatus of any example herein, particularly example 1, comprises a logic circuitry to generate a first control for the first isolation circuitry to selectively couple or decouple the first bit-line to the third bit-line.

Example 10 is an apparatus of any example herein, particularly example 1, comprises a logic circuitry to generate a second control for the second isolation circuitry to selectively couple or decouple the second bit-line to the third bit-line.

Example 11 is an apparatus of any example herein, particularly example 1, wherein the non-linear polar material is one of a ferroelectric, paraelectric, or non-linear dielectric material.

Example 12 is an apparatus of any example herein, particularly example 1, wherein the non-linear polar material is doped one or more elements of a 3d, 4d, 5d, 6d, 4f, and 5f series of a periodic table.

Example 13 is an apparatus of any example herein, particularly example 1, wherein the non-linear polar material includes one of: a perovskite material which includes one of: $BaTiO_3$, $PbTiO_3$, $KNbO_3$, or $NaTaO_3$; Bismuth ferrite (BFO); Barium titanate (BTO); BFO doped with one of: Sc, Ti, V, Cr, Mn, Fe, Co, Ni, Cu, or Zn; BTO doped with one of: Sc, Ti, V, Cr, Mn, Fe, Co, Ni, Cu, or Zn; LBFO doped with Mn; lead zirconium titanate (PZT), or PZT with a second doping material, wherein the second doping material is one of La, Nb, Mn, or 5d series elements; bismuth ferrite (BFO) with a first doping material, wherein the first doping material is one of lanthanum, elements from lanthanide series of a periodic table, or elements of a 3d, 4d, 5d, 6d, 4f, and 5f series of the periodic table; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a hexagonal ferroelectric which includes one of: $YMnO_3$ or $LuFeO_3$; hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; Hafnium oxides such as $Hf_{(1-x)}E_xO_y$, where 'x' and 'y' are first and second fractions, respectively, where E can be Al, Ca, Ce, Dy, Er, Gd, Ge, La, Sc, Si, Sr, Sn, Zr, or Y; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where 'x' and 'y' are third and fourth fractions, respectively; y doped $HfO_2$, where 'y' includes one of: Al, Ca, Ce, Dy, Er, Gd, Ge, La, Sc, Si, $Sr_x$ Sn, or Y; or niobate type compounds $LiNbO_3$, $LiTaO_3$, lithium iron tantalum oxyfluoride, barium strontium niobate, sodium barium niobate, or potassium strontium niobate; an improper ferroelectric material which includes one of: [PTO/STO]n or [LAO/STO]n, wherein 'n' is between 1 and 100, or a paraelectric material that comprises $SrTiO_3$, $Ba_{(x)}Sr_{(y)}TiO_3$, $HfZrO_2$, Hf—Si—O, La-substituted $PbTiO_3$, or a PMN-PT based relaxor ferroelectric, where 'x' and 'y' are fifth and sixth fractions, respectively; or a paraelectric material that comprises $SrTiO_3$, $Ba_{(x)}Sr_{(y)}TiO_3$, $HfZrO_2$, Hf—Si—O, or a PMN-PT based relaxor ferroelectrics, where 'x' and 'y' are seventh and eighth fractions, respectively.

Example 14 is an apparatus comprising one or more circuitries to split a memory into two or more memory sub-arrays based at least in part on a polarization target of capacitors of the memory, wherein the capacitors include non-linear polar material.

Example 15 is an apparatus of any example herein, particularly example 14, wherein the one or more circuitries include a transistor to couple or decouple a local bit-line, of a memory sub-array of the two or more memory sub-arrays, to global bit-line.

Example 16 is an apparatus of any example herein, particularly example 15, wherein the global bit-line is coupled to a sense amplifier.

Example 17 is an apparatus of any example herein, particularly example 15, further comprising: a gain circuitry coupled to the global bit-line via one or more devices, wherein the gain circuitry is to amplify a signal on the global bit-line and provide an amplified signal on a sense line, wherein the sense line is coupled to a sense amplifier.

Example 18 is an apparatus of any example herein, particularly example 17, wherein the gain circuitry comprises: a gain transistor having a gate terminal coupled to the global bit-line via the one or more devices; and a series transistor coupled in series with the gain transistor, wherein the series transistor is controllable by a read word-line, wherein the series transistor is coupled to the sense line.

Example 19 is a system comprising: a processor circuitry to execute one ore more instructions; a memory coupled to the processor circuitry; a communication interface to allow the processor circuitry to communicate with another device, wherein the memory comprises: a first set of plurality of memory bit-cells coupled to a first bit-line; a second set of plurality of memory bit-cells coupled to a second bit-line, wherein an individual bit-cell of the first set of plurality of memory bit-cells and the second set of plurality of memory bit-cells comprises a transistor and a capacitor coupled to the transistor, wherein the transistor comprises non-linear polar material; a third bit-line; a first isolation circuitry to selectively couple or decouple the first bit-line to the third bit-line; and a second isolation circuitry to selectively couple or decouple the second bit-line to the third bit-line.

Example 20 is a system of any example herein, particularly example 19, comprising a gain circuitry coupled to the third bit-line via one or more devices, wherein the gain circuitry is to amplify a signal on the third bit-line and provide an amplified signal on a sense line, wherein the sense line is coupled to a sense amplifier.

An abstract is provided that will allow readers to ascertain nature and gist of technical disclosure. Abstract is submitted with an understanding that it will not be used to limit scope or meaning of claims. Following claims are hereby incorporated into detailed description, with each claim standing on its own as a separate embodiment.

We claim:

1. An apparatus comprising:
a first set of plurality of memory bit-cells coupled to a first bit-line;
a second set of plurality of memory bit-cells coupled to a second bit-line, wherein an individual bit-cell of the first set of plurality of memory bit-cells and the second set of plurality of memory bit-cells comprises a transistor and a capacitor coupled to the transistor, and wherein the transistor comprises non-linear polar material;
a third bit-line;
a first isolation circuitry to selectively couple or decouple the first bit-line to the third bit-line;
a second isolation circuitry to selectively couple or decouple the second bit-line to the third bit-line; and
a gain circuitry coupled to the third bit-line via one or more devices, wherein the gain circuitry comprises a gain transistor and a series transistor coupled in series with the gain transistor, and wherein a size of the gain transistor is larger than a size of the series transistor.

2. The apparatus of claim 1, wherein the gain transistor having a gate terminal coupled to the third bit-line via the one or more devices; and wherein the series transistor is coupled in series with the gain transistor, wherein the series transistor is controllable by a read word-line, and wherein the series transistor is coupled to a sense line.

3. The apparatus of claim 2, wherein the gain transistor is larger in size than the series transistor.

4. The apparatus of claim 2, wherein the gain transistor is coupled to a reference voltage.

5. The apparatus of claim 1 comprises a sense amplifier to sense a voltage on the third bit-line.

6. The apparatus of claim 1 comprises a first pre-charge circuitry coupled to the first bit-line, wherein the first pre-charge circuitry is to pre-charge the first bit-line after the first isolation circuitry decouples the first bit-line from the third bit-line.

7. The apparatus of claim 1 comprises a second pre-charge circuitry coupled to the second bit-line, wherein the second pre-charge circuitry is to pre-charge the second bit-line after the second isolation circuitry decouples the second bit-line from the third bit-line.

8. The apparatus of claim 1 comprises a logic circuitry to generate a first control for the first isolation circuitry to selectively couple or decouple the first bit-line to the third bit-line.

9. The apparatus of claim 1 comprises a logic circuitry to generate a second control for the second isolation circuitry to selectively couple or decouple the second bit-line to the third bit-line.

10. The apparatus of claim 1, wherein the non-linear polar material is one of a ferroelectric, paraelectric, or non-linear dielectric material.

11. The apparatus of claim 1, wherein the non-linear polar material is doped one or more elements of a 3d, 4d, 5d, 6d, 4f, and 5f series of a periodic table.

12. The apparatus of claim 1, wherein the non-linear polar material includes one of:
a perovskite material which includes one of: $BaTiO_3$, $PbTiO_3$, $KNbO_3$, or $NaTaO_3$;
bismuth ferrite (BFO);
barium titanate (BTO);
BFO doped with one of: Sc, Ti, V, Cr, Mn, Fe, Co, Ni, Cu, or Zn;
BTO doped with one of: Sc, Ti, V, Cr, Mn, Fe, Co, Ni, Cu, or Zn;
LBFO doped with Mn;
lead zirconium titanate (PZT) or PZT with a first doping material, wherein the first doping material is one of La, Nb, Mn, or 5d series elements;
bismuth ferrite (BFO) with a second doping material, wherein the second doping material is one of lanthanum, elements from lanthanide series of a periodic table, or elements of a 3d, 4d, 5d, 6d, 4f, and 5f series of the periodic table;
a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
a first hexagonal ferroelectric which includes one of: $YMnO_3$ or $LuFeO_3$;
a second hexagonal ferroelectric of a type $h-RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides;
hafnium oxides in a form of $Hf_{(1-x)}E_xO_y$, where E can be Al, Ca, Ce, Dy, Er, Gd, Ge, La, Sc, Si, Sr, Sn, Zr, or Y, where 'x' and 'y' are first and second fractions, respectively;

$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where 'x' and 'y' are third and fourth fractions, respectively;

y doped $HfO_2$, where 'y' includes one of: Al, Ca, Ce, Dy, Er, Gd, Ge, La, Sc, Si, Sr, Sn, or Y; or niobate type compounds $LiNbO_3$, $LiTaO_3$, lithium iron tantalum oxyfluoride, barium strontium niobate, sodium barium niobate, or potassium strontium niobate;

an improper ferroelectric material which includes one of: [PTO/STO]n or [LAO/STO]n, wherein 'n' is between 1 and 100, or a paraelectric material that comprises $SrTiO_3$, $Ba_{(x)}Sr_{(y)}TiO_3$, $HfZrO_2$, Hf—Si—O, La-substituted $PbTiO_3$, or a PMN-PT based relaxor ferroelectric, where 'x' and 'y' are fifth and sixth fractions, respectively; or a paraelectric material that comprises $SrTiO_3$, $Ba_{(x)}Sr_{(y)}TiO_3$, $HfZrO_2$, Hf—Si—O, or a PMN-PT based relaxor ferroelectric, where 'x' and 'y' are seventh and eighth fractions, respectively.

13. An apparatus comprising:
one or more circuitries to split a memory into two or more memory sub-arrays based at least in part on a polarization target of capacitors of the memory, wherein the capacitors include non-linear polar material; and a gain circuitry coupled to a global bit-line via one or more devices, wherein the gain circuitry comprises a gain transistor and a series transistor coupled in series with the gain transistor, and wherein a size of the gain transistor is larger than a size of the series transistor.

14. The apparatus of claim 13, wherein the one or more circuitries include a transistor to couple or decouple a local bit-line, of a memory sub-array of the two or more memory sub-arrays, to global bit-line.

15. The apparatus of claim 14, wherein the global bit-line is coupled to a sense amplifier.

16. The apparatus of claim 13, wherein the gain transistor having a gate terminal coupled to the global bit-line via the one or more devices; and wherein the series transistor coupled in series with the gain transistor, wherein the series transistor is controllable by a read word-line, and wherein the series transistor is coupled to a sense line.

17. A system comprising:
a processor circuitry to execute one or more instructions;
a memory coupled to the processor circuitry;
a communication interface to allow the processor circuitry to communicate with another device, wherein the memory comprises:
a first set of plurality of memory bit-cells coupled to a first bit-line;
a second set of plurality of memory bit-cells coupled to a second bit-line, wherein an individual bit-cell of the first set of plurality of memory bit-cells and the second set of plurality of memory bit-cells comprises a transistor and a capacitor coupled to the transistor, and wherein the transistor comprises non-liner polar material;
a third bit-line;
a first isolation circuitry to selectively couple or decouple the first bit-line to the third bit-line; and
a second isolation circuitry to selectively couple or decouple the second bit-line to the third bit-line; and
a gain circuitry coupled to the third bit-line via one or more devices, wherein the gain circuitry comprises a gain transistor and a series transistor coupled in series with the gain transistor, wherein a size of the gain transistor is larger than a size of the series transistor, wherein the gain transistor is coupled to a reference voltage, and wherein the series transistor is controllable by a read word-line.

*    *    *    *    *